US008137048B2

(12) United States Patent
Chidambaram et al.

(10) Patent No.: US 8,137,048 B2
(45) Date of Patent: Mar. 20, 2012

(54) WAFER PROCESSING SYSTEM WITH DUAL WAFER ROBOTS CAPABLE OF ASYNCHRONOUS MOTION

(75) Inventors: Mahendran Chidambaram, Saratoga, CA (US); Quoc Truong, San Leandro, CA (US); Jerry Schock, Campbell, CA (US); N. William Parker, Pleasanton, CA (US)

(73) Assignee: VSERV Technologies, Santa Clara, CA (US)

( * ) Notice: Subject to any disclaimer, the term of this patent is extended or adjusted under 35 U.S.C. 154(b) by 927 days.

(21) Appl. No.: 11/863,166

(22) Filed: Sep. 27, 2007

(65) Prior Publication Data
US 2008/0152463 A1    Jun. 26, 2008

Related U.S. Application Data

(60) Provisional application No. 60/847,828, filed on Sep. 27, 2006, provisional application No. 60/890,835, filed on Feb. 20, 2007.

(51) Int. Cl.
*B25J 18/02* (2006.01)
(52) U.S. Cl. .............. 414/744.2; 901/2; 74/490.01
(58) Field of Classification Search ............ 414/744.1, 414/744.2, 744.6, 749.1, 744.3, 744.5; 901/15, 901/28, 2; 74/490.01, 45, 48, 49
See application file for complete search history.

(56) References Cited

U.S. PATENT DOCUMENTS

| 5,295,777 | A | 3/1994 | Hodos |
| 5,539,266 | A * | 7/1996 | Stevens ............... 310/75 D |
| 6,309,161 | B1 | 10/2001 | Hofmeister |
| 6,481,309 | B2 | 11/2002 | Mitsuyoshi |
| 6,582,175 | B2 | 6/2003 | Cox et al. |
| 2006/0245905 | A1 * | 11/2006 | Hudgens ............... 414/744.5 |

FOREIGN PATENT DOCUMENTS
JP        10296666 A  * 11/1998

OTHER PUBLICATIONS

VSERV Technologies, PCT/US07/79773, filed Sep. 27, 2007, International Search Report and Written Opinion, Mar. 13, 2008, ISA/US, 9pp.

* cited by examiner

*Primary Examiner* — Joshua Rudawitz
(74) *Attorney, Agent, or Firm* — SNR Denton US LLP

(57) ABSTRACT

A robot assembly for transferring substrates includes a central tube assembly oriented along a central axis, perpendicular to a substrate transfer plane, and having an inner surface that forms part of a first enclosure at a first pressure, and an outer surface that forms part of a second enclosure at a second, different pressure. The robot assembly further includes a transfer robot which itself includes multiple rotor assemblies, each configured to rotate parallel to the substrate transfer plane. The various rotor assemblies are organized in pairs, each pair having one rotor fitted with a telescoping support arm/end effector arrangement to support substrates thereon, and the other rotor fitted with inner and outer actuator arms that cooperate to effect radial movement of the corresponding end effector of the paired rotor assembly. Each rotor is controlled to effect the transfer of substrates within a wafer processing system asynchronously and at differing heights.

24 Claims, 67 Drawing Sheets

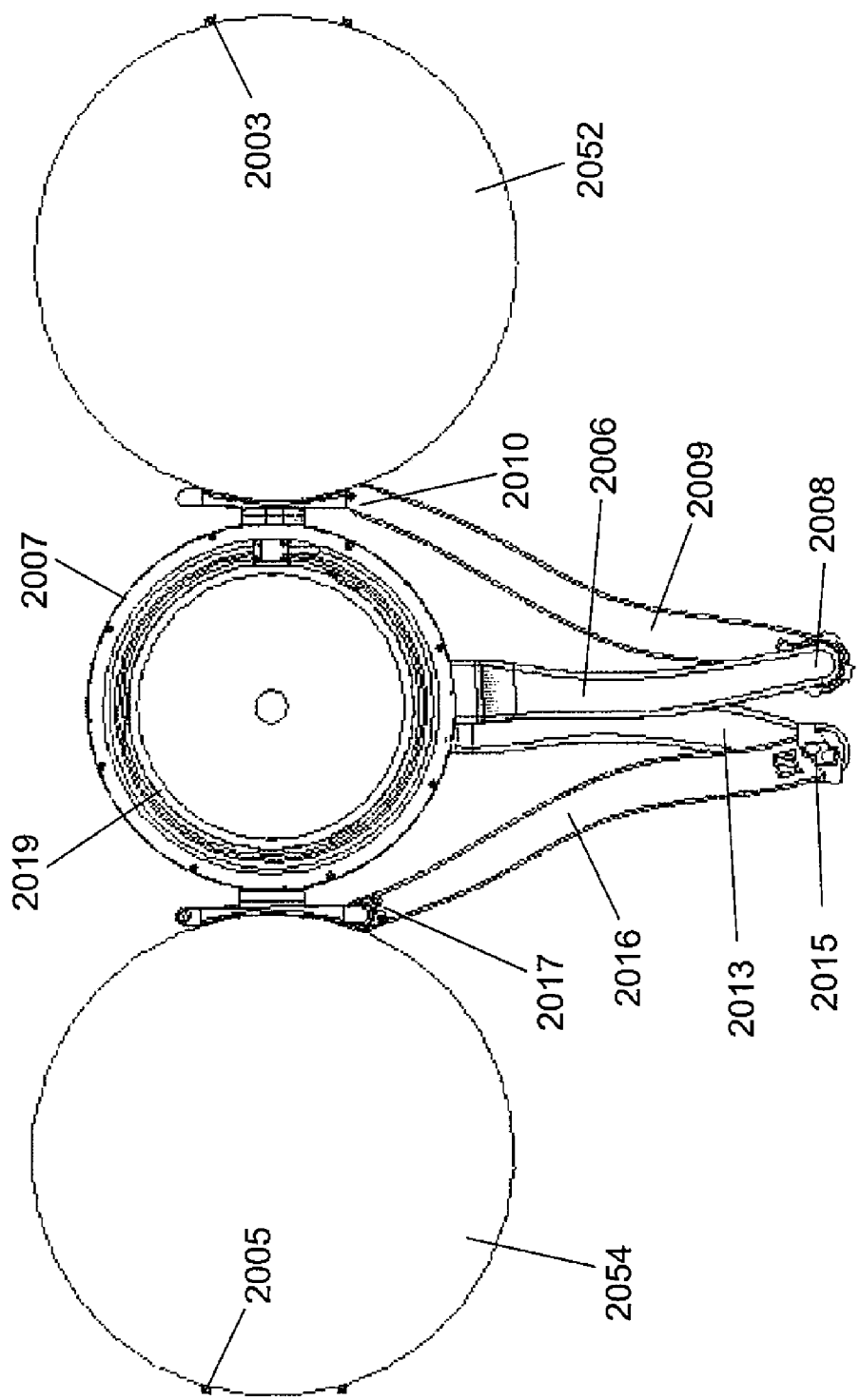

PRIOR ART   FIG. 41

WAFER PROCESSING SYSTEM WITH DUAL WAFER ROBOTS CAPABLE OF ASYNCHRONOUS MOTION

RELATED APPLICATIONS

This application is a non-provisional of and claims the priority benefit of U.S. Provisional Patent Application Nos. 60/847,828, filed 27 Sep. 2006, and 60/890,835, filed 20 Feb. 2007, each of which is incorporated herein by reference.

FIELD OF THE INVENTION

The present invention relates to the field of wafer handling and transfer systems used in semiconductor manufacturing.

BACKGROUND

In semiconductor processing systems, particularly those operating under high vacuum conditions, semiconductor wafers must be transferred into and out of process modules where steps in the manufacturing process take place. Since the cost of wafer processing is dependent on the throughput of the system, it is imperative that wafers be removed from each process module as soon as each module has completed processing the wafer which was loaded into it. Such transfers to/from processing modules are performed by so-called transfer robots.

Conventional transfer robots were typically designed to transfer only one wafer at a time, or to transfer two wafers at a time but only simultaneously (i.e., not asynchronously). Typically a number of process modules are mounted around the perimeter of a transfer chamber containing a transfer robot. Hence, for enhanced system throughput, it is common to configure the transfer robot to be capable of transferring wafers into process modules at fixed relative orientations to each other (e.g., side-by-side, or at 180° separation around the transfer chamber perimeter).

FIG. 39 is adapted from U.S. Pat. No. 5,993,141, and shows a conventional dual wafer robot 3910, which is limited to wafer handling within a single plane. In the following description, let x represent either a or b in FIG. 39. Linear track section 3912x is pivotally mounted to a rotatable stage 3914 by pivot pin 3916x. Motorized platen 3918x is slidably mounted on linear track section 3912x and carries an end effector 3920x on a leading (outer) edge. The upper surface of linear track section 3912x includes a linear bearing 3922x, along each of the longitudinal edges thereof to guide the motorized platen 3918x. The central portion of track section 3912x includes a plurality of raised metal edges 3924 (preferably formed of a ferromagnetic material), disposed in a spaced, parallel relation to one another and substantially perpendicular to the linear bearings 3922x. A plurality of coils (not shown) in motorized platen 3918x electromagnetically interact with raised edges 3924 to drive platen 3918x along the track section 3912x. The extension and retraction motions of end effectors 3920a and 3920b of this robot may function asynchronously, but are limited to operation with both end effectors 3920a and 3920b being in the same plane since both linear track sections 3912a and 3912b are attached to rotatable stage 3914.

FIG. 40 is adapted from U.S. Pat. No. 6,071,055, and show's a portion of a dual wafer robot 4010 that is limited to wafer handling in a tandem configuration with simultaneous motion of both wafers in the same plane. The dual wafer robot 4010 is housed in transfer chamber 4012, shown with three dual wafer process chambers 4014 attached. Transfer of wafers into/out of process modules 4014 is through vacuum valves 4016. Note that this dual wafer robot design, with both end effectors locked together in a U-shaped assembly, inherently must transfer both wafers: (1) simultaneously, (2) in the same plane, and (3) only into a single dual-wafer process module 4014.

FIG. 41 is adapted from U.S. Pat. No. 5,678,980 and illustrates a dual wafer robot that is limited to single wafer loading and unloading. In this design, end effector 4110 is supported and moved by outer arms 4114 and 4116. Similarly, end effector 4112 is supported and moved by outer arms 4118 and 4120. Outer arms 4114, 4116, 4118 and 4120 are attached to, and moved by, center arms 4122 and 4124.

In view (A) of FIG. 41, center arm 4124 is rotating (arrow at upper center) counter-clockwise around pivot 4126, while center arm 4122 is rotating (arrow at lower center) at the same speed clockwise around pivot 4126. The combined motion of arms 4122 and 4124 causes outer arms 4114 and 4116 to extend end effector 4110 as shown by the left arrow. Simultaneously, outer arms 4118 and 4120 are retracting end effector 4112 as shown by the right arrow. Because the outer arms 4114, 4116, 4118, and 4120 are longer than central arms 4122 and 4124, end effector 4110 moves much farther outwards than end effector 4112 moves inwards.

In view (B) of FIG. 41, center arms 4122 and 4124 are rotating (arrows at center) in the opposite directions from view (A), thus end effector 4112 is extending (right arrow), while end effector 4110 is retracting (left arrow) towards the center.

In view (C) of FIG. 41, center arms 4122 and 4124 are positioned 180° relative to each other, making the radial positions of end effectors 4110 and 4112 the same. Arms 4122 and 4124 are rotating clockwise (arrows at center) at the same speed, causing end effectors 4110 and 4112 to rotate clockwise around pivot 4126 (arrows at left and right).

Note that in this dual wafer design, the wafers are restricted to a 180° orientation, and only one end effector can be extended at a time (while the other end effector must be retracted). Also, for pick-and-place operation (where a processed wafer is removed and another wafer is immediately placed into a process module), it is necessary to rotate the robot a full 180° to insert a wafer following removal of a processed wafer, thereby decreasing system throughput.

FIG. 42 is adapted from U.S. Pat. No. 5,794,487 and illustrates a dual wafer robot 4210 that is limited to single wafer loading and unloading (i.e., one which cannot load two wafers simultaneously). Lower arm link 4212 is connected to base 4214 through shoulder 4216, which enables 360° rotation. Upper arm link 4218 is connected to lower arm link 4212 through elbow 4220, which enables relative motion between upper arm link 4218 and lower arm link 4212. Two end effectors 4222 are mounted with a 180° relative orientation on central support 4224, which contains wrist 4226. Extension and retraction of end effectors 4222 is effected by changing the angle between upper arm link 4218 and lower arm link 4212. Thus, in this dual wafer robot, only a single wafer can be loaded or unloaded at a time, since if one of the two end effectors 4222 is extended, the other end effector 4222 is necessarily retracted at the same time.

FIG. 43 is adapted from U.S. Pat. No. 5,539,266 and illustrates a robot actuator having two motors, each requiring a magnetic air-to-vacuum coupler separate from the robot motors. In particular, this actuator includes two coaxial magnetic couplers for driving the robot mechanism. The coupler mechanism consists of two primary rings 4312 and 4314 of permanent magnets located outside the vacuum chamber wall 4316 (i.e., in air) and mounted for rotation about a common axis 4318.

For example, first primary ring 4312 may be mounted on a flanged shaft 4320, driven by motor M2 4322. Second primary ring 4314 may be mounted on a flanged bushing 4324 that is driven by motor M1 4326, where flanged bushing 4324 is rotatably mounted on shaft 4320. Motors M1 4326 and M2 4322 are servo motors of conventional design.

Both primary rings 4312 and 4314 include a large number of permanent magnets oriented radially with alternating N and S poles directed outwards. Flux rings 4328 and 4330 provide flux return paths for the permanent magnets in primary rings 4312 and 4314, respectively. All components 4312, 4314, 4320, 4322, 4324, 4326, 4328 and 4330, are mounted outside of vacuum wall 4316 (in air).

Secondary ring 4332 includes flux return path 4334 and a plurality of permanent magnets (the same number as in primary ring 4312). Secondary ring 4336 includes flux return path 4338 and a plurality of permanent magnets (the same number as in primary ring 4314). The permanent magnets in secondary rings 4332 and 4336 are attracted through vacuum wall 4316 to the permanent magnets in primary rings 4312 and 4314, respectively. Angular movements of primary rings 4312 and 4314 are thereby coupled to secondary rings 4332 and 4336, respectively. Angular movements of secondary rings 4332 and 4336 are coupled to the in-vacuum robot actuation mechanism.

Note that in this prior art robot drive mechanism, the drive motors are completely separate from the function of coupling motion through vacuum wall 4316. For each of the two magnetic couplers, two sets of permanent magnets are required: one set directly coupled to the motor (but not part of the motor), and a second set directly coupled to the robot actuator and magnetically coupled to the first set of permanent magnets.

SUMMARY OF THE INVENTION

In various embodiments, the present invention provides a robot assembly for transferring substrates, for example, semiconductor wafers and the like. The robot assembly includes a central tube assembly oriented along a central axis and having an inner surface that forms part of a first enclosure at a first pressure, and an outer surface that forms part of a second enclosure at a second pressure. The second pressure is generally different from said first pressure. A substrate transfer plane is perpendicular to the central axis of the central tube assembly. The robot assembly further includes a first transfer robot which itself includes a first rotor assembly and a second rotor assembly, each of which is configured to rotate parallel to the substrate transfer plane concentrically with the outer surface of the central tube assembly. In one embodiment, the second rotor assembly is positioned above the first rotor assembly.

The first transfer robot may further include a first support arm, rigidly attached to the first rotor assembly and extending radially outwards therefrom, a first slider, supported by the first support arm and configured to move in a generally radial direction along a length of said first support arm; a first end effector, supported by the first slider and configured to move in a generally radial direction along a length thereof; a first inner actuator arm, having an inner end rigidly attached to said second rotor assembly and also having an outer end; and a first outer actuator arm, having a first end ratably coupled to the outer end of the first inner actuator arm by a first bearing so as to permit rotation of the first outer actuator arm parallel to the substrate transfer plane, and a second end ratably coupled to the first end effector by a second bearing to permit rotation of the first outer actuator arm parallel to the substrate transfer plane.

In some cases, the first rotor assembly may be mounted on the central tube assembly by first bearing means, and the second rotor assembly may be mounted on the first rotor assembly by second bearing means. Alternatively, the first and second rotor assembles may each be mounted on the central tube assembly by respective first and second bearing means or respective first and second multiplicities of bearing means. In one particular example, the first and second rotor assembles are each mounted on the central tube assembly by two bearing means.

In some embodiments of the invention, the first rotor assembly of the transfer robot includes a first motor rotor assembly. That first motor rotor assembly may itself include a first multiplicity of permanent magnets attached to a first flux return ring, and arranged in alternating North pole and South pole orientations radially inwards. Likewise, the second rotor assembly may include a second motor rotor assembly, having a second multiplicity of permanent magnets attached to a second flux return ring, and arranged in alternating North pole and South pole orientations radially.

In some cases, the central tube assembly of the robot assembly includes a first stator positioned generally in a first common plane with the first motor rotor assembly and inside the first enclosure. The first stator may include a first multiplicity of pole faces oriented radially outwards towards the multiplicity of permanent magnets of the first motor rotor. Likewise, a second stator may be positioned generally in a second common plane with the second motor rotor assembly and inside the first enclosure. The second stator may include a second multiplicity of pole faces oriented radially outwards towards the multiplicity of permanent magnets of the second motor rotor.

To provide control of the robot assembly, the first stator and said second stator may be electrically connected to a motor control system configured to vary magnetic field excitations of (i) the multiplicity of pole faces in said first stator, and (ii) the multiplicity of pole faces in said second stator, thereby to induce rotation of the first rotor assembly and the second rotor assembly, respectively.

In some embodiments of the invention, the robot assembly may include a first middle actuator arm, having a first end and a second end, wherein the first end of the first middle actuator arm is coupled to the first inner actuator arm at a location on the first inner actuator arm approximately halfway between its inner and outer ends by a third bearing, enabling the first middle actuator arm to rotate around an axis parallel to the substrate transfer plane. Also, a second end of the first middle actuator arm may be coupled to the first slider by a fourth bearing, enabling the first middle actuator arm to rotate around parallel to the substrate transfer plane.

In still further embodiments of the invention, the robot assembly may include third and fourth rotor assemblies, each configured to rotate parallel to the substrate transfer plane, concentrically with the outer surface of the central tube assembly. In some cases, the fourth rotor assembly may be positioned below said third rotor assembly. Generally, the third rotor assembly may be configured similarly to the first rotor assembly with a second support arm, second slider and second end effector, and the fourth rotor assembly may be configured similarly to the second rotor assembly with a second inner actuator arm and second outer actuator arm. The third and fourth rotor assemblies may be attached to the central tube assembly in any of the same configurations as the first and second rotor assemblies may be so attached. Likewise, similar arrangements of motor rotor assemblies and stators may be used in connection with the third and fourth rotor assemblies as were used for the first and second rotor assemblies, respectively.

In some cases, the robot assembly may include a bellows, having an upper and a lower end, oriented generally along the central axis of said central tube assembly, wherein the upper end of the bellows is attached with a vacuum seal to the lower end of said central tube assembly, and the lower end of said bellows is attached with a vacuum seal to the second enclosure.

In addition, a vertical actuator assembly attached to the central tube assembly within the first enclosure may enable vertical motion of the central tube assembly relative to the second enclosure. Thus, this vertical motion enables simultaneous vertical motion of both the first and second end effectors.

In some cases, first and second rollers may be attached to the outer surface of the central tube assembly. In such cases, a first cam, attached to the first rotor assembly and positioned to be in contact with the first roller, and a second cam attached to the third rotor assembly, and positioned to be in contact with said second roller, may be used to effect the vertical displacement of components of the robot assembly. For example, the first cam may have a profile shaped to vary the vertical position of the first rotor during rotation thereof said, thereby affecting vertical motion of the first end effector. Likewise, the second cam may have a profile shaped to vary the vertical position of the third rotor during rotation thereof, thereby affecting vertical motion of the second end effector. Alternatively, the cams may be attached to the outer surface of central tube assembly.

Other embodiments, features and advantages of the present invention are discussed in detail below and recited specifically in the claims following said description.

BRIEF DESCRIPTION OF THE DRAWINGS

Other advantages and features of the present invention will be apparent from the following detailed description of the invention when taken in conjunction with the accompanying drawings, in which:

FIG. 6B is a top view of the dual wafer robot shown in FIG. 6A.

DETAILED DESCRIPTION

Figure 1A:
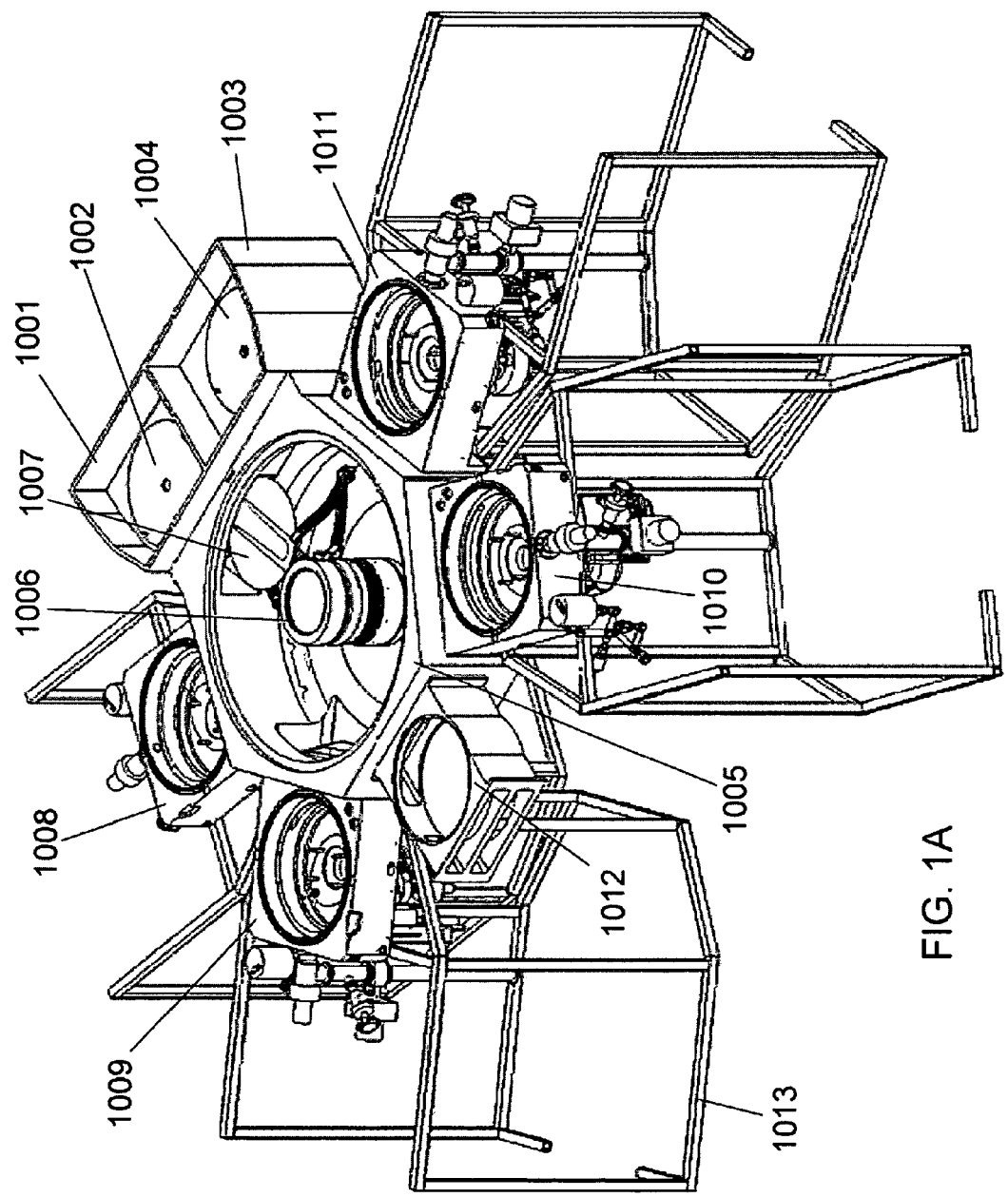
FIG. 1A is an isometric view of a four process module cluster tool configured in accordance with an embodiment of the present invention.

Aspects of the present invention are discussed in detail below with particular reference to the field of semiconductor wafer processing. The use of the present invention in this field is intended to serve as an illustrative example. The present invention finds application in many other fields as well, such as in systems for fabrication of flat panel displays or solar cells.

In many instances, processing times for different modules of a wafer processing system may not be exactly the same. Moreover, for optimal system throughput, it may be necessary to load/unload wafers into/out of process modules oriented at arbitrary angular orientations with respect to one other around the perimeter of a transfer chamber. To address these needs, embodiments of the present invention provide for asynchronous wafer removal and insertion into and out of process modules located at arbitrary angular orientations with respect to one other around a transfer chamber of a cluster tool. Unlike transfer robots of the past, which were designed to transfer only one wafer at a time, or to transfer two wafers but only simultaneously (i.e., not asynchronously), transfer robots configured in accordance embodiments of the present invention are capable of transferring two wafers asynchronously into/out of process modules and/or pass-through modules oriented at arbitrary angular orientations with respect to one other around the perimeter of a transfer chamber.

Accordingly, a wafer processing system arranged in a cluster tool configuration is disclosed herein. This system includes one or more dual wafer robots, each configured for simultaneous and asynchronous wafer handling. One example of such a wafer processing system is a four process module cluster tool, wherein the four process modules (and, optionally, one or more pass-through modules) are located at arbitrary azimuthal orientation with respect to one another around the perimeter of a transfer chamber containing a dual wafer robot. The configuration of the dual wafer robot enables asynchronous loading/unloading of wafers into/out of any of the four process modules (and/or the pass-through module(s), if present), independent of their attachment positions to the transfer chamber, thereby maximizing processing throughput of the system.

Another example of such a wafer processing system is a six process module cluster tool, wherein a first group of two process modules is located around the perimeter of a first transfer chamber containing a first dual wafer robot and a second group of four process modules is located around the perimeter of a second transfer chamber containing a second dual wafer robot. A pass-through module (which may be configured as wafer pre-heat and/or wafer cool-down chambers) is positioned between the first and second transfer chambers. The configuration of the first dual wafer robot enables asynchronous loading/unloading of wafers into/out of both process modules in the first group. The configuration of the second dual wafer robot enables asynchronous loading/ unloading of wafers into/out of any two of the four process modules in the second group, independent of their attachment positions to the second transfer chamber, thereby maximizing processing throughput of the six process module system. Wafer processing systems with other numbers of process modules (e.g., eight) may be configured in similar fashion.

In the above-described examples of systems configured in accordance with aspects of the present invention, the wafer heights within the process modules may be generally the same. The wafer positions within the pass-through module(s), however, are preferably arranged in an above and below configuration, for example spaced about 12 mm apart vertically. Such displacement is a design choice and is not critical to the present invention. Other displacements may be used. To accommodate these varying heights, the dual wafer robot can be configured with a cam mechanism that varies the heights of the end effectors carrying the wafers being transferred as a function of the azimuthal positions of the end effectors about a central axis of the dual wafer robot. For example, when an end effector is rotated to face a process module, the cam mechanism may position the end effector at the proper height for insertion/removal of a wafer into/from that process module. When an end effector is rotated to face a pass-through module, the end effector is raised or lowered to accommodate loading/unloading of wafers into/from the pass-through module. In other cases, one wafer may be loaded into the pass-through module while another wafer is removed therefrom.

For many semiconductor manufacturing processes, such as chemical vapor deposition (CVD), if is necessary to heat the wafer to high temperatures (>300° C. in some cases) before beginning the CVD process. For highest system throughput, it is advantageous to pre-heat the wafer prior to introduction into the process module, thereby reducing or eliminating any pre-heating needed within the process chamber. After the high-temperature process is completed, it is necessary to cool-down the wafer to near room temperature prior to loading it back into the loadlock. Again, it is advantageous to perform this cool-down operation outside the process module in order to maximize system throughput. Thus, as alluded to above, the present wafer processing system can be configured with one or more wafer pre-heat and cool-down chambers in order to maximize the use of process modules for wafer processing operations without having to also accommodate lengthy wafer pre-heat and cool-down steps.

In many cases, the wafer pre-heat and cool-down times, may be longer than the actual wafer processing times. In these cases, it is advantageous for the pre-heat and cool-down chambers to accommodate a large number of wafers, all of which are undergoing simultaneous pre-heating or cooling-down. In order for the dual wafer robot to be able to load/unload wafers into/out of any two slots in such multi-slot pre-heat and cool-down chambers, it is advantageous for the dual wafer robot to have a collective Z-axis (vertical) motion to enable access to any pair of neighboring slots within the pre-heat and cool-down chambers. Accordingly, embodiments of the present dual wafer robot can be configured to be capable of a second type of vertical motion, enabling collective and simultaneous motion of both wafers, (i.e., both end effectors). Note that this collective, synchronous motion is provided via a different mechanism than the asynchronous, non-collective vertical motion provided by the cam mechanism.

In various embodiments of the present invention, the dual wafer robot is actuated by a set of four rotors, two for each end effector. The rotation of these rotors is enabled by four brushless/frameless motors, each of which is integrated into a single rotor. The integration of the motors with the rotors eliminates the need for separate air-to-vacuum magnetic couplers. Additional advantages of the integrated motor are (1) the elimination of all moving parts in air, and (2) the ability to provide forced air cooling for the motor stators, which is advantageous in CVD tools where wafer temperatures may exceed 300° C.

To provide advantageous throughput for the wafer processing system, embodiments of the present dual wafer robot are configured with a control system which enables the end effector motion profile (position, velocity, acceleration and jerk) in both extension and rotation to be optimized for minimum jerk within the constraint of a pre-determined maximum allowable acceleration. For rotational motions having both azimuthal and centrifugal (radial) accelerations, the total acceleration is the vector combination of both accelerations—the robot control takes this into account in the velocity and acceleration profiles during rotation.

Semiconductor wafer fabrication typically requires a large number of processing steps, many of which require the wafer to be in a high vacuum environment. There are at least three main categories of vacuum processing steps, including:

1. Deposition—where layers of material are deposited on the surface of a wafer. This material is then patterned in subsequent steps to form transistor gates, contacts, vias, metal conductors, etc.
2. Etching—where one or more previously-deposited layers on the wafer are selectively etched through a previously-patterned layer of photoresist.
3. Ion Implantation—where a high energy beam of dopant ions is directed at the wafer surface and is implanted in the wafer within a few micrometers of the surface, thereby defining conducting regions (after annealing). This process is usually performed in a "batch mode", where a large number of wafers are simultaneously implanted, not in a cluster tool.

In general, the first two types of processing operations are done in "cluster tools", which are processing systems consisting of a number of "process modules" arranged around the perimeter of one or more transfer chambers, each containing a wafer transfer robot. The entire internal volume of the cluster tool is maintained at high vacuum to maintain cleanliness of the wafer surface and to enable deposition and etching processes to occur.

The technical performance and economic viability of a semiconductor fabrication process depends on the throughput at which it can be performed. Typical system throughputs are now substantially in excess of 100 wafers per hour (wph), requiring the use of multiple process modules operating in parallel on wafers introduced into the system through a high-speed air-to-vacuum loadlock. With proper system design, throughput is solely a function of the deposition or etching speeds of the process modules, and is not dependent on the speed of the transfer robot. It is therefore desirable to configure a cluster tool such that the speed of the transfer robot is sufficient to ensure that it is never the rate-limiting step in wafer processing.

For some deposition processes, such as chemical vapor deposition (CVD), the wafer must be heated to high temperature (e.g., on the order of 300° C.), prior to beginning the deposition process, since CVD entails the thermal decomposition of a reactant species on the wafer surface to leave behind the desired material, while simultaneously generating volatile product gases which must be pumped away. The throughput of a CVD process module will be enhanced if wafers can be preheated prior to loading into the CVD module. Preheating is typically performed in a preheating module, but not usually to the full 300° C. temperature required to begin CVD deposition. It is therefore desirable to configure a cluster tool with one or more pass-through modules, each enabling at least two wafers to be simultaneously preheated to temperatures necessary for CVD processing.

When CVD processing of a wafer is completed, the wafer must be removed from the process module while still near the high processing temperatures, otherwise a substantial overall reduction in tool throughput will occur. It is undesirable or impossible to transfer wafers at these high temperatures directly into an exit loadlock of the cluster tool, thus a wafer cool-down step is required between the time of wafer removal from the CVD process module and its insertion into the exit loadlock. It is therefore desirable to configure a cluster tool with one or more pass-through modules, each permitting at least two wafers to be cooled down to temperatures necessary for insertion into an exit loadlock.

Maximization of the throughput of the cluster tool configuration described above requires the ability to unload wafers from each of the process modules immediately after the completion of the processing of each wafer, independent of the status of other process modules mounted on the same transfer chamber. Similarly, it is also necessary to be able to load a wafer into each process module as quickly as possible after the completion of processing of the previous wafer. Since typically there may be as many as four or more process modules attached to each of the transfer chambers, it is advantageous to be able to transfer more than one wafer simultaneously with the transfer robot. In addition, it is also advantageous to be able to load/unload wafers into/out of process modules at arbitrary relative positions to each other (i.e., not always exactly on opposite sides of the transfer chamber). Since processing times may vary between process modules, it is also advantageous to be able to load/unload wafers asynchronously, so that no process module need wait for the completion of processing in another module before wafer unloading can begin. It is therefore desirable to provide a dual wafer robot capable of asynchronously loading and unloading wafers into and out of two process modules, where these process modules may be at arbitrary relative locations to each other around the perimeter of the transfer chamber.

The actuation of wafer transport robots typically involves one or more electric motors, mounted in air, where some form of air-to-vacuum coupler is used to transfer motion from the motor(s) to the in-vacuum mechanisms of the robot. In addition, the motor often operates at high speed with low torque, thus requiring a reduction gear to generate low speed high torque power necessary for the generally low speed robot motions (both extensions and rotations of end effectors carrying wafers). It is therefore desirable to provide a robot actuation mechanism in which the robot drive motor is a low speed high torque motor, and wherein the stator of the motor is mounted in air and the rotor of the motor is integrated with the robot actuation mechanism in vacuum. The needs for a reduction gear and an air-to-vacuum coupler are thereby eliminated.

The need for maximization of cluster tool throughput leads to a requirement for maximized speed of the robot motion, both during extension and retraction of the end effectors, and during azimuthal rotation thereof within the transfer chamber. This optimization commonly involves the minimization of the integral of the square of the "jerk" function (the derivative of the acceleration) over the full wafer trajectory. This jerk function minimization is subject to the limitation of a pre-defined maximum allowable acceleration of the end effector. This maximum acceleration is usually a function of the coefficient of friction between the back side of the wafer and pads (e.g., three or more pads) on the end effector on which the wafer lies during transfer.

In the case of high temperature processing (such as CVD at 300° C.), the use of rubber pads is not feasible, and so metal pads are used. Since metal pads have lower coefficients of friction, the allowable maximum wafer acceleration is reduced. If the wafer exceeds the maximum acceleration permitted by these lower coefficients of friction there is a danger of slippage, leading potentially to wafer misalignment or breakage.

For linear motions, such as extensions and retractions of the end effector to load/unload wafers into/out of process modules and pass-through modules, there exists much literature on the minimum jerk trajectory strategy. For rotational motions, however, there are two components to the acceleration: azimuthal and radial (centrifugal). Thus, the overall acceleration of the wafer on the end effector is the vector combination of these two orthogonal accelerations. The jerk function is then the vector combination of orthogonal azimuthal and radial jerk functions, and finding the minimum jerk trajectory becomes complicated for a real-time trajectory controller. It is thus desirable to control the rotational motion of a dual wafer robot in order to maintain the total wafer acceleration approximately below a pre-determined maximum value, while simultaneously minimizing the integral of the square of the azimuthal jerk function over the full wafer trajectory.

In a cluster tool, the heights for loading/unloading wafers into/out of process modules are typically the same. The configurations for the pass-through modules containing the pre-heat and/or cool-down chambers involve at least two slots located above and below one another (i.e., spaced along the vertical Z-axis). Assuming for simplicity that the two slots are spaced ±6 mm relative to the wafer height in a process module, transfer of a wafer from a process module to the upper slot of a two-slot pass-through module may involve moving the wafer 6 mm upwards. Conversely, transfer of a wafer from a process module to the lower slot would involve moving the wafer downwards 6 mm. Note that these motions are in opposite directions, but need to occur either simultaneously or asynchronously. This motion differs from that common with other dual wafer robots, where all vertical motion involves both wafers moving the same distance and direction simultaneously. It is therefore desirable to configure a dual wafer robot with the capability for simultaneous or asynchronous Z-axis motion of the end effectors in different directions over distances sufficient to access vertically-spaced slots in a pass-through module.

The wafer pre-heat operation described above may require a time comparable or longer than the time for deposition in the process modules. Thus it may be necessary to hold a number of wafers in the pre-heat chamber (located in a pass-through module) until the wafers are fully pre-heated. Similarly, the wafer cool-down operation may have the same constraints. These requirements for longer pre-heating and/or cooling times are typically met by providing a larger number of slots (four or more) in the pre-heat and cool-down chambers, thereby enabling wafers to be stored for longer times prior to either insertion into a process module (pre-heat), or transfer to an exit loadlock (cool-down). Enabling the transfer robot to access all of these slots (which are typically spaced about 12 mm apart along the vertical Z-axis) may require a larger Z-motion for the robot than that described in the preceding paragraph. It is therefore desirable to provide a collective Z-motion for the dual wafer robot in which all end effectors move simultaneously with the same speed and direction along the vertical Z-axis.

Configurations of the Wafer Processing System

FIG. 1A is an isometric view of a four process module cluster tool configured in accordance with one embodiment of the present invention. Using an air robot (not shown), a number of wafers 1002 are loaded into entrance loadlock 1001, which may be configured to perform a wafer pre-heat operation as described above. Loadlock 1001 may be configured with multiple chambers, each with separate pumpdown and venting capability, to ensure that there are wafers available for loading by dual transfer robot 1006 at all times. An entrance valve (not shown) separates entrance loadlock 1001 from transfer chamber 1005. When the entrance valve is open, dual transfer robot 1006 extends either or both of two end effectors into entrance loadlock 1001 and withdraws one or two wafers 1007, one per end effector. Assuming two wafers are withdrawn, one carried on each end effector, the two end effectors of robot 1006 then move in opposite azimuthal directions within transfer chamber 1005, enabling one of wafers 1007 to be inserted into each of two process modules, such as process modules 1008 and 1011, nearly simultaneously.

The rotational distance to move a first end effector (and one wafer 1007) counter-clockwise from initially facing loadlock 1001 to facing process module 1008 is shown as roughly 45-60°. The rotational distance to move a second end effector (and a second wafer 1007) clockwise to face process module 1011 is shown as roughly 90-120°. Thus wafer insertion into process module 1008 may commence slightly before wafer insertion into process module 1011—this necessitates asynchronous operation of the two end effectors of the dual wafer robot.

Later sections of this description discuss the cam mechanism used to control the heights of the end effectors to ensure proper insertion of wafers into the process modules. Loading of process modules 1009 and 1010 requires loading third and fourth wafers from loadlock 1001 onto the two end effectors of dual water robot 1006. Depending on details of the design of loadlock 1001, which are not critical to the present invention, a collective Z-motion of the dual wafer robot may be necessary as described below.

In the illustration, a pass-through module 1012 is shown with two chambers in an above/below orientation with respect to one another. In one embodiment of the present invention, one chamber of the pass-through module is configured for wafer pre-heating, and the other chamber for wafer cool-down. In general, a pass-through module may be used in two modes:

1. As a pass-through module (illustrated for a six-chamber system in FIGS. 2A-B, or for an eight-chamber system as shown in FIGS. 3A-B). In this mode, one or two wafers would be loaded into the pre-heat chamber of pass-through module 1012, and then after pre-heating, a second robot (illustrated in FIGS. 2A-3B) would remove the wafers for insertion into two process modules (not shown—see FIGS. 2A-3B). Similarly, after processing, the wafers would be inserted by the second robot (see FIGS. 2A-3B) into the cool-down chamber of pass-through module 1012. After adequate cool-down, the wafers would be removed by robot 1006 and transferred to exit loadlock 1003.
2. As a module used only for wafer pre-heating and cool-down (i.e., not functioning as a pass-through). In this mode, one or two wafers would be loaded by robot 1006 into the pre-heat chamber of pass-through module 1012, and then, when adequately pre-heated, the wafers would be removed by robot 1006 and loaded into any of the process modules 1008-1011 (one wafer into each process module). Similarly, after processing, the wafers would be removed from the subject process modules 1008-1011 by robot 1006 and inserted into the cool-down chamber of pass-through module 1012. After adequate cool-down, the wafers would be removed by robot 1006 and transferred to exit loadlock 1003. Pass-through chamber 1005 always functions in this mode for the four process module cluster tool illustrated in FIGS. 1A-B.

Figure 1B:
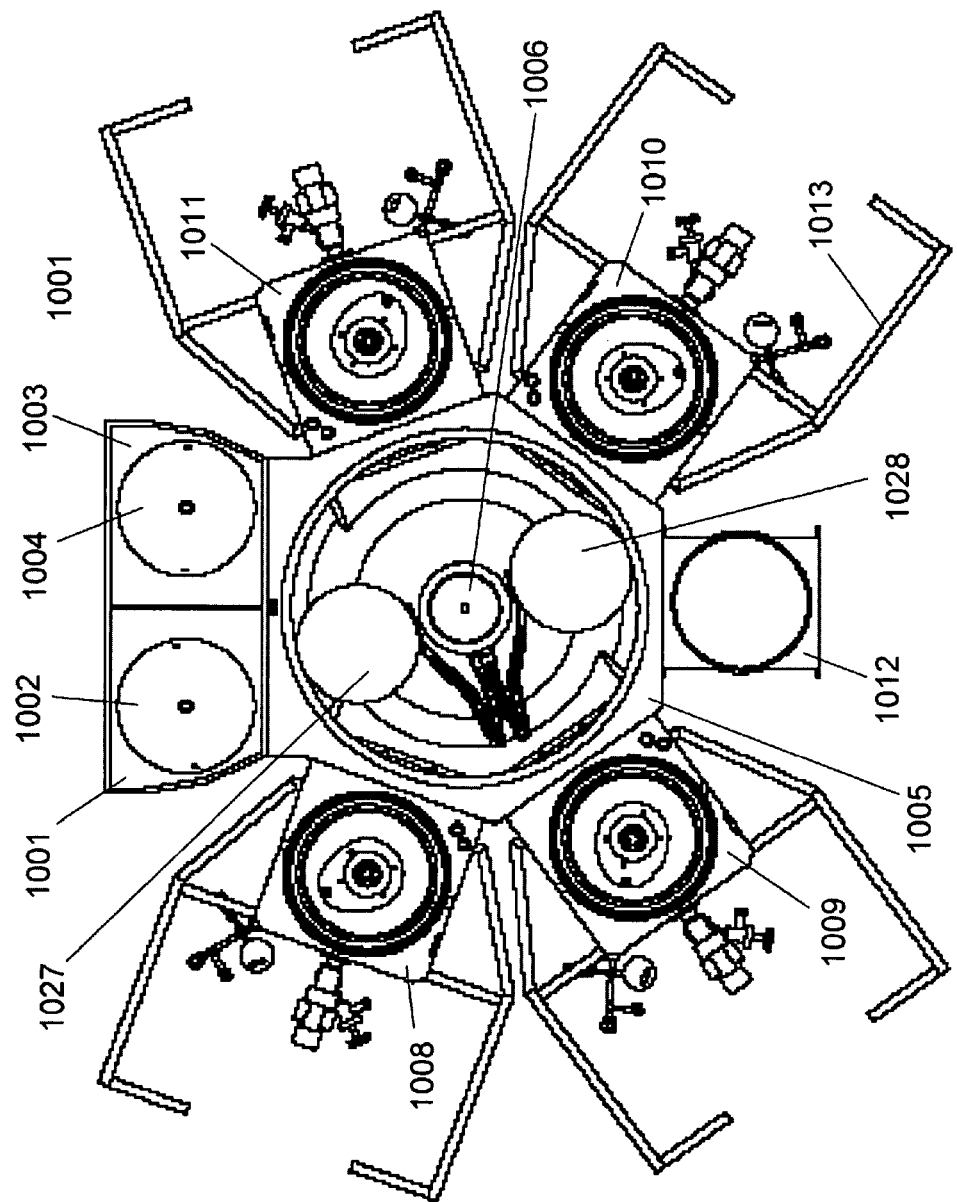
FIG. 1B is a top view of the four process module cluster tool illustrated in FIG. 1A.

FIG. 1B is a top view of the four process module cluster tool shown in FIG. 1A. Prior to processing, wafers 1002 are loaded into the entrance loadlock 1001 by an air robot (not shown). Processed wafers 1004 are loaded into exit loadlock 1003 and, after venting to atmospheric pressure, are subsequently removed by an air robot (not shown). Each process module 1008-1011 is enclosed by a frame 1013 that enables mounting of various electronics and power supplies necessary for the operation of process modules 1008-1011. Two wafers 1027 and 1028 (equivalent to wafers 1007 in FIG. 1A) are shown loaded on the two end effectors of robot 1006.

Figure 2A:
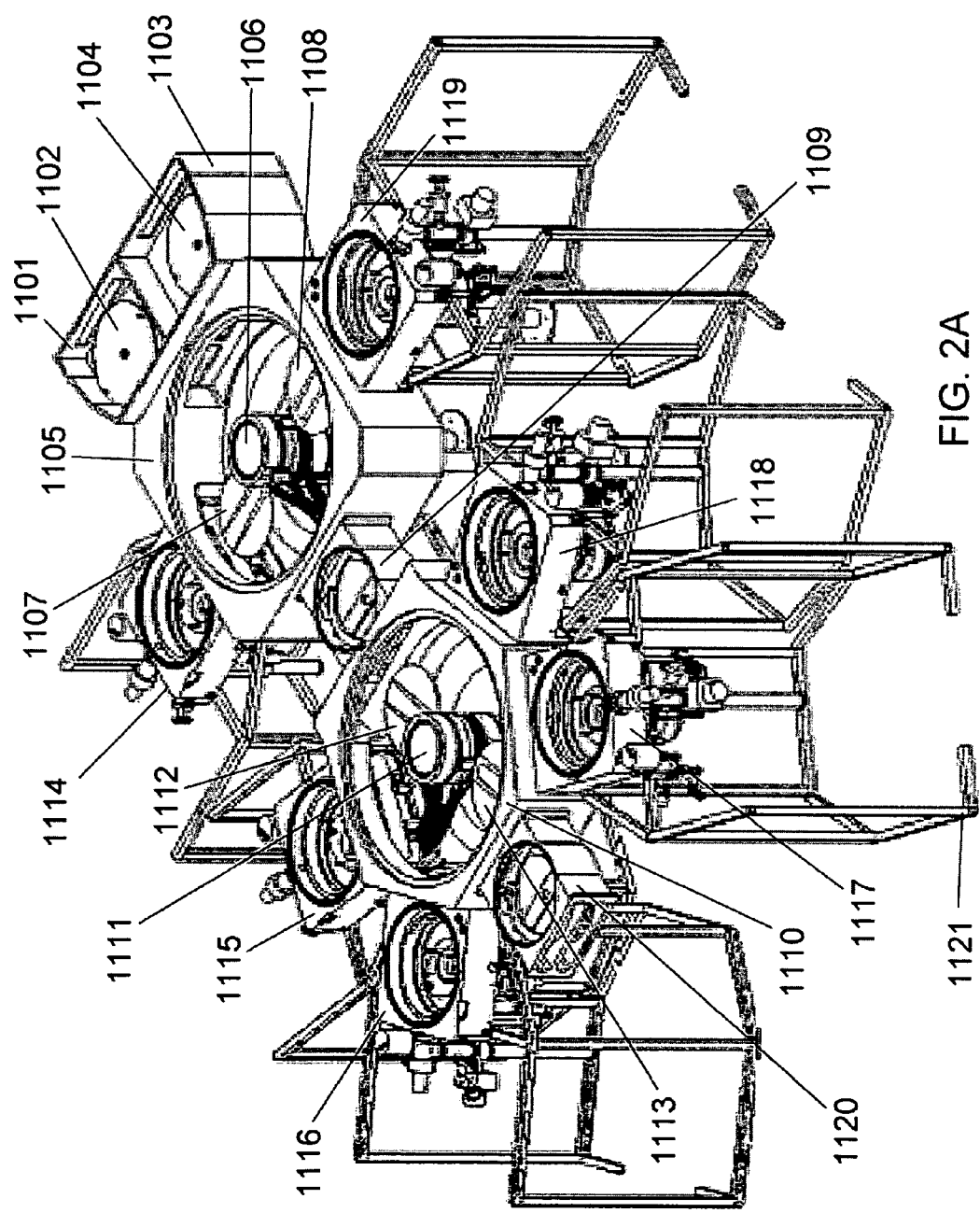
FIG. 2A is an isometric view of a six process module cluster tool configured in accordance with an embodiment of the present invention.
Figure 3A:
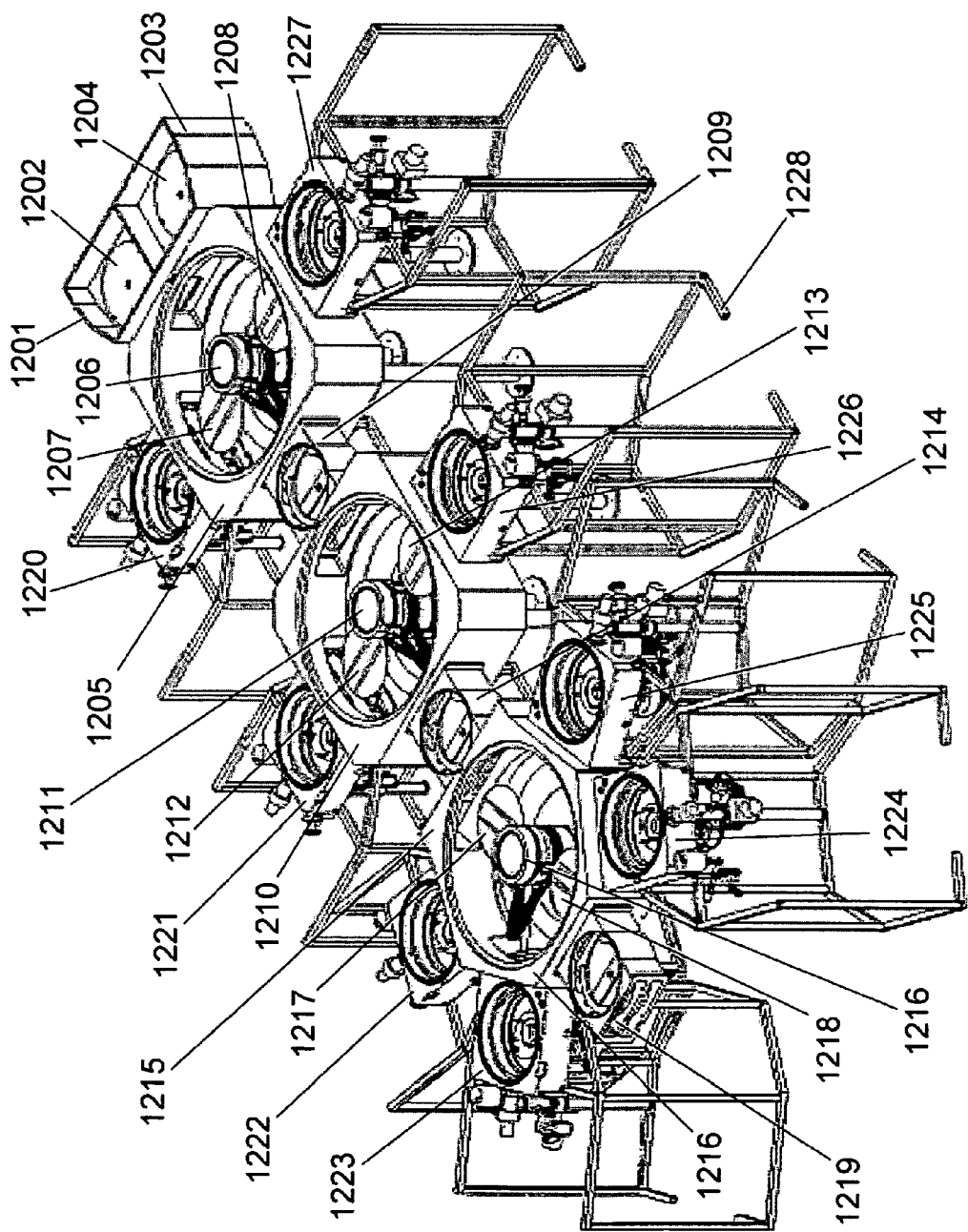
FIG. 3A is an isometric view of an eight process module cluster tool configured in accordance with an embodiment of the present invention.
Figure 3B:
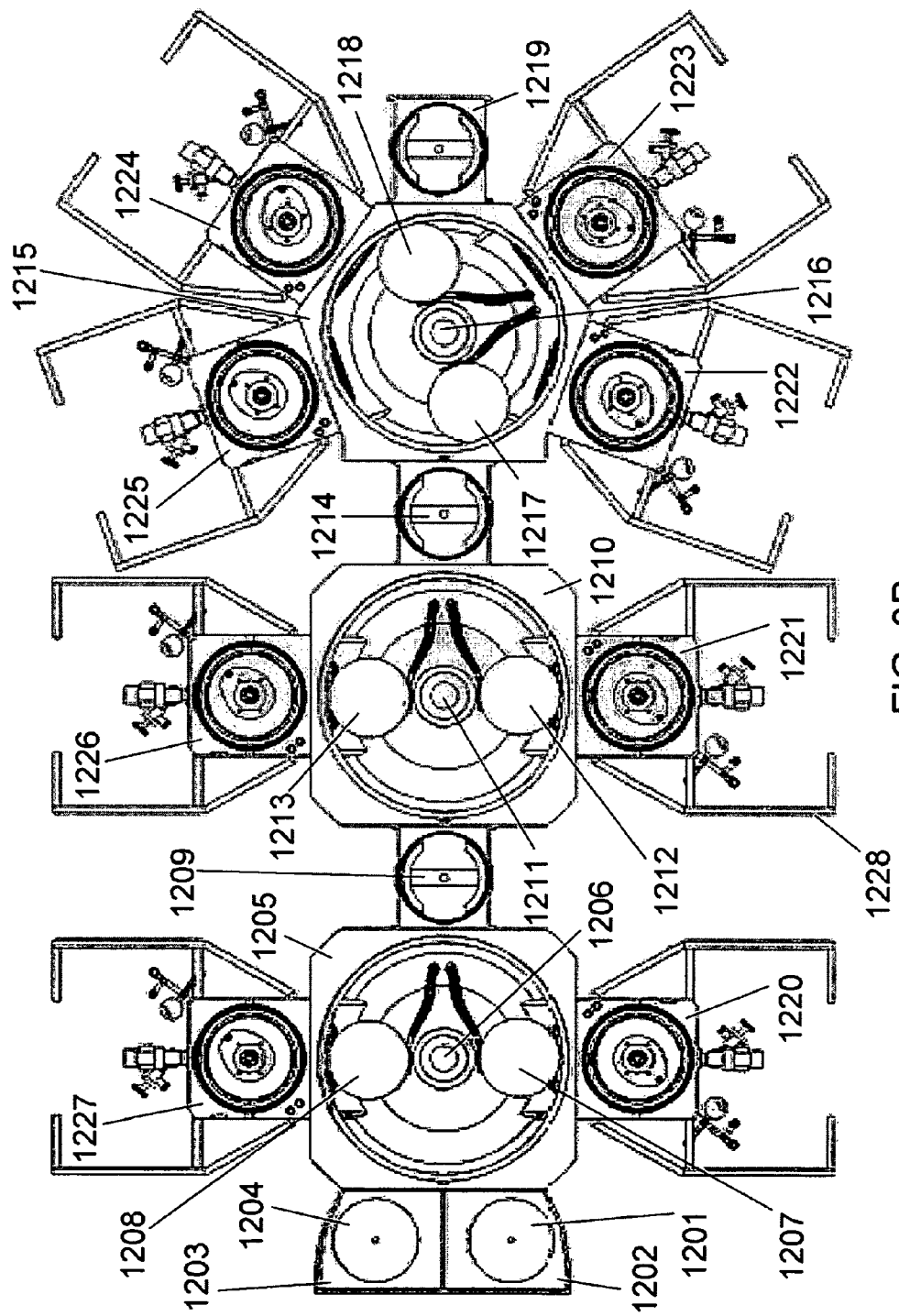
FIG. 3B is a top view of the eight process module cluster tool shown in FIG. 3A.

FIG. 2A is an isometric view of a six process module cluster tool, configured in accordance with one embodiment of the present invention. In this configuration, loadlock 1101 contains wafers 1102 ready for processing. Loadlock 1103 contains processed wafers 1104. Loadlocks 1101 and 1103 are connected to transfer chamber 1105, containing transfer robot 1106. Two process modules 1114 and 1119 are attached to transfer chamber 1105. A first pass-through module 1109, attached to transfer chambers 1105 and 1110, enables robot 1106 to transfer two wafers 1107 and 1108 simultaneously or asynchronously from loadlock 1101 into a pre-heat chamber in module 1109. Pass-through module 1109 may function in either or both of the modes described above. After adequate preheating, a second dual wafer robot 1111 removes the two wafers 1112 and 1113, and transfers each of wafers 1112 and 1113 to one of the process modules 1115-1118 (one wafer per module) that are attached to transfer chamber 1110. A second pass-through module 1120 is shown, functioning in the non-pass-through mode described above.

Figure 2B:
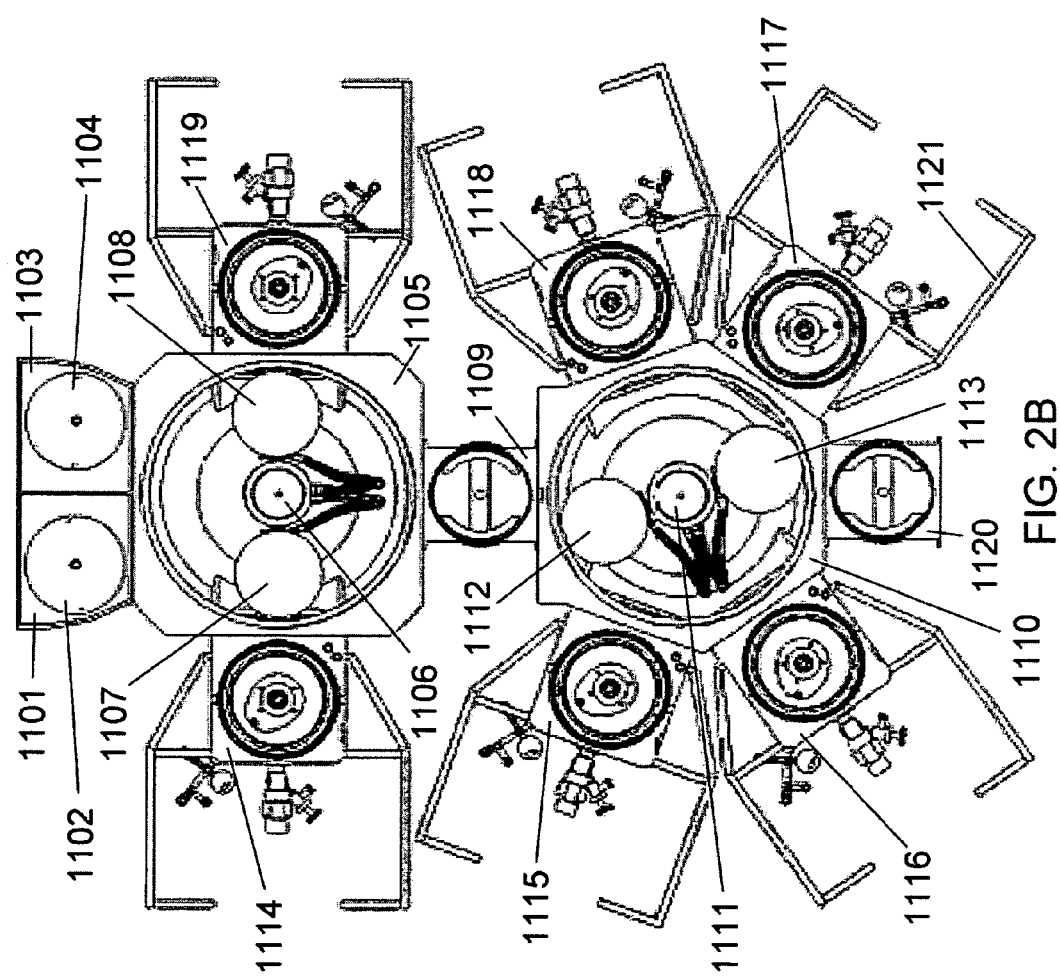
FIG. 2B is a top view of the six process module cluster tool shown in FIG. 2A.

FIG. 2B is a top view of the six process module cluster tool shown in FIG. 2A. Wafer 1107 is in position for loading into process module 1114, while robot 1106 has also positioned wafer 1108 for loading into process module 1119. Note that in this case, the two end effectors of robot 1106 are oriented 180° azimuthally with respect to each other. Robot 1111 is shown holding with two wafers 1112 and 1113. Processed wafer 1112 has just been removed from process module 1115 and pre-heated wafer 1113 has just been removed from the pre-heat chamber in pass-through module 1120. The end effector carrying processed wafer 1112 is rotating clockwise towards pass-through module 1109. The end effector carrying pre-heated wafer 1113 is rotating counter-clockwise, towards process module 1117. This configuration with multiple pass-through chambers 1109 and 1120 enables wafers to be pre-heated and/or cooled-down in one or both of chambers 1109 and 1120, depending on the temperatures of the various wafers already in the system (in process modules 1114-1119 or pass-through modules 1109 and 1120). Each process module 1114-1119 is enclosed by a frame 1121 that enables mounting of various electronics and power supplies necessary for the operation of process modules 1114-1119.

FIG. 3A is an isometric view of an eight process module cluster tool configured, in accordance with one embodiment of the present invention. In this configuration, loadlock 1201 contains wafers 1202 ready for processing. Loadlock 1203 contains processed wafers 1204. Loadlocks 1201 and 1203 are connected to transfer chamber 1205, containing transfer robot 1206. Two process modules 1220 and 1227 are attached to transfer chamber 1205. A first pass-through module 1209, attached to transfer chambers 1205 and 1210, enables robot 1206 to transfer two wafers 1207 and 1208 simultaneously or asynchronously from loadlock 1201 into a pre-heat chamber in module 1209. Pass-through module 1209 may function in either or both of the modes described above.

After adequate pre-heating, a second dual wafer robot 1211 removes the two wafers 1212 and 1213, and transfers each wafer to one of the process modules 1221 and 1226, or to pass-through module 1214, all of which are attached to transfer chamber 1210. The second pass-through module 1214 may function in either or both of the modes described above. A third pass-through module 1219 is shown, functioning in the non-pass-through mode described above.

The operation of robot 1211 in transfer chamber 1210 is to transfer wafers 1212 and 1213 into/out of process modules 1221 and 1226, and into/out of pass-through modules 1209 and 1214. The operation of robot 1216 in transfer chamber 1215 is to transfer wafers 1217 and 1218 into/out of process modules 1222-1225 and into/out of pass-through modules 1214 and 1219.

FIG. 3B is a top view of the eight process module cluster tool shown in FIG. 3A. Each process module 1220-1227 is enclosed by a frame 1228 that enables mounting of various electronics and power supplies necessary for the operation of process modules 1220-1227.

Dual Wafer Robot at Pass-Through Module

Figure 4A:
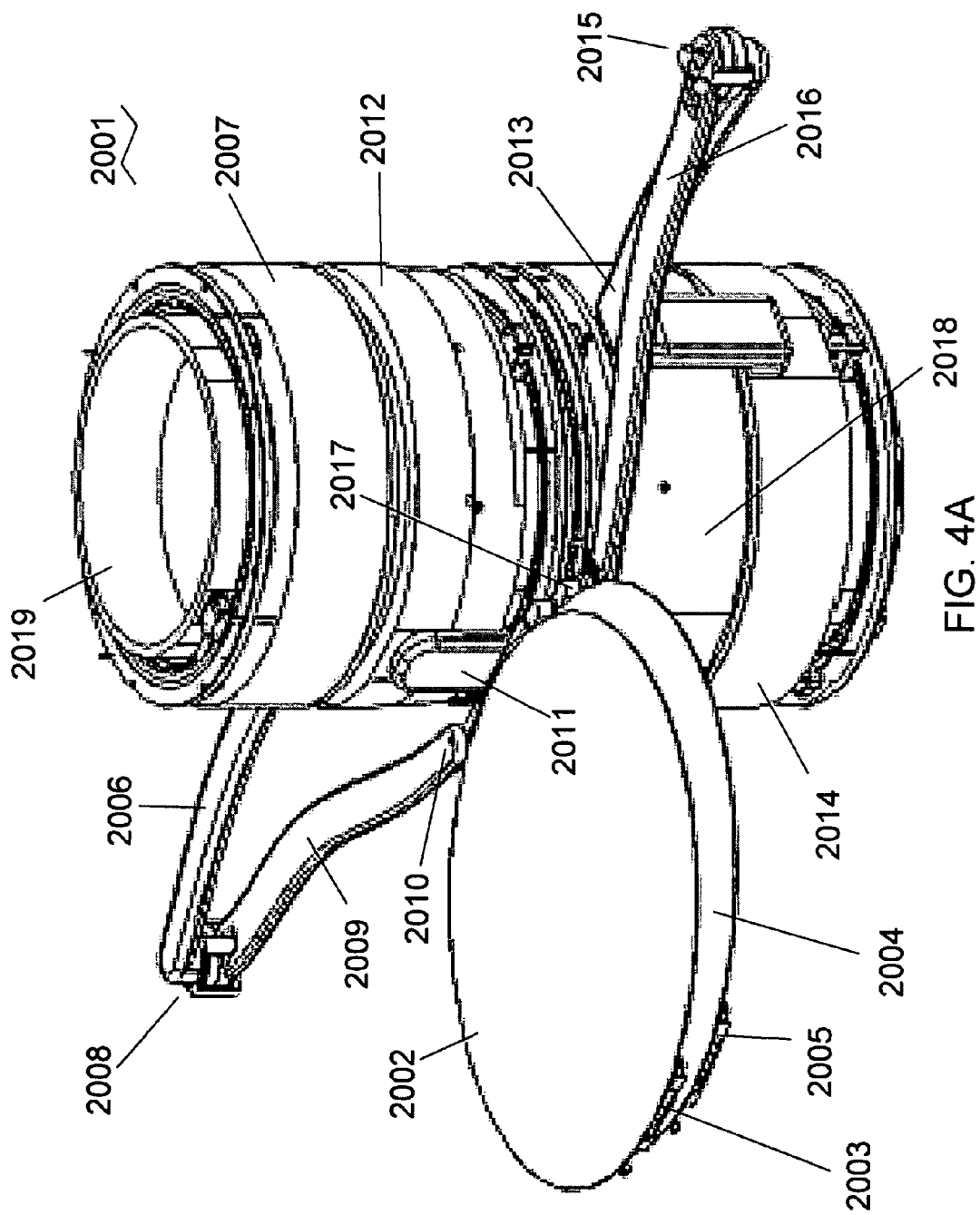
FIG. 4A is an isometric view of a dual wafer robot configured in accordance with one embodiment of the present invention and showing two end effectors (each carrying a single wafer) in an above and below arrangement on one side of the robot's rotational axis, where both end effectors are fully retracted.

FIG. 4A is an isometric view of a dual wafer robot 2001 configured in accordance with one embodiment of the present invention, showing two wafers 2002 and 2004 supported by end effectors 2003 and 2005, respectively. Wafers 2002 and 2004 have been positioned by end effectors 2003 and 2005, respectively, in an above and below configuration, suitable for simultaneous loading of wafers 2002 and 2004 into a pass-through module (not shown). Upper end effector 2003 is supported by support arm 2011 attached to rotor 2012 (see FIGS. 5A-B for views of slider 2040 which connects support arm 2011 to end effector 2003). Actuator arm 2006 is attached to rotor 2007, and is connected through pivot 2008 to outer arm 2009. Outer arm 2009 is connected to end effector 2003 through pivot 2010.

Figure 4C:
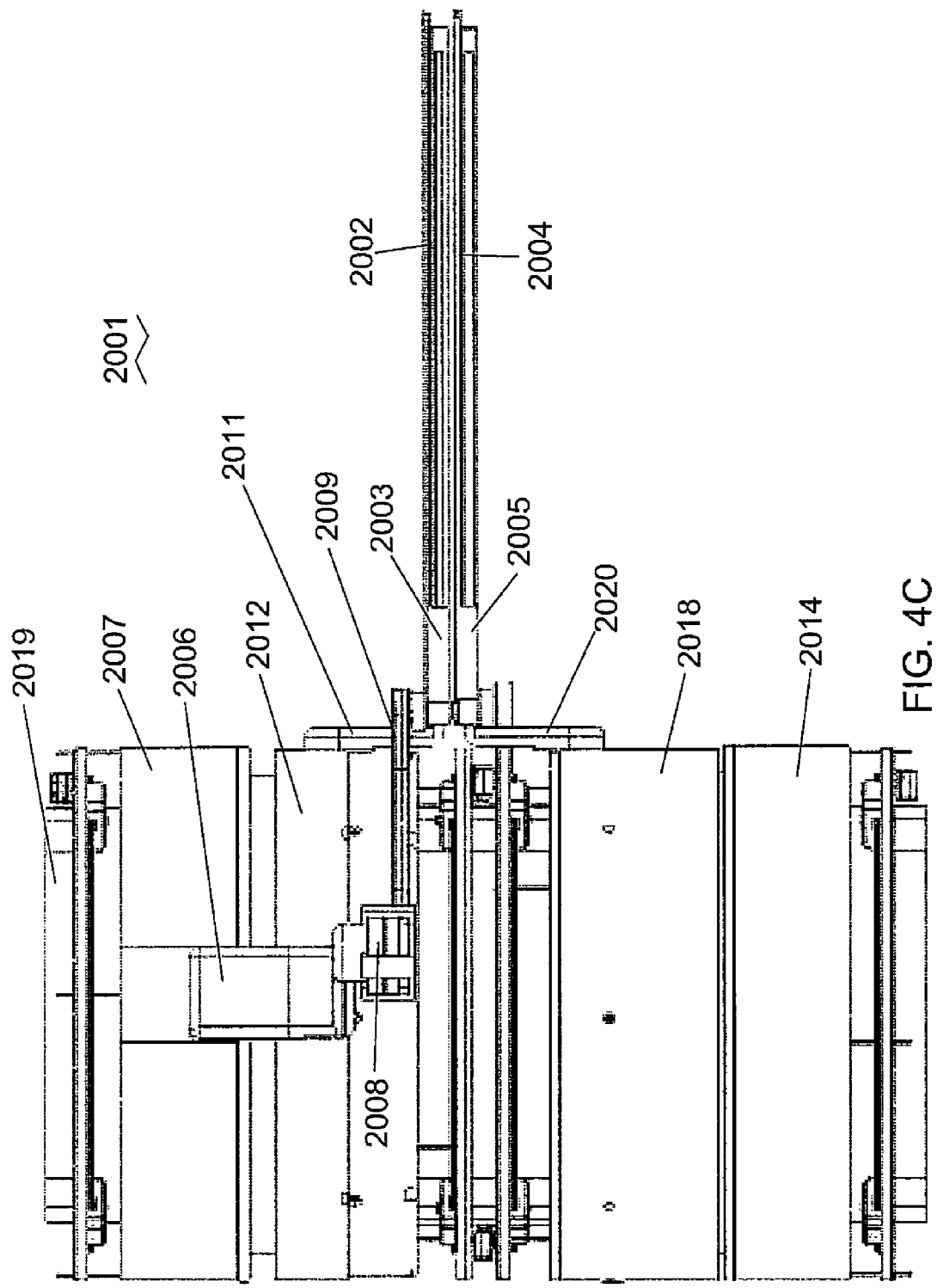
FIG. 4C is a side view of the dual wafer robot illustrated in FIGS. 4A-B.
Figure 5A:
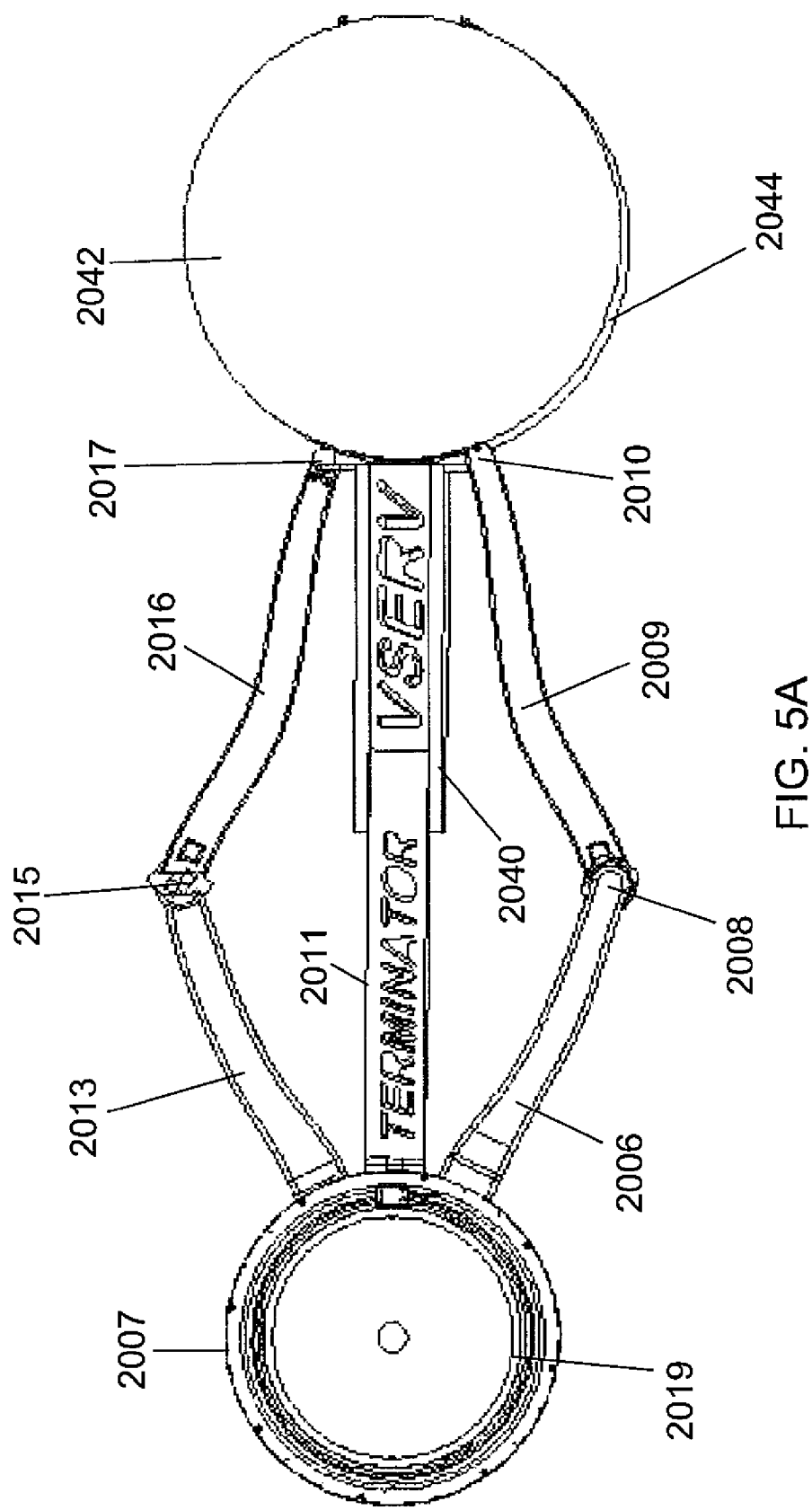
FIG. 5A is a top view of a dual wafer robot configured in accordance with an embodiment of the present invention and showing two end effectors (each carrying a single wafer) in an above and below arrangement, where both end effectors are fully extended for loading/unloading two wafers into/out of a pass-through chamber.
Figure 5B:
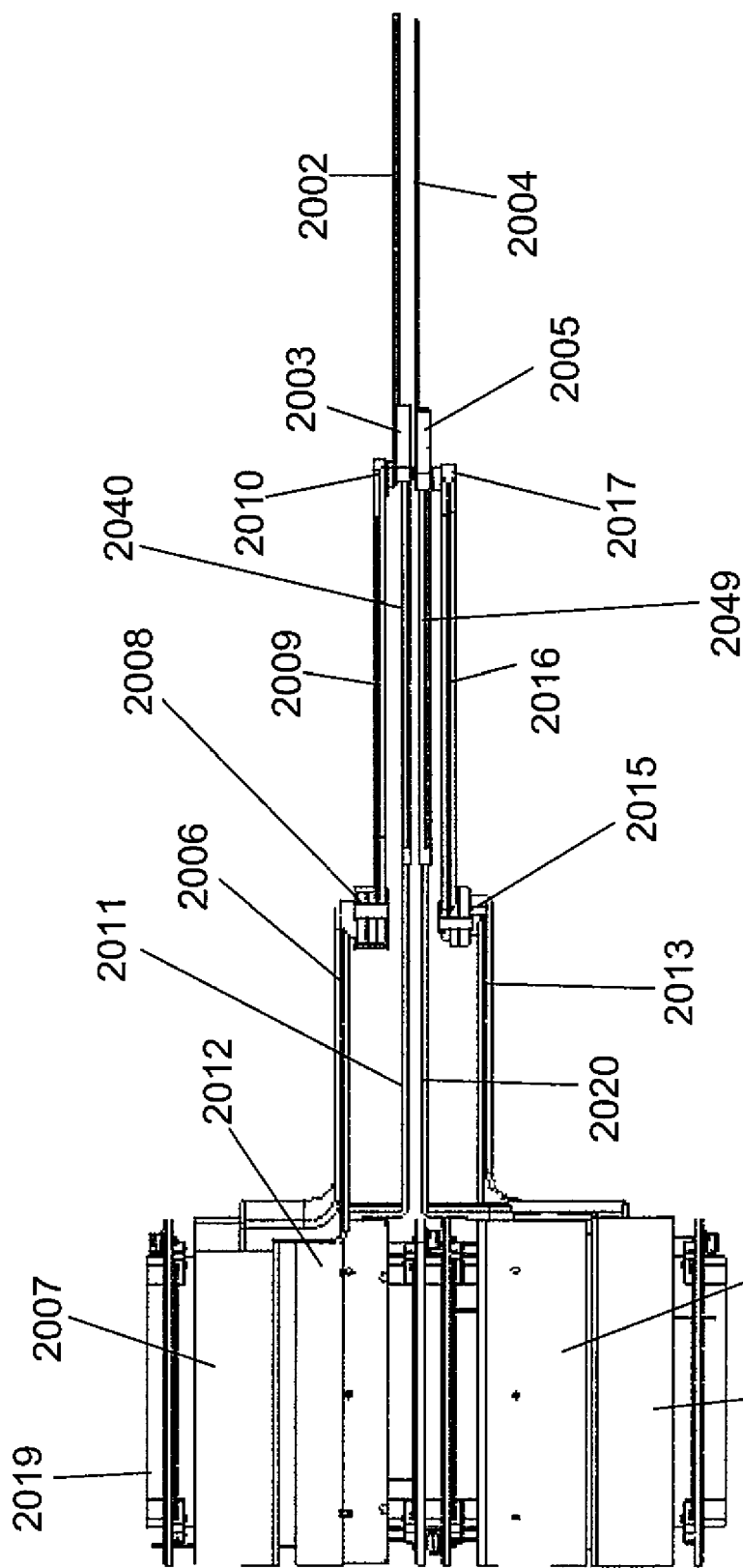
FIG. 5B is a side view of the dual wafer robot shown in FIG. 5A.

Lower end effector 2005 is supported by support arm 2020 (see FIG. 4C) that is attached to rotor 2018 (see FIG. 5B for a view of slider 2049 which connects support arm 2020 to end effector 2005). Actuator arm 2013 is attached to rotor 2014, and is connected through pivot 2015 to outer arm 2016. Outer arm 2016 is connected to end effector 2005 through pivot 2017. Details on the extension of the end effectors are provided in connection with a discussion of FIG. 12, below.

Figure 4B:
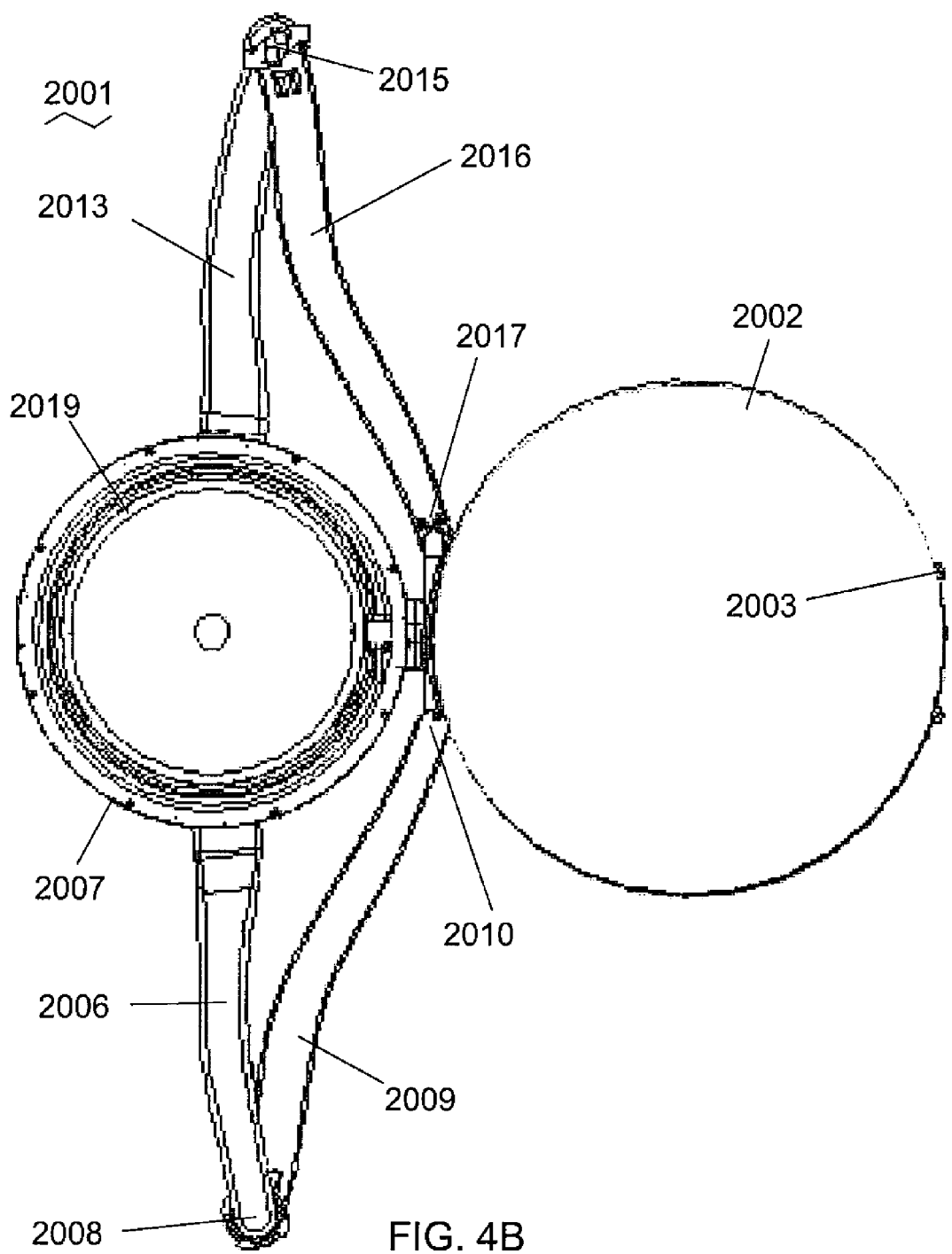
FIG. 4B is a top view of the dual wafer robot illustrated in FIG. 4A.

FIG. 4A illustrates the dual wafer robot 2001 with both end effectors fully retracted—this is the configuration in which the end effectors 2003 and 2005 may rotate. The rotors 2007, 2012, 2014, and 2018 rotate around the central fixed tube 2019 which forms part of the transfer chamber (not shown—see. e.g., chambers 1105 and 1110 in FIGS. 2A-B). FIG. 4B is a top view of the dual wafer robot 2001 shown in FIG. 4A.

FIG. 4C is a side view of the dual wafer robot shown in FIGS. 4A-B. This view shows more clearly how support arms 2011 and 2020 extend downwards and upwards from rotors 2012 and 2018, respectively, to enable end effectors 2003 and 2005 to position waters 2002 and 2004 for insertion/removal into/out of vertically-spaced slots in a pass-through module.

FIG. 5A is a top view of a dual wafer robot configured in accordance with one embodiment of the present invention, showing two wafers 2042 and 2044 in an above/below arrangement, where both robot end effectors are fully extended for loading two wafers 2042 and 2044 simultaneously into a pass-through chamber (not shown). The slide mechanism includes support arm 2011, slider 2040, and end effector 2003. In cases where there is a large difference between the wafer position for robot rotation and the wafer position in the center of a process module, the three-element telescoping arrangement shown here is desirable. In cases with a smaller extension distance, a two element (i.e., support arm and end effector, without the intervening slider) arrangement may be preferred. The actuator arm mechanism includes components 2006-2010 and is attached to the end effector in either the two- or three-element telescoping arrangements.

In the example shown here, slider 2040 is not directly connected to an actuator—the motion of slider 2040 is due to physical stops (not shown) within the bearings connecting support arm 2011 to slider 2040 and the bearings connecting slider 2040 to end effector 2003. Physical stops within sliding bearings are familiar to those skilled in the art.

FIG. 5B is a side view of the dual wafer robot illustrated in FIG. 5A. The actuator mechanism for end effector 2005 includes actuator arm 2013 attached to rotor 2014 and coupled through pivot 2015 to outer arm 2016. Outer arm 2016 attaches to end effector 2005 through pivot 2017.

Dual Wafer Robot at Process Modules

Figure 6A:
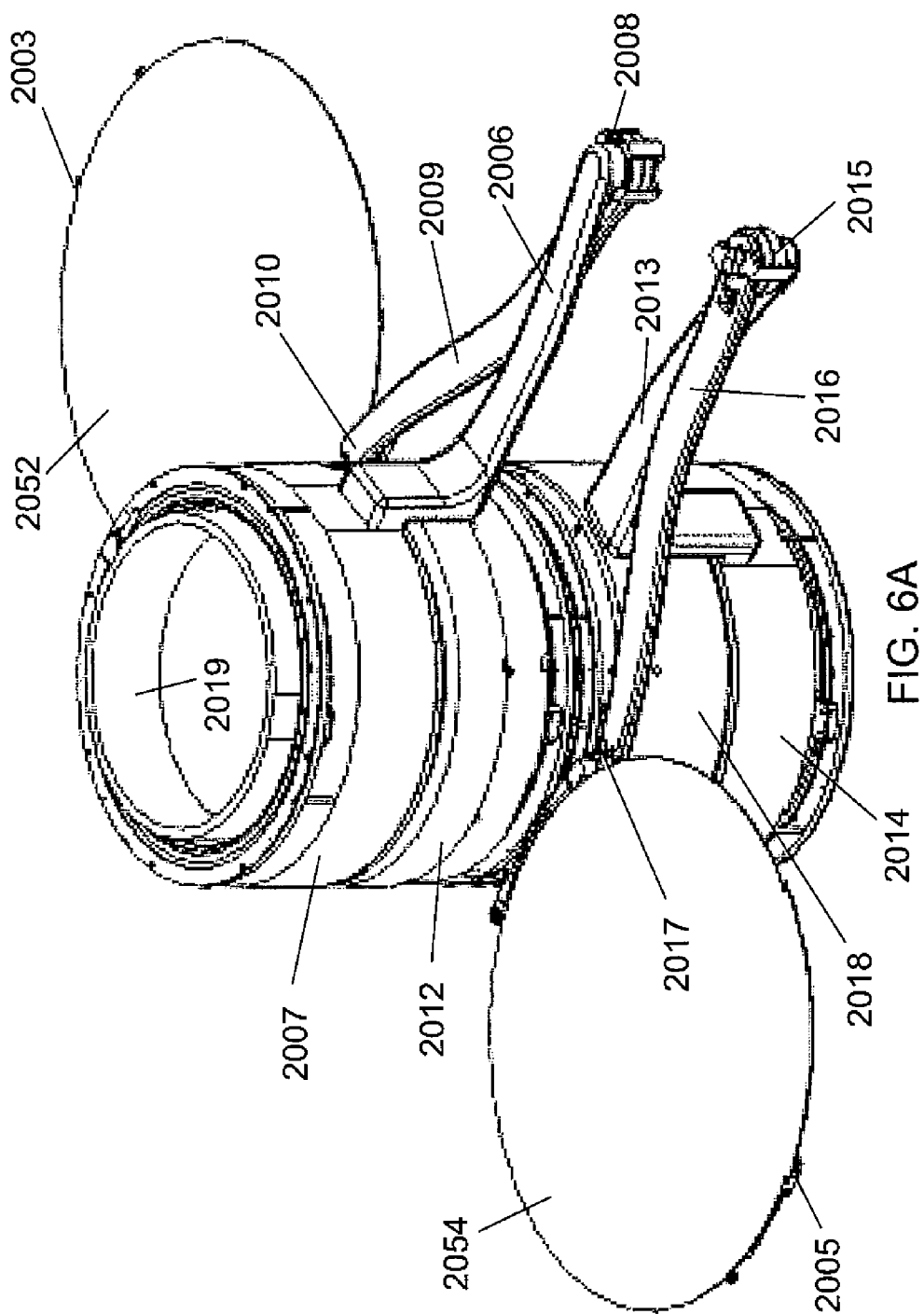
FIG. 6A is an isometric view of a dual wafer robot configured in accordance with an embodiment of the present invention and showing two end effectors (each carrying a single wafer) oriented 180° azimuthally opposed to one another around the robot's rotational axis, where both end effectors are fully retracted.

FIG. 6A is an isometric view of a dual wafer robot configured in accordance with one embodiment of the present invention, showing two wafers 2052 and 2054 oriented 180° azimuthally around the robot's rotational axis. Both end effectors 2003 and 2005 are shown fully retracted. This is the configuration in which the end effectors 2003 and 2005 may rotate.

Figure 6C:
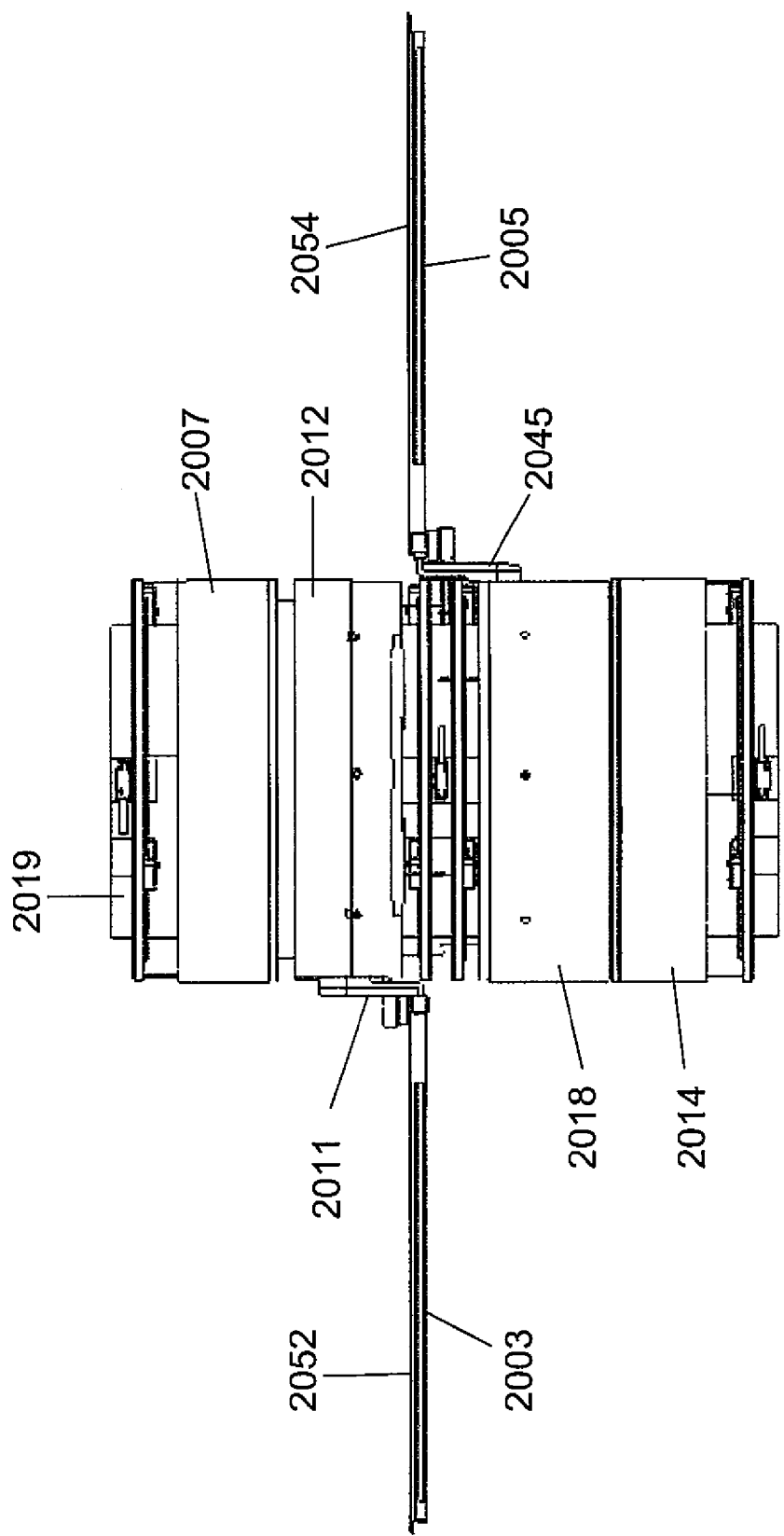
FIG. 6C is a side view of the dual wafer robot shown in FIGS. 6A-B.

FIG. 6B is a top view and FIG. 6C is a side view of the dual wafer robot illustrated in FIG. 6A. Note that in this configuration, wafers 2052 and 2054 are at the same height, unlike the situation depicted in FIGS. 4A-5B. This change in height of the wafers, compared with the above/below configuration shown in FIGS. 4A-5B, is controlled by the cam mechanism discussed with reference to FIG. 20, below.

Figure 7:
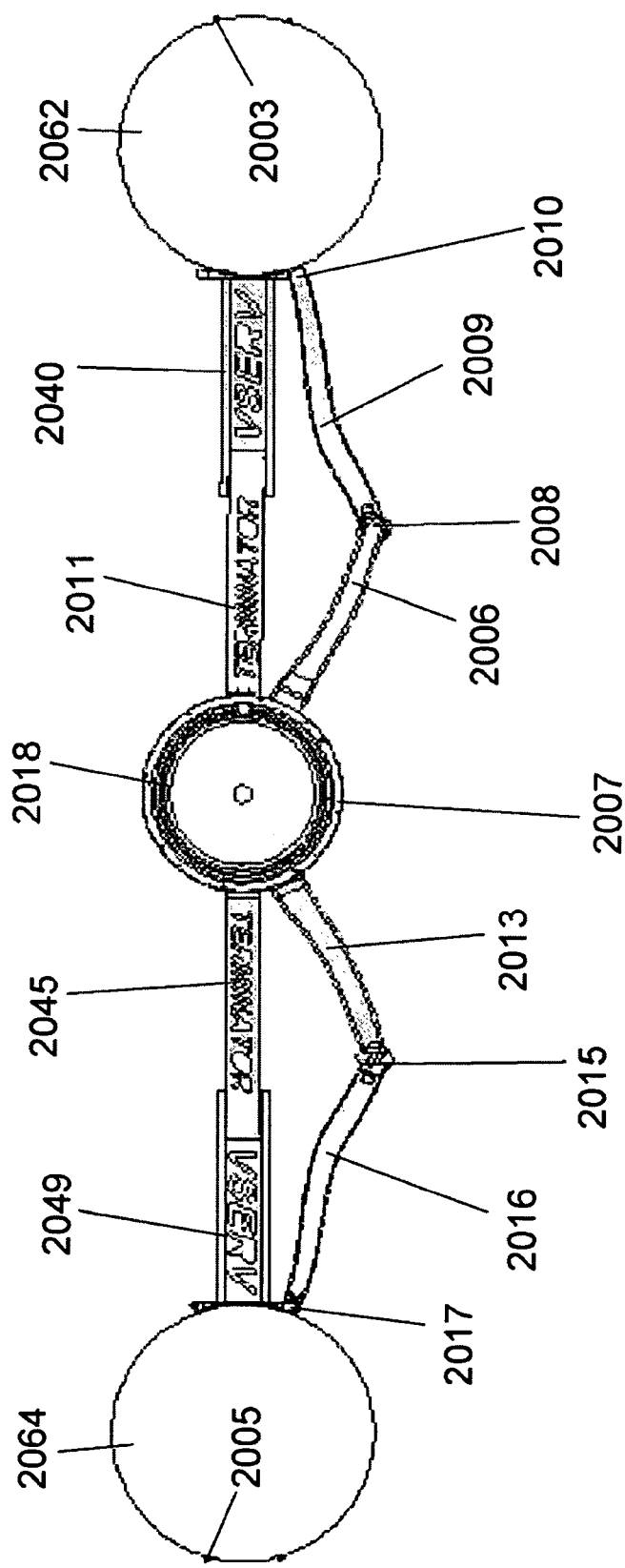
FIG. 7 is a top view of a dual wafer robot configured in accordance with an embodiment of the present invention and showing two end effectors (each carrying a single wafer) oriented 180° azimuthally opposed to one another around the robot's rotational axis, where both end effectors are fully extended for loading/unloading a wafer into/out of each of two process modules.

FIG. 7 is a top view of a dual wafer robot configured in accordance with an embodiment of the present invention, showing two wafers 2062 and 2064 oriented 180° azimuthally with respect to one another around the robot's rotational axis. Here, both end effectors 2003 and 2005 are fully extended for simultaneously (or nearly simultaneously) loading a wafer into each of two process modules (not shown).

The slider mechanism for end effector 2005, which includes support arm 2020, slider 2049 and end effector 2005, can be seen in this view.

Independent Asynchronous Operation of the End Effectors

FIGS. 8-11 illustrate the independent operation of the two end effectors 2003 and 2005 of the dual wafer robot, which, as described above, is important for maximizing wafer processing system throughput.

Figure 8:
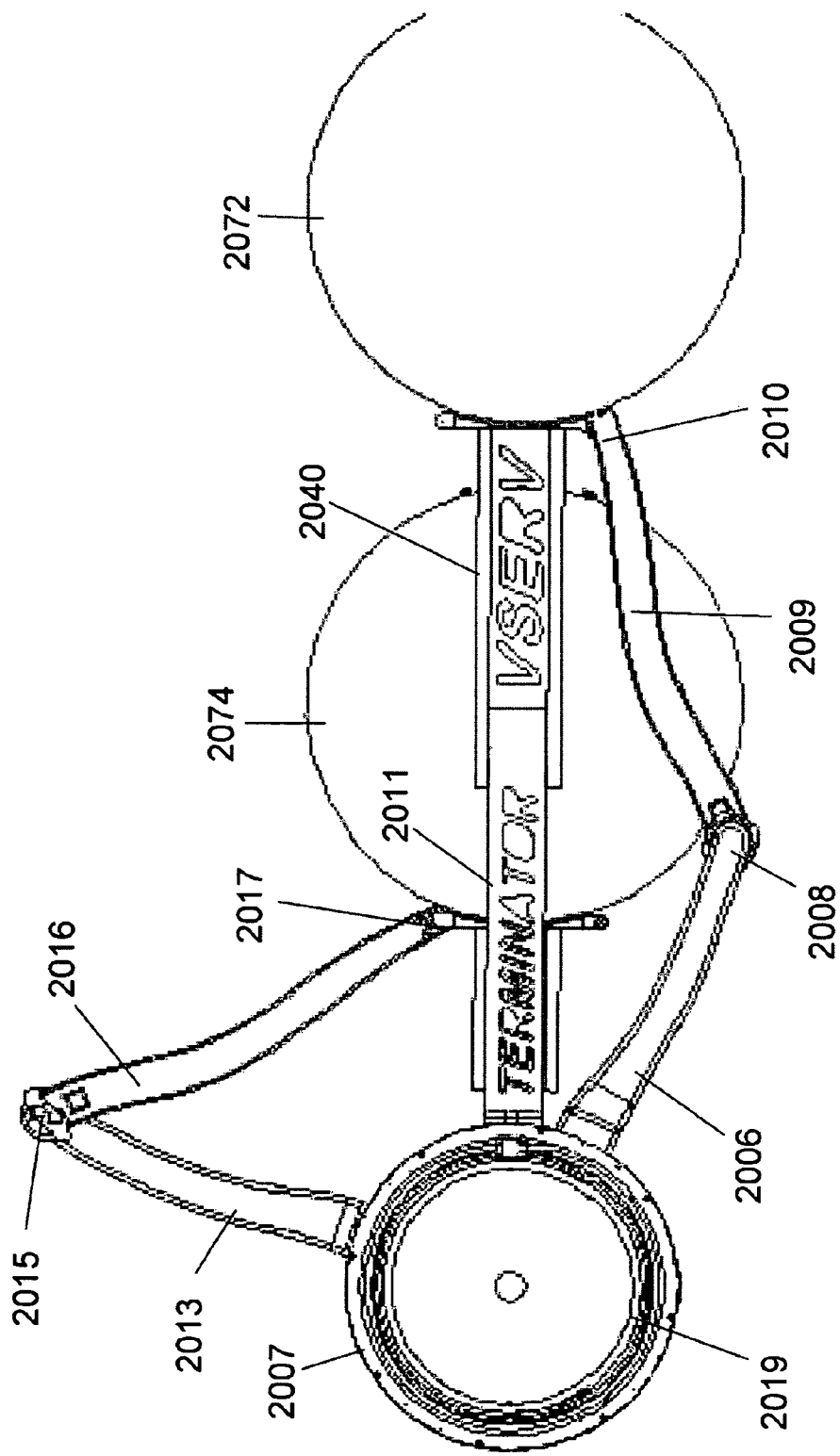
FIG. 8 is a top view of a dual wafer robot configured in accordance with an embodiment of the present invention and showing two end effectors (each carrying a single wafer) in an above and below arrangement, where the upper end effector is fully extended, and the lower end effector is partially extended, illustrating independent (asynchronous) operation of the two end effectors.

FIG. 8 is a top view of a dual wafer robot configured in accordance with one embodiment of the present invention, showing two wafers 2072 and 2074 in an above and below arrangement, where the upper end effector 2003 (carrying wafer 2072) is fully extended, and the lower end effector 2005 (carrying wafer 2074) is partially extended, illustrating the independent operation of end effectors 2003 and 2005 when the end effectors 2003 and 2005 are in an above and below arrangement.

Figure 9:
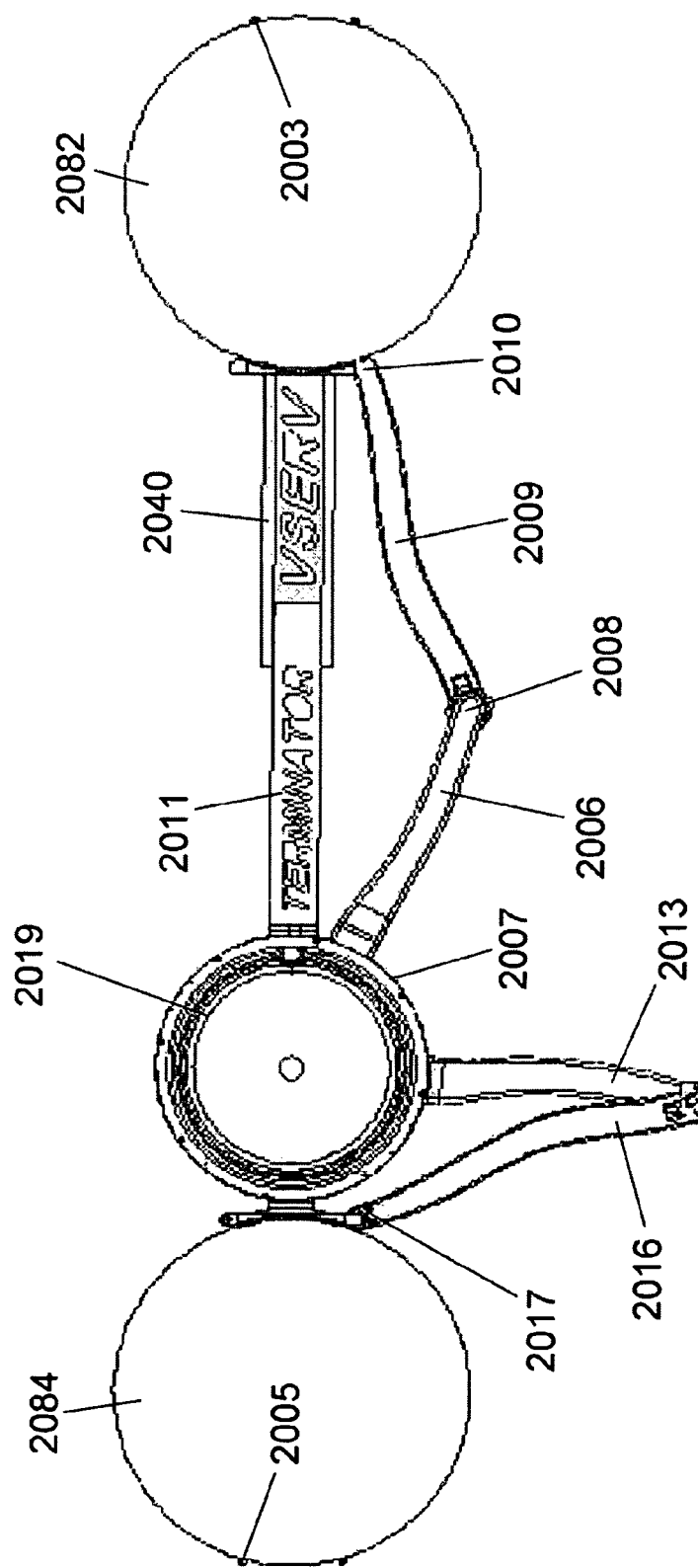
FIG. 9 is a top view of a dual wafer robot configured in accordance with an embodiment of the present invention and showing two end effectors (each carrying a single wafer) oriented 180° azimuthally opposed to one another around the robot's rotational axis, where the upper end effector is fully extended and the lower end effector is fully retracted, illustrating independent (asynchronous) operation of the two end effectors.

FIG. 9 is a top view of a dual wafer robot configured in accordance with one embodiment of the present invention, showing two wafers 2082 and 2084 oriented 180° azimuthally with respect to one another around the robot's rotational axis, where the upper end effector 2003 (carrying wafer 2082) is fully extended, and the lower end effector 2005 (carrying wafer 2084) is fully retracted, illustrating the independent operation of end effectors 2003 and 2005 when the end effectors 2003 and 2005 are on opposite sides of the robot rotational axis.

Figure 10:
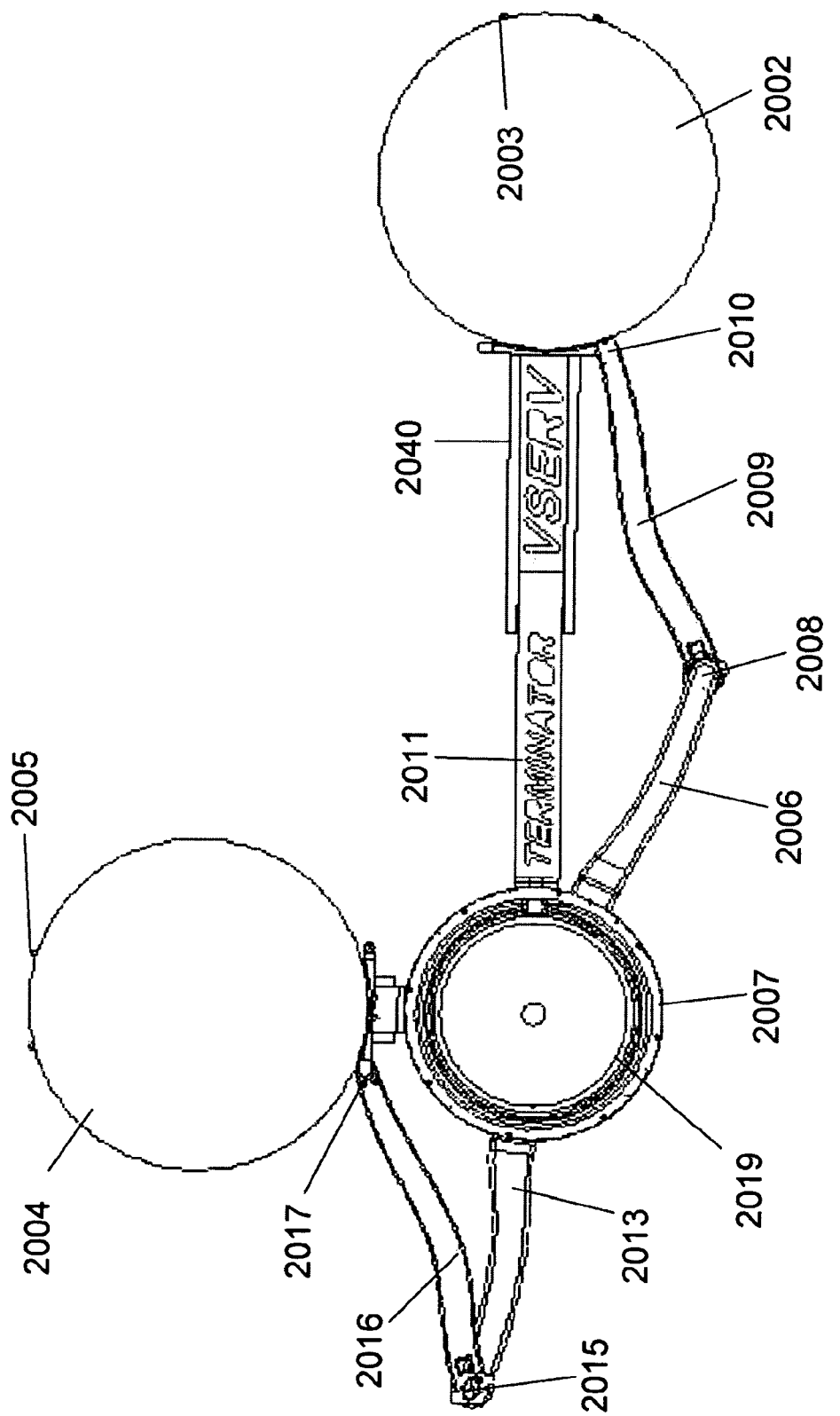
FIG. 10 is a top view of a dual wafer robot configured in accordance with an embodiment of the present invention and showing two end effectors (each carrying a single wafer) oriented 90° azimuthally around the robot's rotational axis with respect to one another, where the upper end effector is fully extended, and the lower end effector is fully retracted, illustrating independent operation of the two end effectors.

FIG. 10 is a top view of a dual wafer robot configured in accordance with one embodiment of the present invention, showing two wafers 2002 and 2004 oriented 90° azimuthally with respect to one another around the robot's rotational axis, where the upper end effector 2003 (carrying wafer 2002) is fully extended, and the lower end effector 2005 (earning wafer 2004) is fully retracted, illustrating the Independent operation of end effectors 2003 and 2005 with respect to both extension and angular position.

Figure 11:
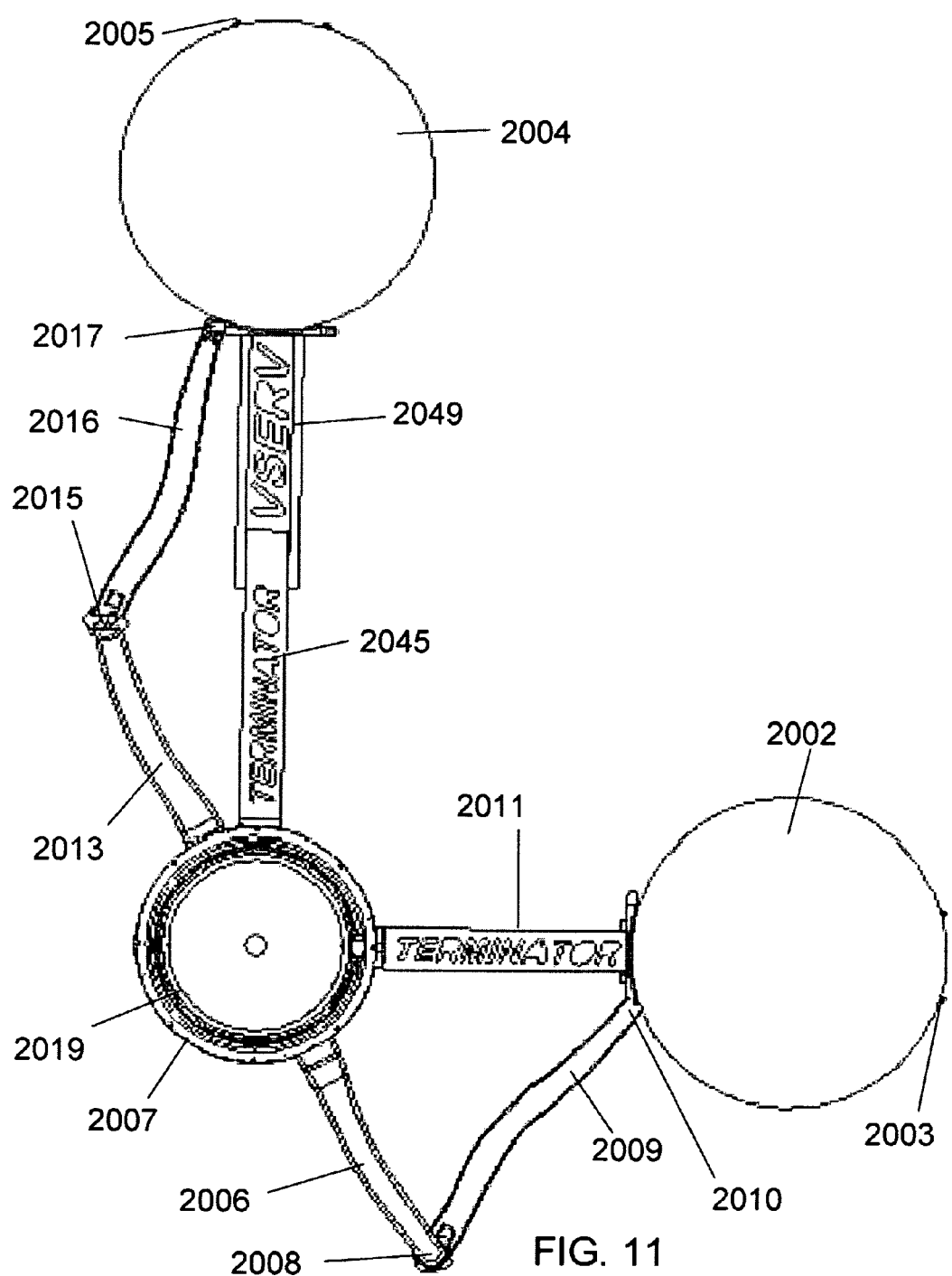
FIG. 11 is a top view of a dual wafer robot configured in accordance with an embodiment of the present invention and showing two end effectors (each carrying a single wafer) oriented 90° azimuthally around the robot's rotational axis with respect to one another, where the upper end effector is partially extended, and the lower end effector is fully extended, illustrating independent operation of the two end effectors.

FIG. 11 is a top view of a dual wafer robot configured in accordance with one embodiment of the present invention, showing two wafers 2002 and 2004 oriented 90° azimuthally with respect to one another around the robot's rotational axis, where the upper end effector 2003 (carrying wafer 2002) is partially extended, and the lower end effector 2005 (carrying wafer 2004) is fully extended, illustrating the independent operation of end effectors 2003 and 2005 with respect to both extension and angular position.

Operation of the End Effector Actuator

Figure 12:
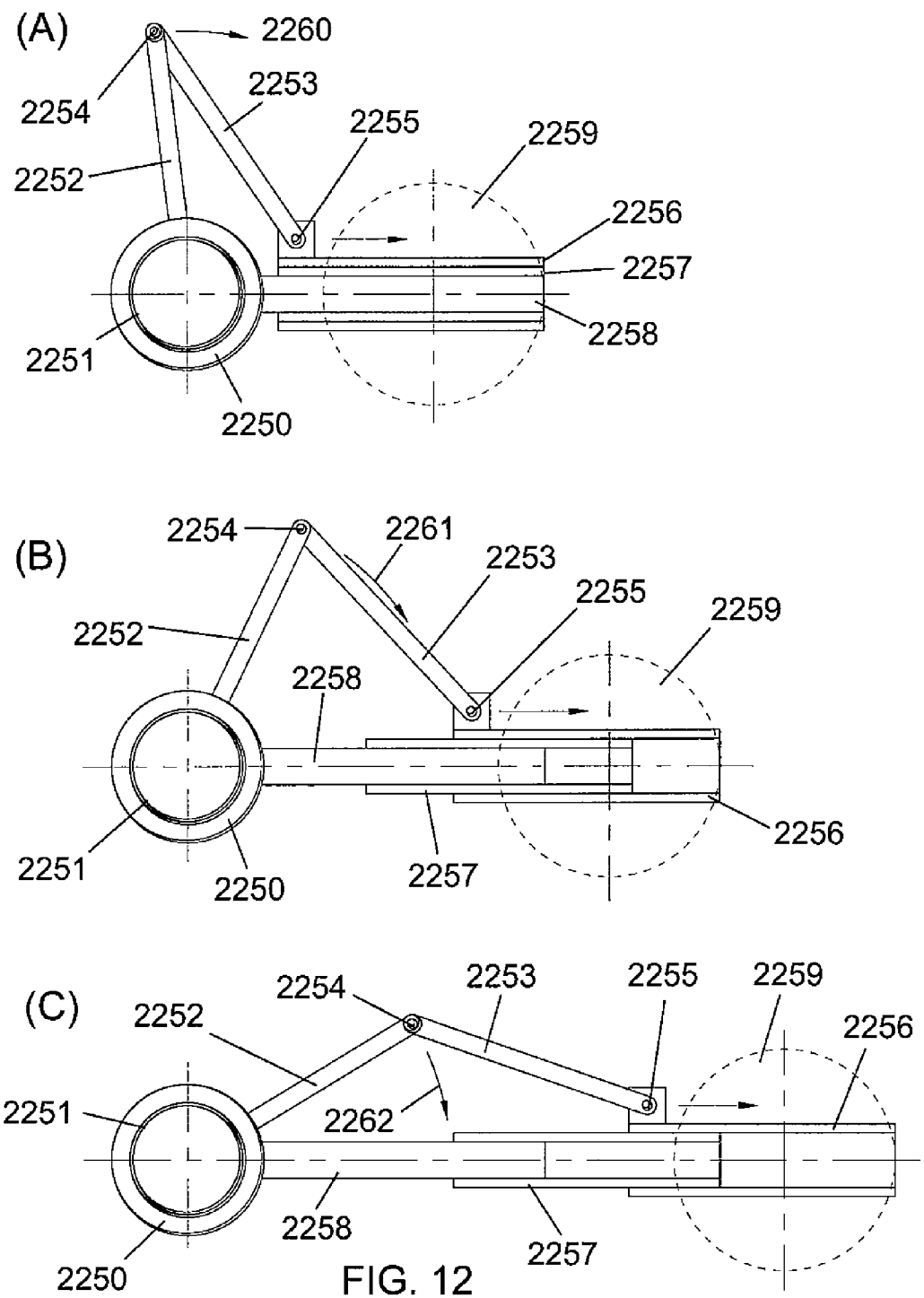
FIG. 12 is a schematic top view of a single robot end effector actuator assembly configured in accordance with an embodiment of the present invention and showing the end effector in three positions: (A) fully retracted, (B) partially extended, and (C) fully extended.

FIG. 12 is a schematic top view of a single robot end effector actuator assembly configured in accordance with one embodiment of the present invention, showing the end effector in three positions: (A) fully retracted, (B) partially extended, and (C) fully extended.

In view (A), end effector 2256, carrying wafer 2259 (shown in dotted outline so as to reveal the details of the end effector and related components), is fully retracted into the position for rotation of the end effector 2256 and wafer 2259. End effector 2256 is attached to slider 2257 by a linear bearing (not shown). Slider 2257 is likewise attached to support arm 2258 by a separate linear bearing (not shown). Linear bearings are familiar to those skilled in the art of actuator mechanisms and so will not be described in detail herein. Actuator arm 2252 is attached to rotor 2250 and further coupled to outer arm 2253 through pivot 2254. Outer arm 2253 is connected to end effector 2256 through pivot 2255. Rotor 2250 turns around central tube 2251. Actuator arm 2252 is starting to turn clockwise as shown by arrow 2260, causing end effector 2256 to begin extending as shown by the arrow on wafer 2259.

In view (B), end effector 2256, carrying wafer 2259, is shown partially extended. Actuator arm 2252 has rotated clockwise (arrow 2261), driving outer arm 2253 to push end effector 2256 radially outwards. During the extension operation, the rotor (not shown) connected to support arm 2258 does not turn.

In view (C), end effector 2256 is fully extended, positioning wafer 2259 in either a process module or a pass-through module (not shown). Arrow 2262 shows the last increment of rotation of actuator arm 2252, giving the last increment of motion to end effector 2256 as shown by the arrow on wafer 2259.

Figure 13:
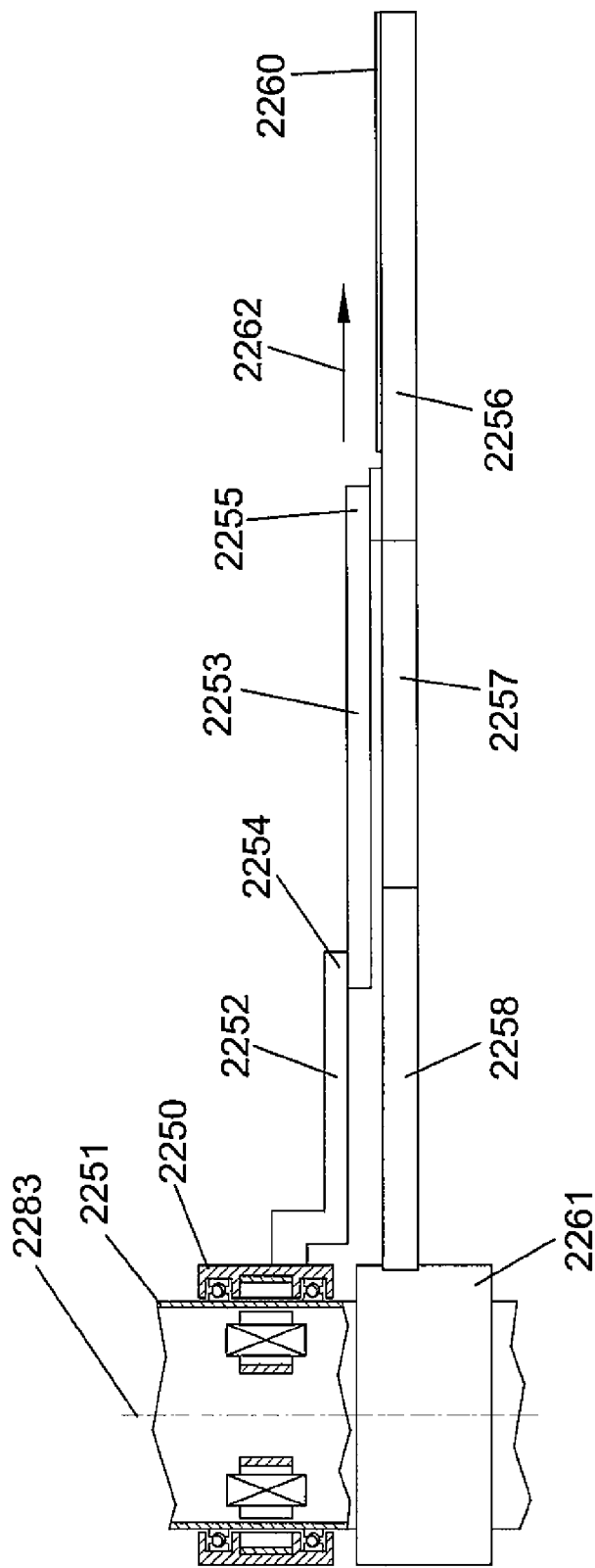
FIG. 13 is a side view of a single robot end effector actuator configured in accordance with an embodiment of the present invention and showing the end effector fully extended, with a cutaway view of an actuator motor.

FIG. 13 is a side view of the single robot end effector actuator shown in FIG. 12 view (C), showing the end effector 2256 (carrying wafer 2259) fully extended. A cutaway view of an actuator motor is also provided (see FIG. 14 for details of the motor). The rotational axis 2283 for rotors 2250 and 2261 is shown.

Operation of the Integrated Rotor Drive Motors and the Robot Control System

Figure 14:
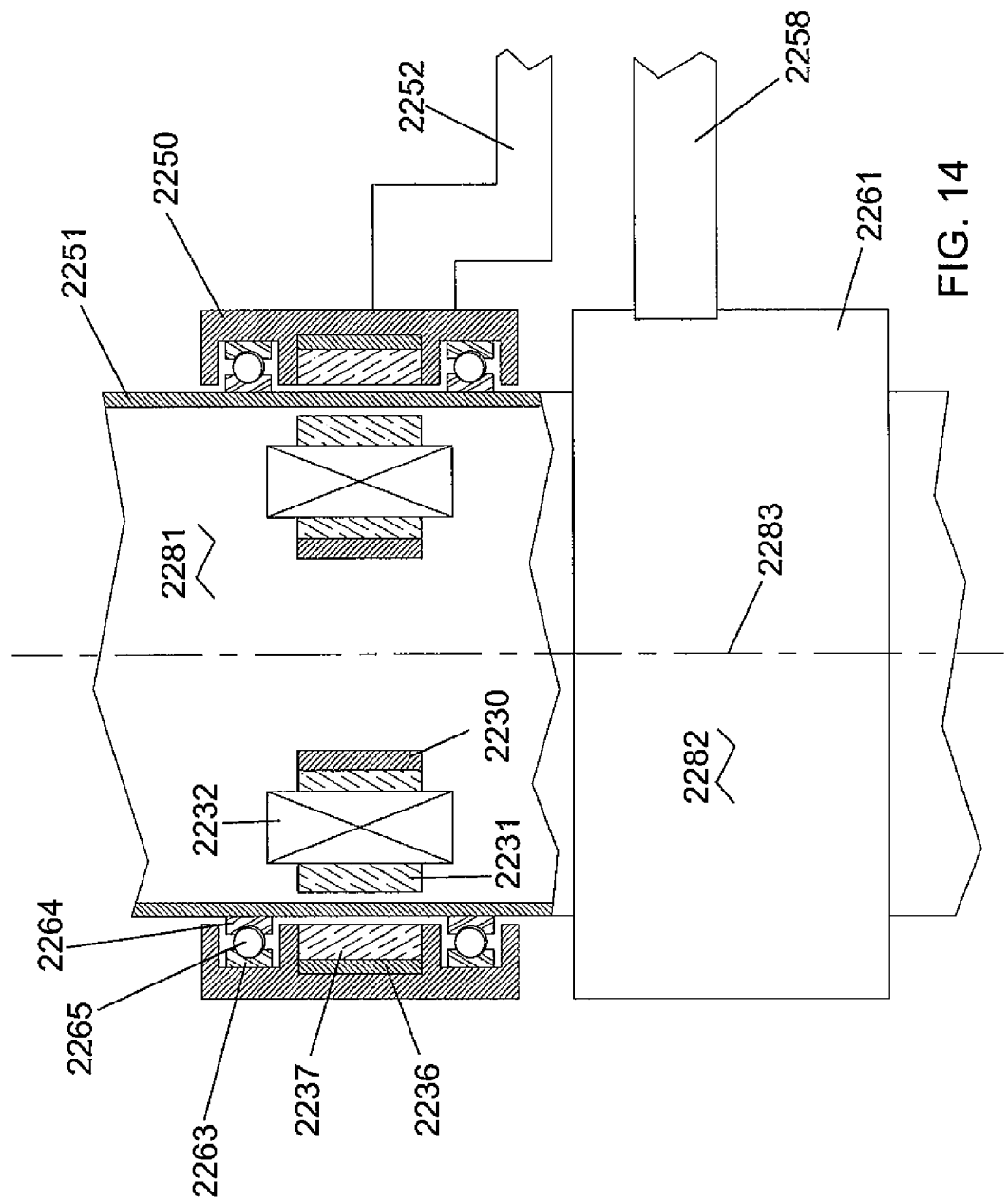
FIG. 14 is a side view in partial cutaway of a single robot end effector actuator in accordance with one embodiment showing an actuator motor.

FIG. 14 is a side view in partial cutaway of a single robot end effector actuator configured in accordance with one embodiment of the present invention, showing a motor assembly 2281 that includes a stator assembly, a rotor assembly, and an azimuthal (angular) position encoder. The stator assembly for the brushless/frameless motor consists of coils 2232, pole pieces 2231, and inner flux return ring 2230. The stator assembly is rigidly supported by center tube 2330 (see FIG. 15, discussed below, which illustrates further details of the motor assembly).

The rotor assembly includes the moving permanent magnet assembly for the motor: permanent magnets 2237 and outer flux return ring 2236, rotating around central axis 2283. Rotor 2250 is positioned on the outer circumference of central tube 2251 by bearings including outer race 2263, inner race 2264, and balls 2265. The particular example of bearings shown here is for illustrative purposes only. The same positioning function for rotor 2251 may be implemented using one or more sets of three rollers each, positioned at approximately equal spacings around the rotor circumference, and configured to roll around the outer wall of central tube 2251, or, alternatively, around on a track mounted to the outer wall of central tube 2251.

Actuator arm 2252 is moved by rotor assembly 2250, and support arm 2258 is moved by rotor assembly 2261, which is actuated by a brushless/frameless motor assembly 2282 (details not shown) equivalent to the motor assembly driving rotor 2281. An encoder ring 2340 is attached to rotor 2250 (and rotating with rotor 2250), and encoder read head 2341 is rigidly attached to vacuum wall 2251 and thus does not rotate. The mounting and operation of optical encoders are familiar to those skilled in the art.

Figure 15:
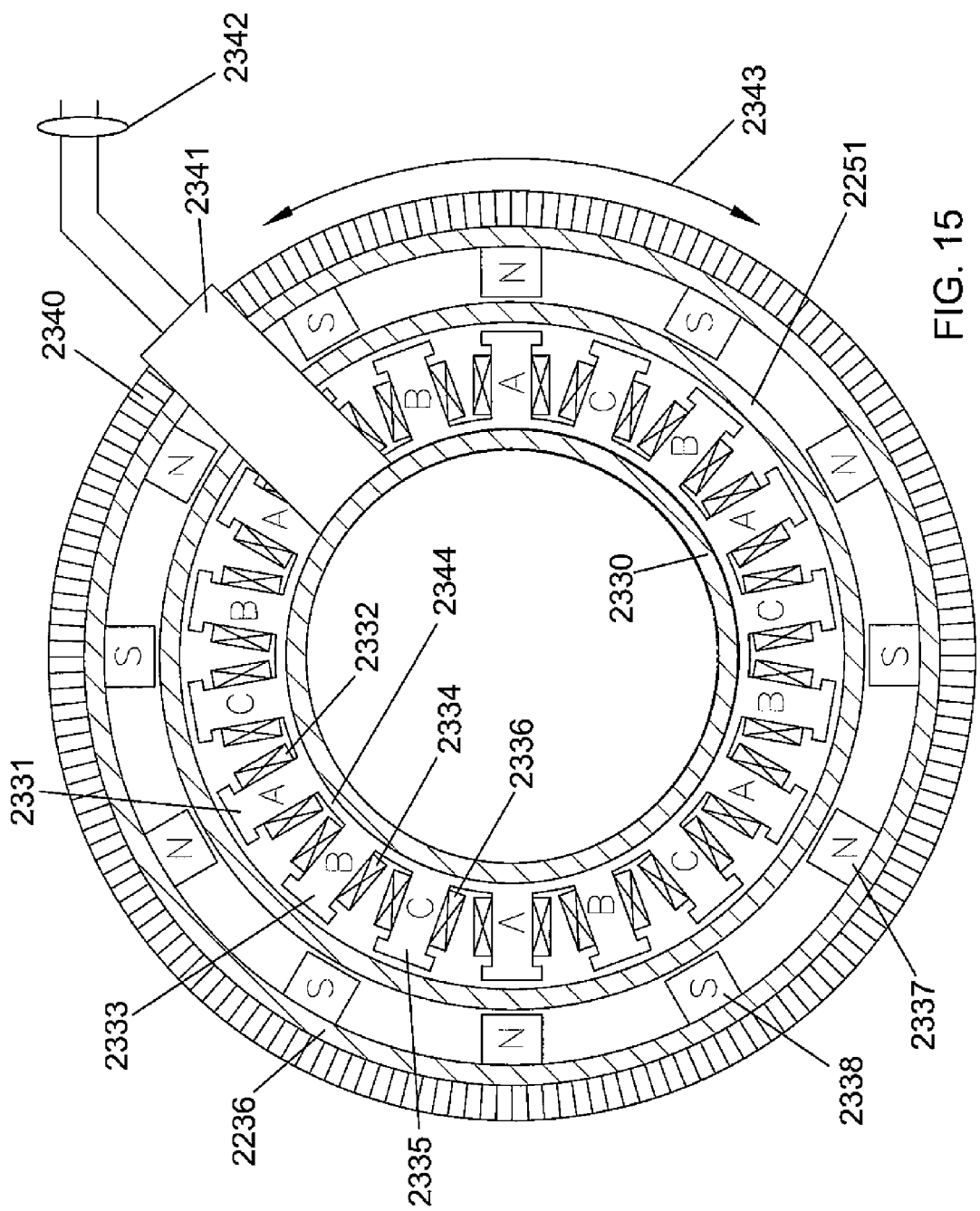
FIG. 15 is a schematic top view of an actuator motor and angular position encoder configured in accordance with an embodiment of the present invention.

FIG. 15 is a schematic top view of a motor assembly including a stator assembly, a rotor assembly, and an azimuthal (angular) position encoder in accordance with one embodiment of the present invention. The stator assembly includes a large number of electromagnetic pole pieces 2331, 2333, and 2235, energized by three separate circuits, A, B, and C, respectively. Circuit A energizes pole pieces 2331 by means of coils 2332. Circuit B energizes pole pieces 2333 by means of coils 2334. Circuit C energizes pole pieces 2235 (see also FIG. 14) by means of coils 2336 (equivalent to coil 2232 in FIG. 14). Generally, the phases of circuits A-C are separated by 120° to induce rotation of the rotor assembly.

Permanent magnets 2337 in the rotor assembly are oriented with their North poles directed inwards, towards the stator. Permanent magnets 2338 are mounted with the opposite (South) orientation. Magnets 2337 and 2338 are equivalent to magnet 2237 in FIG. 14. As pole pieces 2331, 2333, and 2235 are energized by circuits A-C, respectively, permanent magnets 2337 and 2338 feel an azimuthal force (torque), thereby inducing rotation of the entire rotor assembly around the central axis of the assembly (2283 in FIG. 14).

The azimuthal position of the rotor is determined using an optical encoder, that includes read head 2341 (rigidly attached to vacuum wall 2251, see FIG. 14, and coupled with electrical connections 2342) and encoder ring 2340 (attached to rotor 2250). The rotation of the rotor assembly is illustrated by bi-directional arrow 2343. Note that with this motor design, a separate air-to-vacuum coupler is unnecessary, since the stator-to-rotor coupling through the vacuum wall 2251 provides the air-to-vacuum coupling function.

Figure 16:
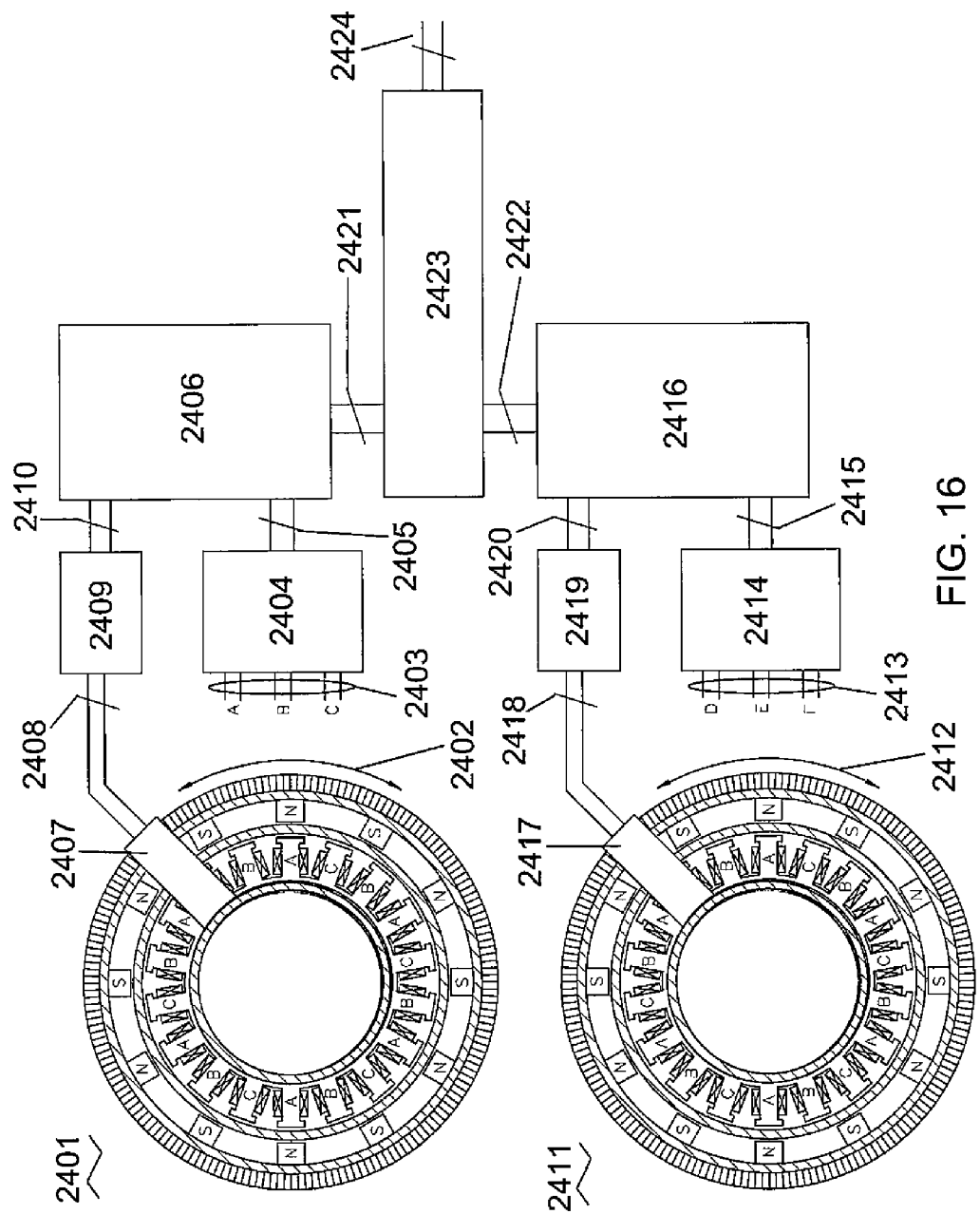
FIG. 16 is a schematic of a control system for a single robot configured in accordance with an embodiment of the present invention.

FIG. 16 is a schematic illustration of a control system for a single robot configured in accordance with one embodiment of the present invention. Each of the two end effectors in a dual wafer robot requires two motor assemblies, each as shown in FIGS. 15-16: one motor assembly 2401 for the support arm, and another motor assembly 2411 for the actuator arm. The signal from encoder read head 2407 (measuring the angular position of the rotor in motor assembly 2401) is passed via cable 2408 to encoder controller 2409. Note, in other embodiments other forms of communicative coupling may be used, such as wireless communications from the read head 2407 to the encoder controller 2409. Similarly, the signal from encoder read head 2417 (measuring the angular position of the rotor in motor assembly 2411) is passed via cable 2418 to encoder controller 2419.

Motor driver 2404 generates three signals, A-B-C, to drive the electromagnets in the stator of motor assembly 2401. Motor driver 2414 generates three signals, D-E-F (equivalent to A-B-C), to drive the electromagnets in the stator of motor assembly 2411. Control lines 2405 and 2410 connect to motor assembly control 2406. Control lines 2415 and 2420 connect to motor assembly control 2416. Motor assembly controls 2406 and 2416 are connected to end effector control 2423 through lines 2421 and 2422, respectively. End effector control 2423 is connected to the transfer chamber controller (which may, for example, be a programmable controller but is not shown in this illustration) through line 2424. Rotation of the rotor in motor assembly 2401 is illustrated by bi-directional arrow 2402 and rotation of the rotor in motor assembly 2411 is illustrated by bi-directional arrow 2412.

Figure 17:
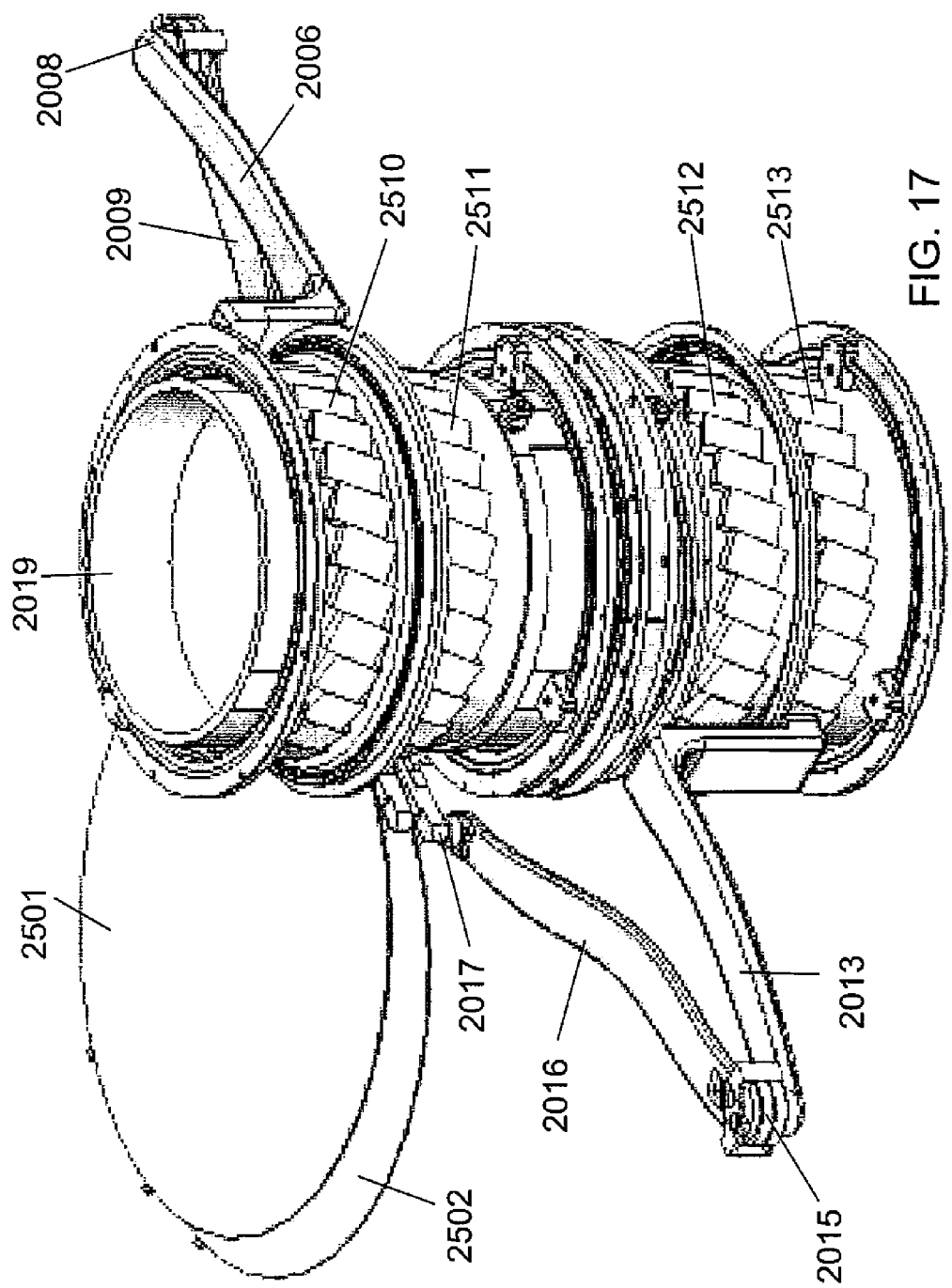
FIG. 17 is an isometric cutaway view of a dual wafer robot configured in accordance with an embodiment of the present invention.

FIG. 17 is an isometric cutaway view of a dual wafer robot configured in accordance with one embodiment of the present invention. FIG. 4A is a similar view of the dual wafer robot, not in cutaway, for comparison. In FIG. 17, rotors 2007, 2012, 2018, and 2014 (see FIG. 4A) are cutaway to reveal permanent magnets 2510-2513 (equivalent to permanent magnets 2337-2338 in FIG. 15), respectively. Note that the permanent magnets 2510-2513 are shown skewed in orientation—this skewing smoothes out the torque transfer between the stator and the motor rotor during rotation. Alternatively, a non-skewed arrangement of the magnets with skewed magnetizations may be used. Skewing of magnets in motors to reduce "cogging" is familiar to those skilled in the art and so will not be described further herein.

Figure 18:
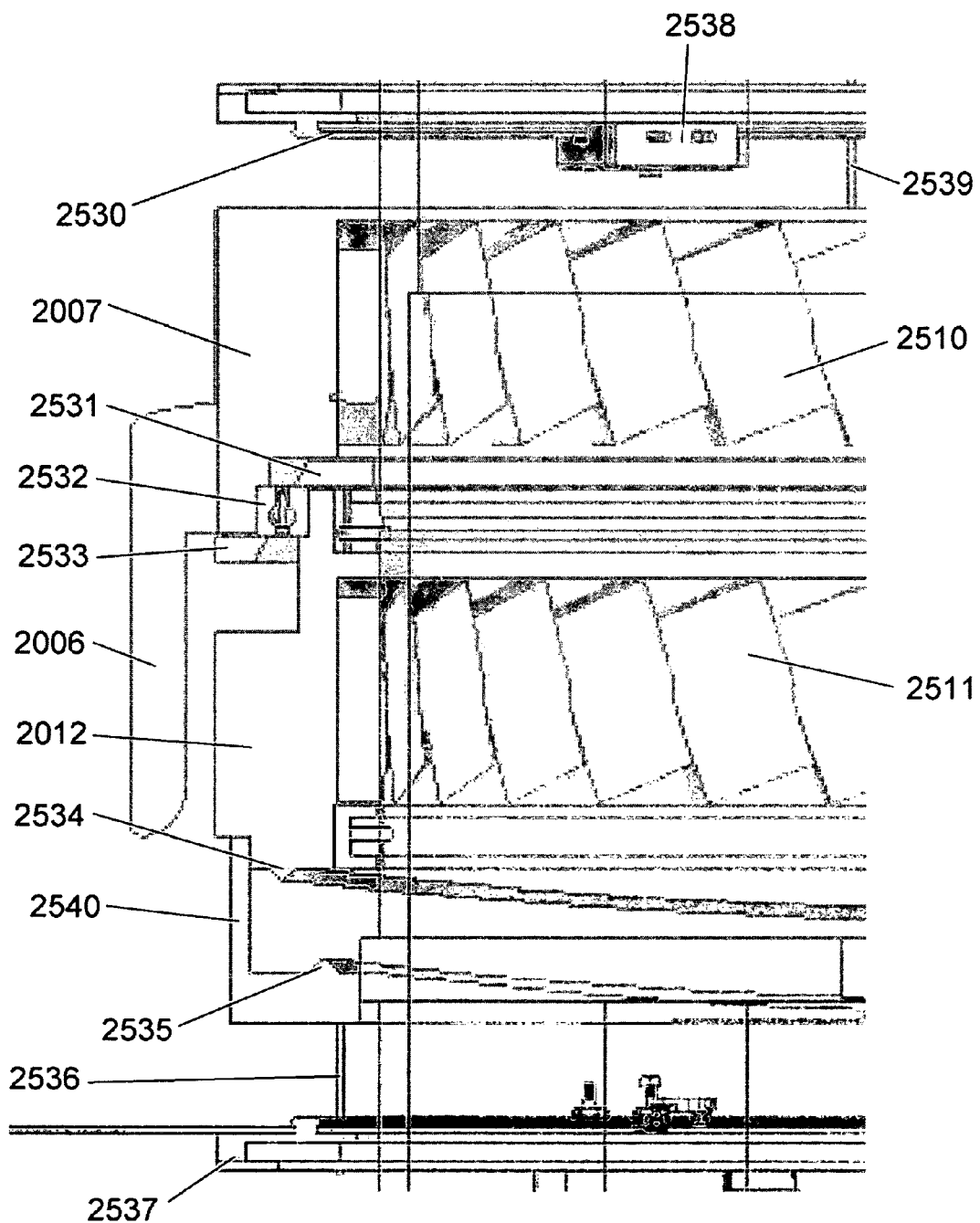
FIG. 18 is a cutaway side view of a single robot actuator configured in accordance with an embodiment of the present invention.

FIG. 18 is a cutaway side view of a single robot actuator configured in accordance with one embodiment of the present invention. A dual rotor assembly includes rotors 2007 and 2012 locked together along the vertical axis (Z-axis) by a bearing assembly that includes roller bearing 2532, upper clamp 2531, and lower clamp 2533. The bearing assembly leaves rotors 2007 and 2012 free to rotate relative to each other in accordance with the requirements for extension of the end effector described above.

Figure 19:
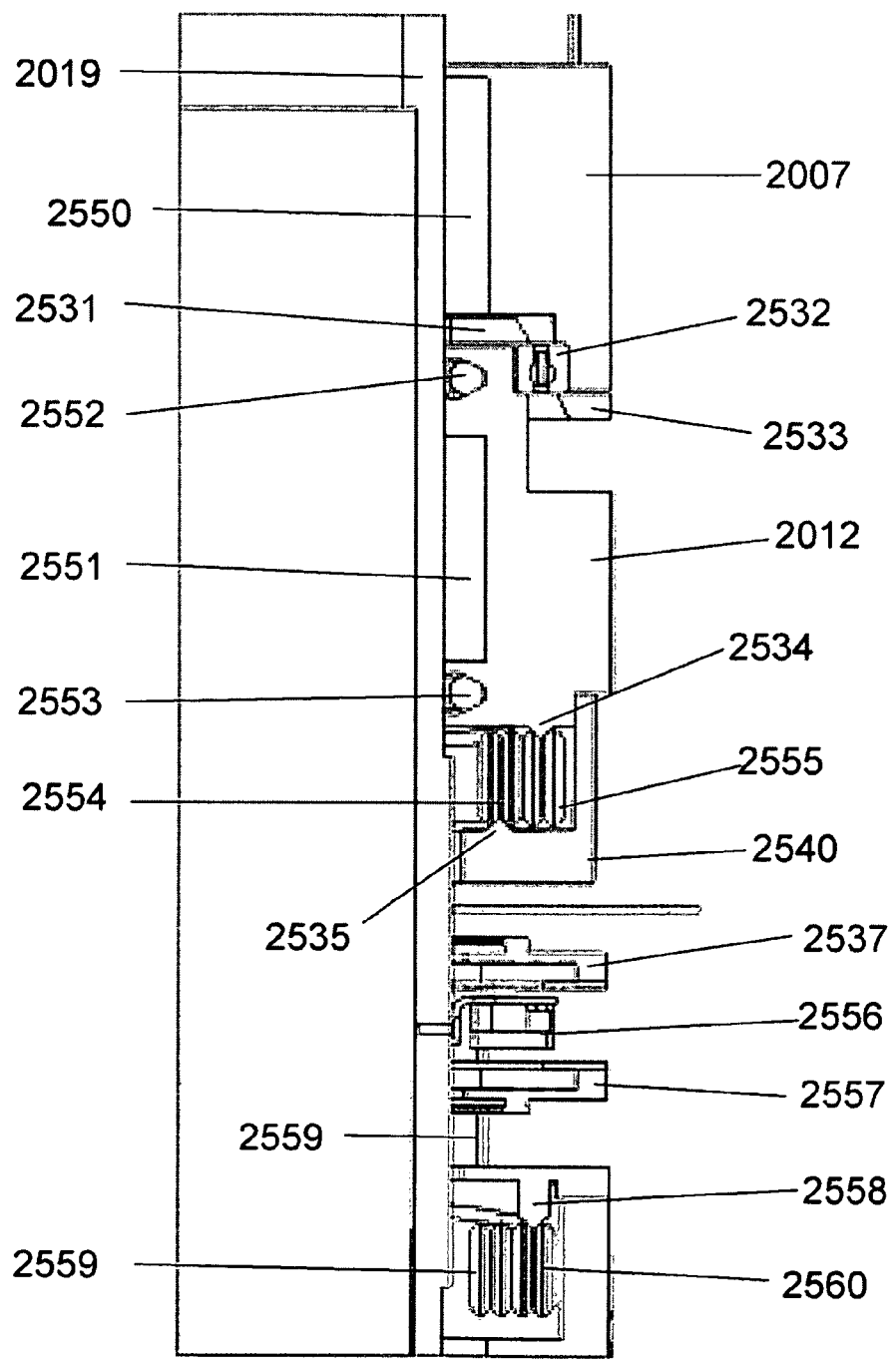
FIG. 19 is a schematic side cross-section of a single robot actuator configured in accordance with an embodiment of the present invention.
Figure 20:
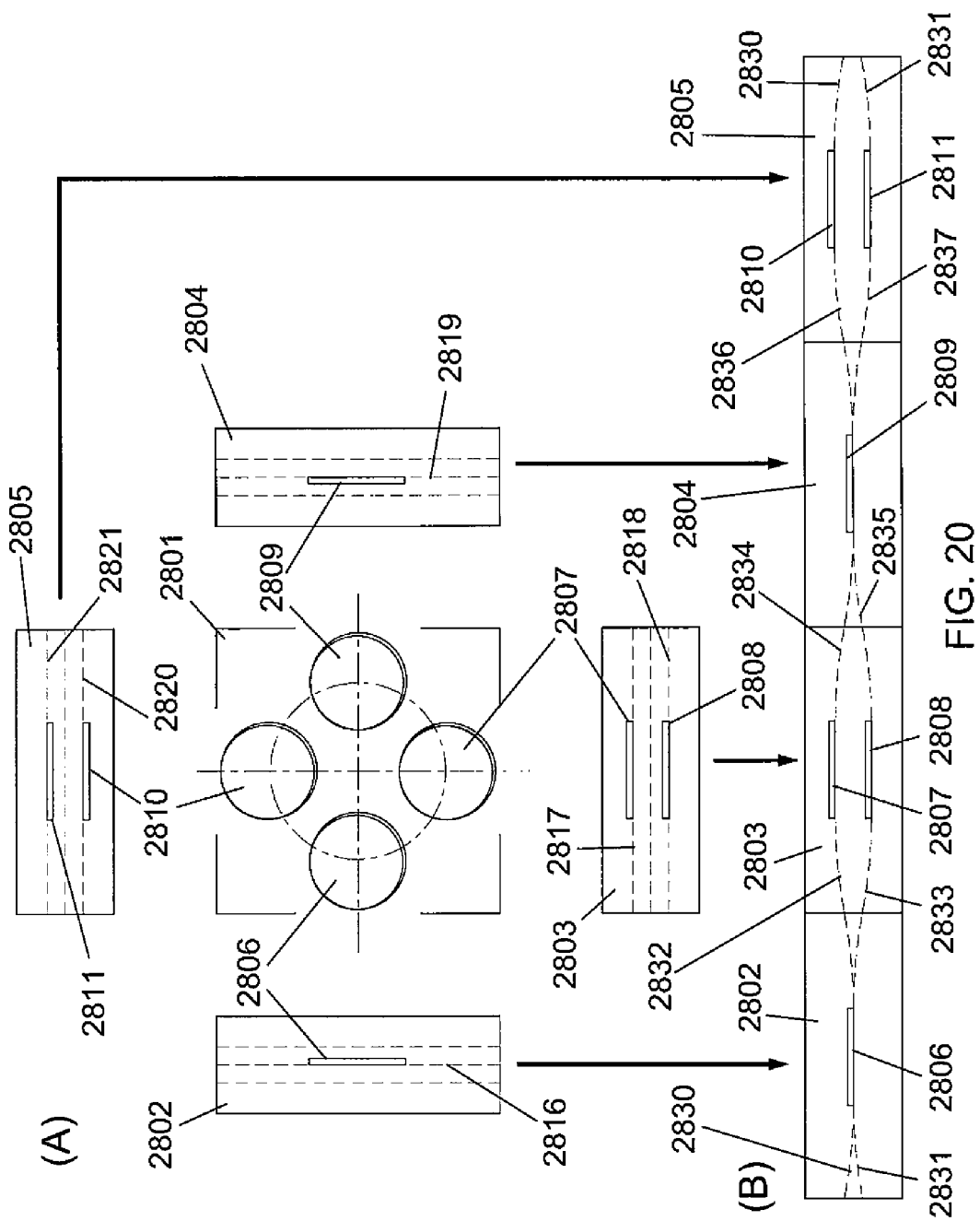
FIG. 20 is a schematic illustration of the operation of two height-controlling cams, one for each of the end effectors, in a dual wafer robot configured in accordance with an embodiment of the present invention.

The Z-axis position of the dual rotor assembly is controlled by the cam 2535, as illustrated in more detail in FIGS. 19-20. Encoder ring 2530 is maintained at a constant height, independent of the Z-axis motion of rotor 2007. Pin 2539 allows rotor 2007 to remain azimuthally locked to encoder ring 2530 while rotor 2007 moves up and down following the profiles of cam 2535. Rollers 2554 and 2555 (see FIG. 19) cause rotors 2007 and 2012 to move up and down together during rotation, following the profile of cams 2535 and 2534. It is necessary for the encoder ring 2530 to remain at a constant height while rotor 2007 turns (thereby causing rotor 2007 to move up and down) in order to maintain the required close spacing to encoder read head 2538 which is fixed to the tube 2251 (see FIG. 15).

Similarly, pin 2536 allows rotor 2012 to remain azimuthally locked to encoder ring 2537 while rotor 2012 moves up and down (vertically locked to rotor 2007) following the profile of cam 2535. Magnets 2510 and 2511 (equivalent to magnets 2337 and 2338 in FIG. 15) are skewed in order to smooth the torque coupling (i.e., to reduce "cogging") to the rotating magnetic field induced by the stator pole pieces (see 2231, 2331, and 2333 in FIG. 15) as is familiar to those skilled in the art of brushless/frameless motor design. Cam 2535 is mounted on support 2540.

Cam-Driven Independent Z-Motions of the End Effectors

FIG. 19 is a schematic side cross-section of a single robot actuator configured in accordance with one embodiment of the present invention. Upper roller 2554 runs on the top surface of cam 2535, while lower roller 2555 rotates against the bottom surface of cam 2534. Lower roller 2554 is rigidly mounted to the wall 2019 of the central tube and thus defines the position of both rotors 2007 and 2012 in the vertical direction since cam 2535 is rigidly attached to rotor 2012 (through support 2540), and rotor 2007 is vertically locked to rotor 2012 by ring bearing 2532. Upper roller 2554 is spring-loaded down against the top surface of cam 2535, ensuring that lower roller 2555 stays in contact with the bottom surface of cam 2534, and thus that, rotors 2007 and 2012 do not move upwards due to vibration or other vertical forces.

FIG. 20 is a schematic illustration of the operation of two height-controlling cams, one for each of the end effectors in the dual wafer robot, in accordance with one embodiment of the present invention. In view (A), transfer chamber 2801 is shown, surrounded by four folded-out side views at azimuthal angles of 0°, 90°, 180°, and 270°, around the perimeter of transfer chamber 2801. At 0° (at the left), a wafer 2806 is shown at the proper height 2816 for Insertion into process module 2802. At 90° (at the bottom), two wafers 2807 and 2808 are shown at the proper heights 2817 and 2818, respectively, for insertion into pass-through module 2803. At 180° (at the right), a wafer 2809 is shown at the proper height 2819 for Insertion into process module 2804. At 270° (at the top), two wafers 2810 and 2811 are shown at the proper heights 2820 and 2821, respectively, for insertion into pass-through module 2805.

View (B) of FIG. 20 is a folded-out composite view around the perimeter of transfer chamber 2801 at azimuthal angles 0°, 90°, 180°, and 270°, illustrating the up and down motion of the two end effectors as they rotate from facing process modules (such as 2802 and 2804) to facing pass-through modules (such as 2803 and 2805) and back again. As an example, wafer 2807, starting from the upper position 2817 in pass-through module 2803, moves down 2832 about 6 mm as the end effector (not shown—see, for example, end effector 2003 in FIG. 4A) carrying wafer 2807 rotates to face process module 2802 (shown as wafer 2806) at height 2816. Wafer 2808, starting from the lower position 2818 in pass-through module 2803, moves up 2835 about 6 mm as the end effector (not shown—see, for example, end effector 2005 in FIG. 4A) carrying wafer 2808 rotates to face process module 2804 (shown as wafer 2809) at height 2819. Note that these end effector (and wafer) motions in opposite directions may occur simultaneously or asynchronously, as required for optimal system throughput described above. Trajectories 2830-2837 enable wafers to be inserted into process chambers which are all at the same height (e.g., 1100 mm from floor level), while being loaded above and below into pass-through modules (e.g., with a vertical spacing of 12 mm).

Collective Wafer Z-Motion

Figure 21:
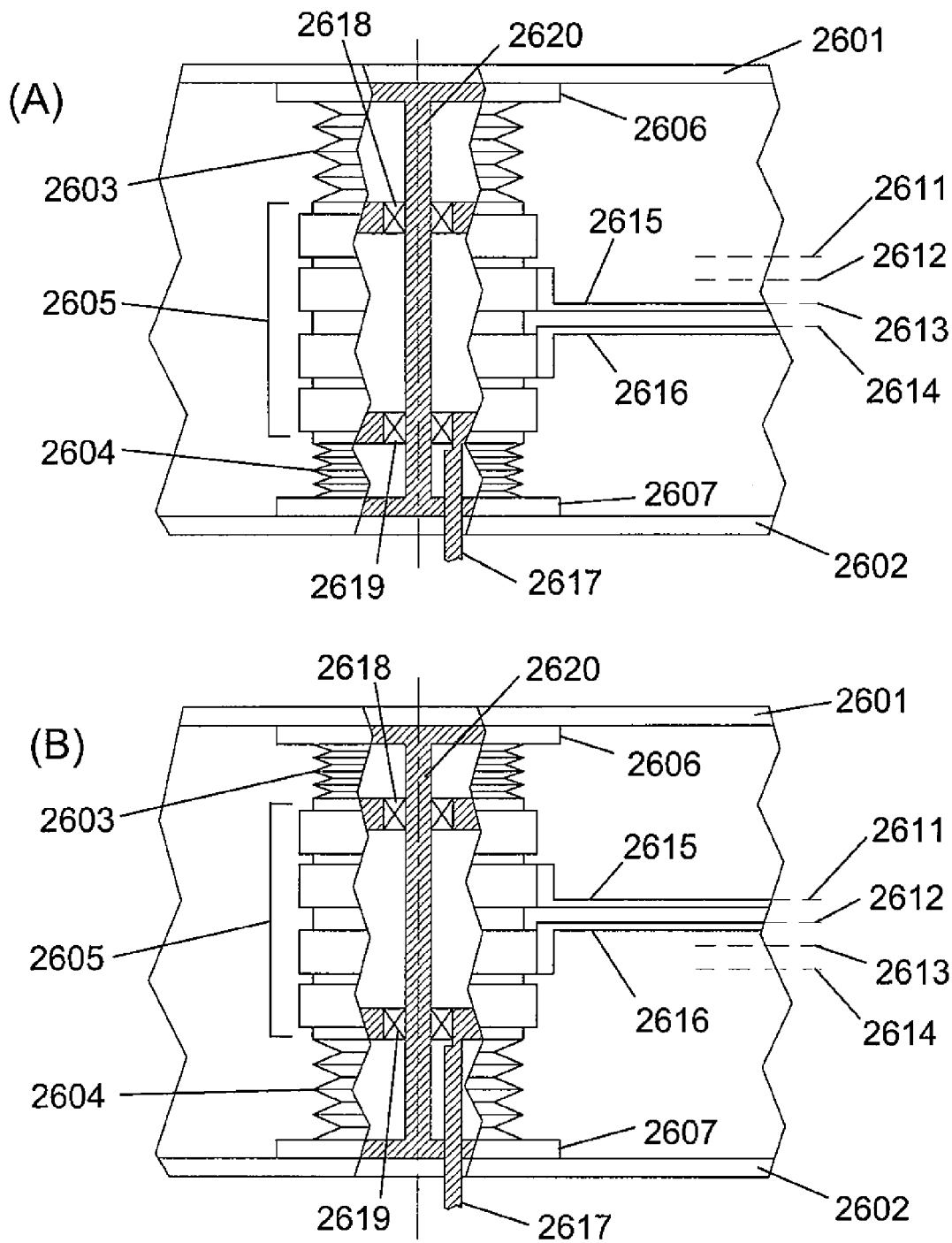
FIG. 21 is a schematic view of the operation of a collective Z-motion actuator configured in accordance with an embodiment of the present invention.

FIG. 21 is a schematic view of the operation of the collective Z-motion actuator, in accordance with one embodiment of the present invention. View (A) shows the dual wafer robot 2605 in the lower position, enabling end effectors 2615 and 2616 to load/unload wafers from slots 2613 and 2614, respectively, in a pass-through module (not shown). The dual wafer robot 2605 slides on two bearings 2618 and 2619 on a central rigid shaft 2620. Note that only vertical sliding (not rotary) motion of the robot 2605 is allowed—rotary motion of end effectors 2615 and 2616 is accomplished through the methods described above.

The vacuum seal for the transfer chamber includes lid 2601, bottom 2602, upper flange 2606, and lower flange 2607, and is maintained during vertical (Z-axis) motion of robot 2605 by two bellows 2603 and 2604. Actuator rod 2617 pushes robot 2605 up and down along the axis precisely defined by shaft 2620.

Since the center of robot 2065, as well as the centers of bellows 2603-2604, are at air pressure, the dual bellows configuration is not affected by air pressure tending to push the robot assembly up or down. In an alternative embodiment (not shown), only the lower bellows 2604 is used, and the top of dual wafer robot 2605 is sealed off—this has the advantage of eliminating bellows 2603, at the expense of introducing a large upward force due to air pressure which must be counteracted by actuator rod 2617. Bearings 2618-2619 may be splines with recirculating ball bearings, air bearings, etc., as is familiar to those skilled in the art. An alternative embodiment may employ two or more rigid shafts such as 2620, as is familiar to those skilled in the art.

View (B) of FIG. 21 shows the dual wafer robot 2605 in the upper position, enabling end effectors 2615 and 2616 to load/unload wafers from slots 2611 and 2612, respectively, in a pass-through module (not shown).

A third, intermediate, position for dual wafer robot 2605 is possible, enabling end effectors 2615 and 2616 to load/unload wafers from slots 2612 and 2613, respectively, in a pass-through module (not shown). Although the present invention is illustrated with regard to four slots 2611-2614 in a pass-through module, it is possible for a pass-through module to employ either three, or more than four, slots—in these cases, the collective vertical motion of the dual wafer robot illustrated here would enable loading/unloading of two wafers at a time from any two neighboring slots within the pass-throughout module, as is familiar to those skilled in the art.

Five-Step Wafer Transfer Process

Figure 22:
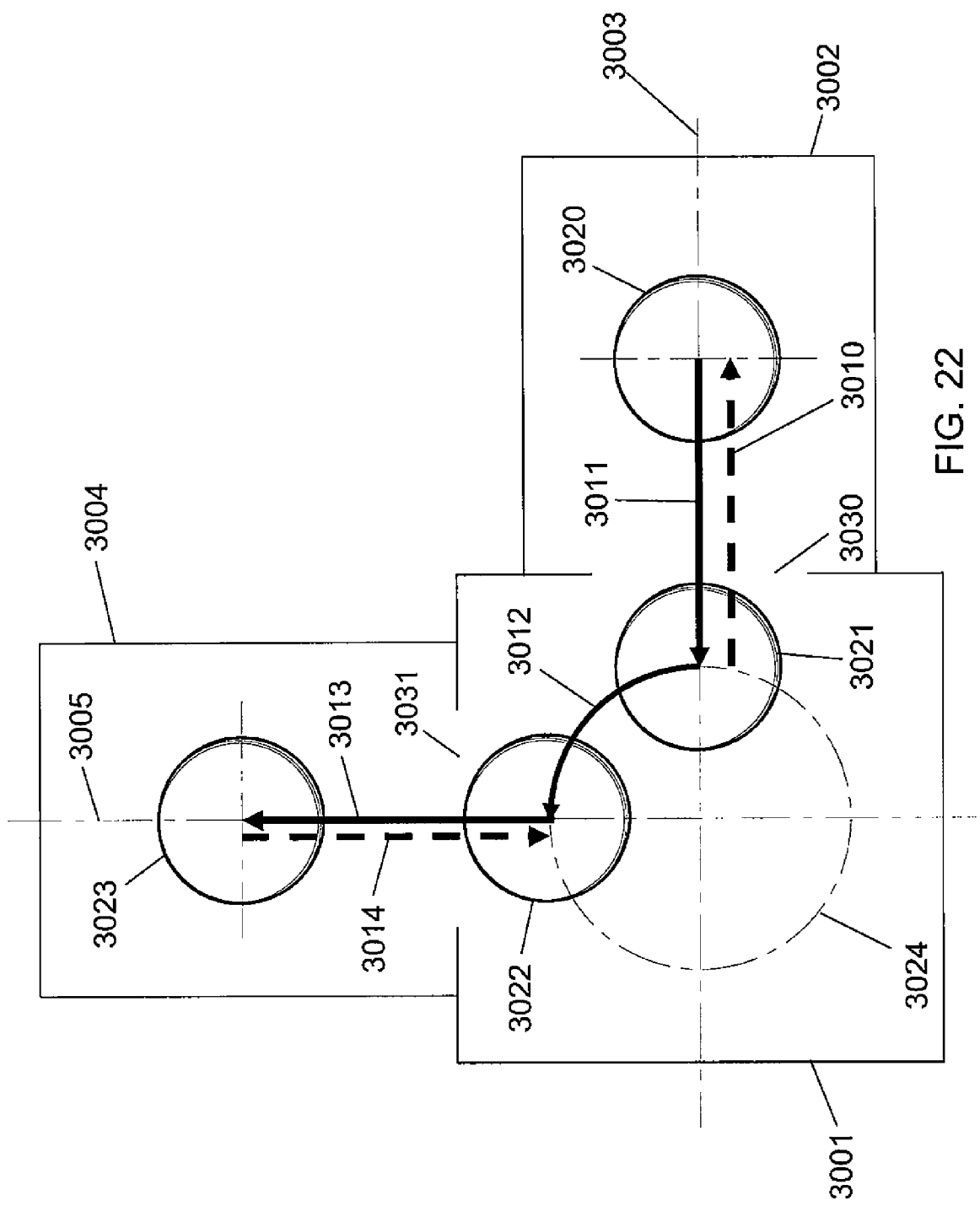
FIG. 22 is a schematic illustration of a wafer transfer process in accordance with an embodiment of the present invention.

FIG. 22 is a schematic illustration of a wafer transfer process according to one embodiment of the present invention. A transfer module 3001 is attached to a process module 3002 and a pass-through module 3004. Assume for sake of this example that a wafer at position 3020 has just completed processing in module 3002 and thus is ready for removal and subsequent transfer to pass-through module 3004. After the process gases in module 3002 have been evacuated, the valve 3030 connecting module 3002 to transfer chamber 3001 is opened and one of the two end effectors of the dual wafer robot (not shown—see, for example, end effectors 2003 and 2005 in FIG. 4A) is extended 3010 into module 3002. Typically, module 3002 will have some form of lift mechanism which allows the end effector to move in underneath a wafer in position 3020 and lift the wafer up off the lift mechanism (not shown), thereby freeing the wafer in position 3020 to be removed from module 3002—this procedure is familiar to those skilled in the art and so is not further described herein. Note that since the end effector is empty during insertion step 3010, there is no danger of a wafer slipping off the end effector, thus the end effector can be accelerated more quickly than if a wafer were being carried—the throughput calculations in FIG. 38 assume a 0.5 g acceleration (4900 mm/s$^2$) (see the farthest right point on curve 4133 in FIG. 37).

Retraction 3011 moves the wafer from position 3020 in module 3002 to position 3021 in transfer chamber 3001. Note that during retraction 3011, the end effector acceleration must be small enough to ensure that the wafer does not slip off— axis 4141 in FIG. 38 corresponds to various allowed accelerations for retraction 3011 (see curve 4133 in FIG. 37).

Rotation 3012 of the end effector moves the wafer from position 3021 to position 3022 on circle 3024. Note that during rotation 3012 there will be both azimuthal and radial (centrifugal) accelerations of the wafer. These accelerations are orthogonal and combine in quadrature to give the total wafer acceleration (see FIGS. 29-36).

Extension 3013 moves the wafer from position 3022 in transfer chamber 3001 to position 3023 in pass-through module 3004. Steps 3011-3013 must be done with an acceleration no higher than some pre-determined level, otherwise there is a risk of the wafer sliding off the end effector (see curves 4133-4137 in FIG. 37).

Finally, retraction 3014 pulls the end effector out of pass-through module 3004, allowing valve 3031 to close. As for extension 3010 above, the end effector can be moved with a higher acceleration for this step since there is no danger of wafer slippage. Axes 3003 and 3005 define the directions for steps 3010-3011 and 3013-3014, respectively. The angle between axes 3003 and 3005 may range from approximately 50° to 180°, depending on the number of process modules 3002 and pass-through modules 3004 which are attached to transfer chamber 3001, as is familiar to those skilled in the art.

Phases of End Effector Extension and Rotation

Figure 23:
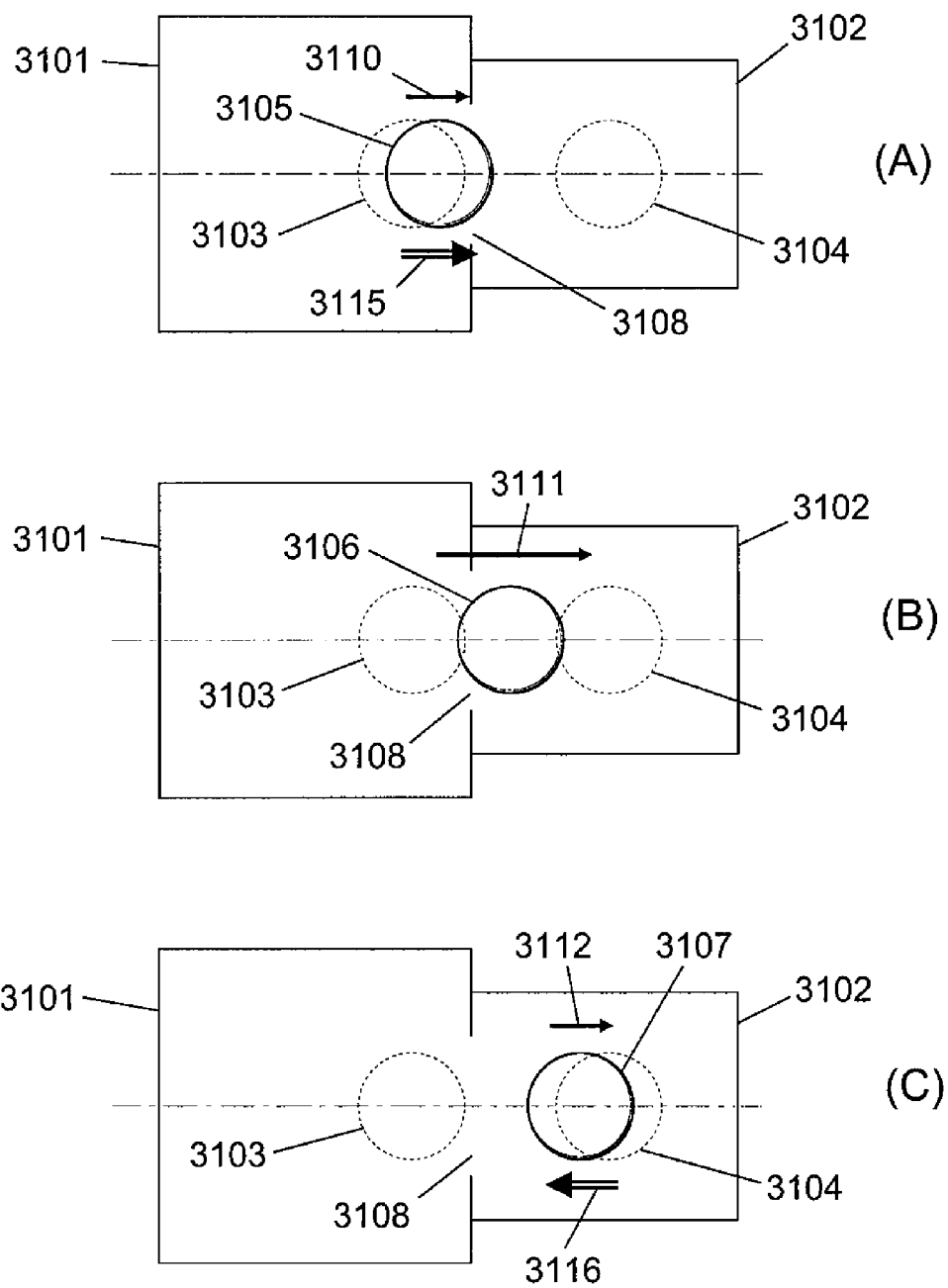
FIG. 23 is a schematic illustration of the three phases of the end effector extension process.

FIG. 23 is a schematic illustration of the three phases of the end effector extension process. Transfer chamber 3101 is shown connected to process module 3102, with a valve 3108 providing an opening for loading and unloading of wafer 3105. The wafer position when the end effector is fully retracted is shown as dashed circle 3103, and the wafer position for processing in module 3102 is shown as dashed circle 3104. Velocities are shown as single line arrows, such as 3110, while accelerations are shown as double-line arrows, such as 3115. The lengths of the velocity (3110-3112) and acceleration (3115-3116) arrows show relative magnitudes.

In view (A), the wafer being loaded into module 3102 is at position 3105, just starting to move with velocity 3110 radially outwards from initial position 3103. The wafer acceleration 3115 is in the same direction as velocity 3110 and is increasing, consistent with minimizing jerk and staying below the maximum allowed acceleration.

In view (B), the wafer being loaded into module 3102 is at position 3106, exactly halfway from position 3013 to position 3104. At this midpoint, velocity 3111 is a maximum (longer arrow), while the acceleration is 0.

In view (C), the wafer being loaded into module 3102 is at position 3107, almost all the way out to final position 3104. The velocity 3112 is lower, and the acceleration 3116 (opposite in direction to velocity 3112) is slowing the wafer down, consistent with jerk minimization.

Figure 24:
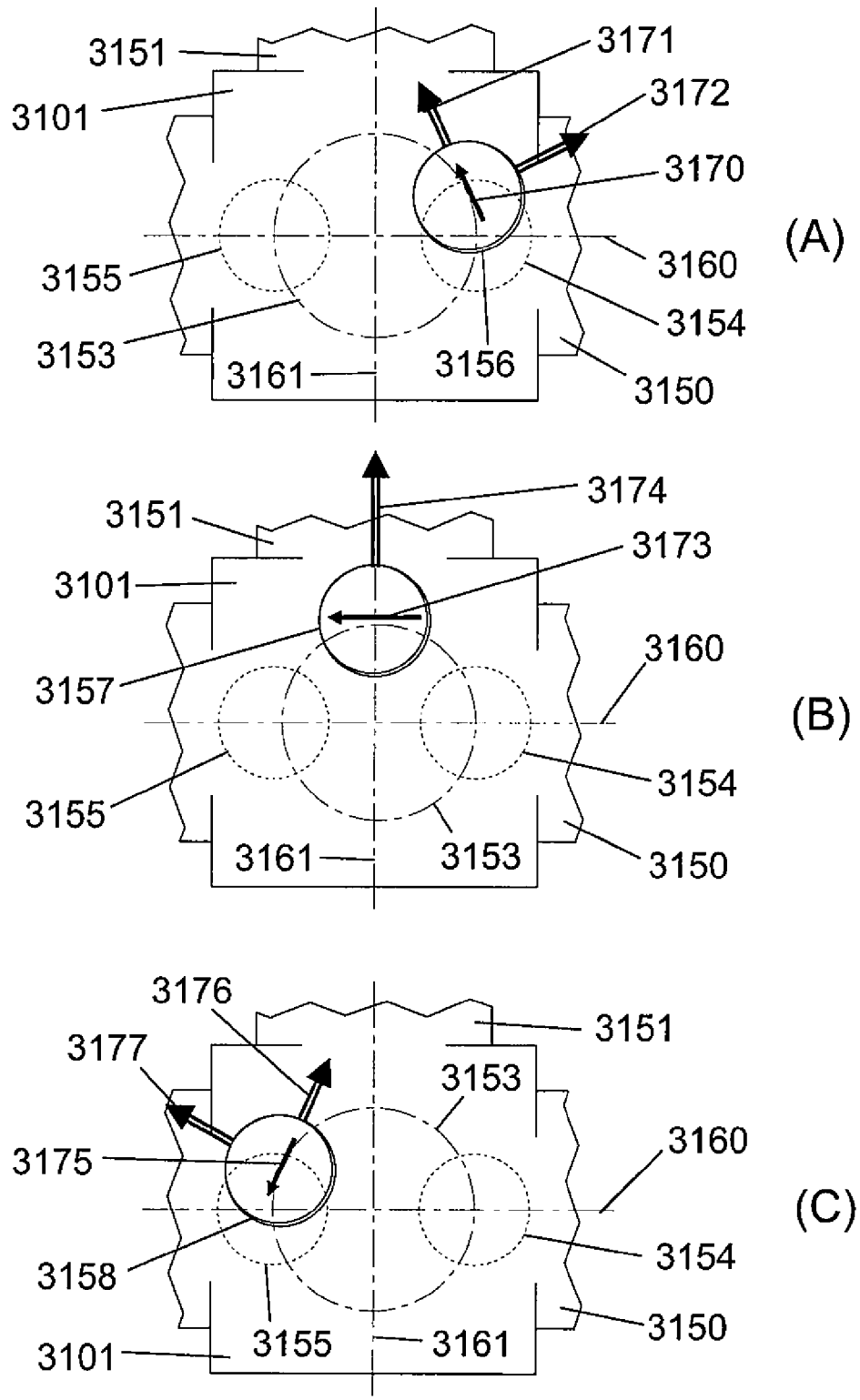
FIG. 24 is a schematic illustration of an end effector rotation process in accordance with an embodiment of the present invention.

FIG. 24 is a schematic illustration of the three phases of the end effector rotation process. Rotation is more complex with respect to jerk minimization and keeping the acceleration below a pre-determined maximum because of radial (centrifugal) acceleration, which goes as $V^2/R$, where V=the wafer azimuthal speed (measured at the outer edge of the wafer on the end effector) and R=the radius of rotation of the outer edge of the wafer on the end effector within the transfer chamber. In the example shown, the rotation is the maximum of 180°, however rotation angles ranging from approximately 50° to 180° are possible, as described in FIG. 22. Transfer chamber 3101 is shown connected to two modules 3150 and 3151. Rotation of the robot is around circle 3153, from initial position 3154 (on axis 3160) to final position 3155 (also on axis 3160). Axis 3161 shows the 90° rotation point.

In view (A) of FIG. 24, wafer 3156 has just started to rotate from initial position 3154. Azimuthal acceleration 3171 is increasing the velocity 3170, consistent with jerk minimization and keeping the total acceleration approximately below a pre-determined maximum. The radial acceleration 3172 is (velocity 3170)$^2$/(radius of circle 3153). The radial jerk is the time-derivative of the radial acceleration 3172. The total acceleration is the vector combination of the orthogonal accelerations 3171 and 3172. The total jerk function is the vector combination of the orthogonal time-derivatives of the azimuthal 3171 and radial accelerations 3172.

In view (B) of FIG. 24, the wafer is at position 3157 (along axis 3161), halfway from position 3154 to position 3155. Velocity 3173 is at a maximum and there is no azimuthal acceleration. The total acceleration is exactly equal to the radial acceleration 3174 at position 3157.

In view (C) of FIG. 24, the wafer is at position 3158, almost all the way to final position 3155 (along axis 3160). Velocity 3175 is lower than at position 3157 and the azimuthal acceleration 3176 is slowing the rotation further. Since the azimuthal velocity 3175 has decreased, so has the radial acceleration 3177=(velocity 3175)$^2$/(radius of circle 3153).

End Effector Extension Process Optimization

Figure 25:
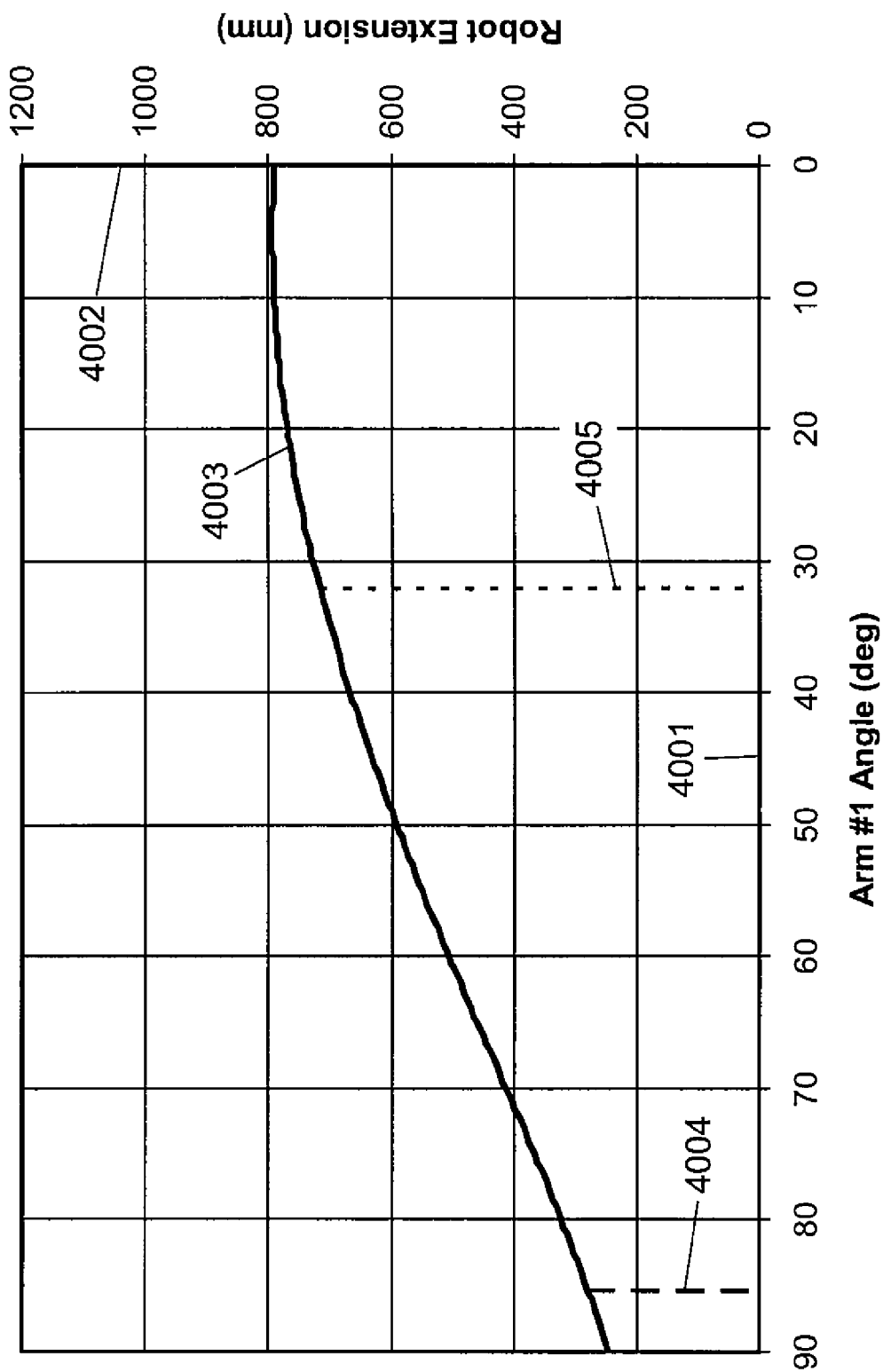
FIG. 25 is a chart plotting end effector extension distance versus the angle of an actuator arm during the process of extending the end effector from a fully retracted position to a fully extended position.

FIG. 25 is a chart of the end effector extension distance 4003 (plotted against axis 4002) versus the angle 4001 of arm #1 (the actuator arm) during the process of extension of an end effector from the fully retracted position 4004 to the fully extended position 4005. The same curve 4003 applies for both extension and retraction of the end effector.

Figure 26:
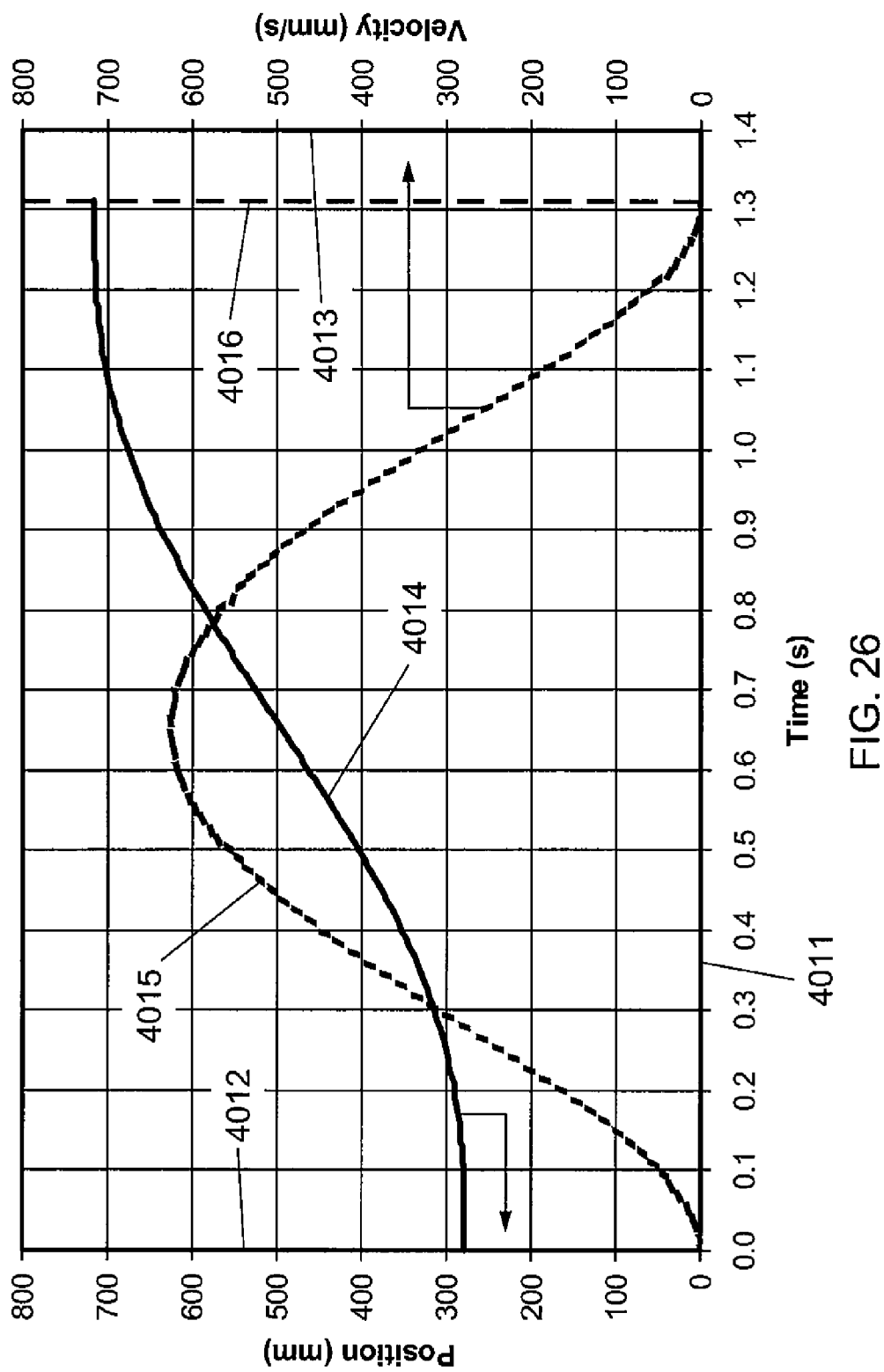
FIG. 26 is a chart plotting end effector position and velocity versus elapsed time during an end effector extension process.
Figure 27:
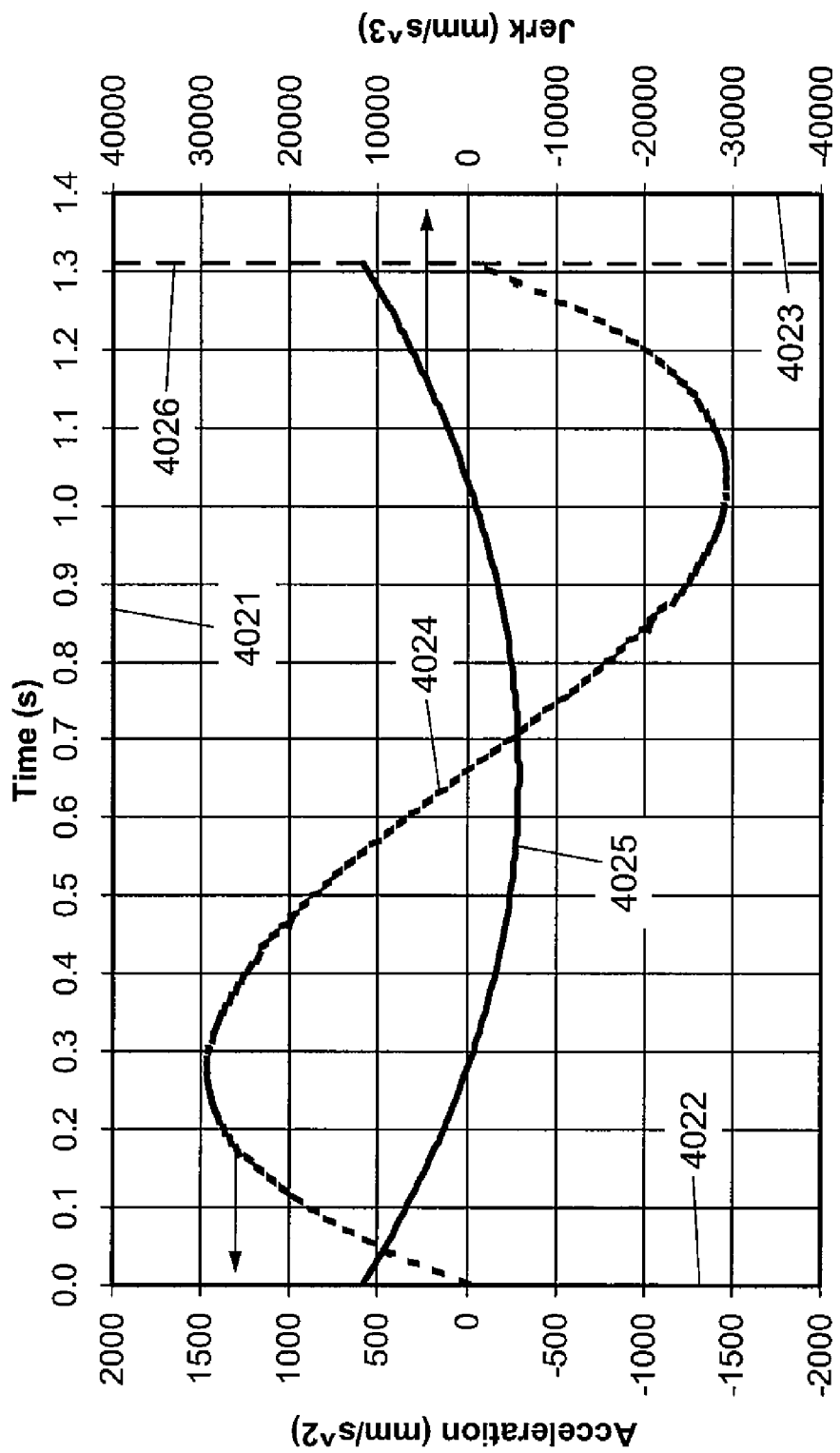
FIG. 27 is a chart plotting end effector acceleration and jerk versus elapsed time during an end effector extension process.
Figure 28:
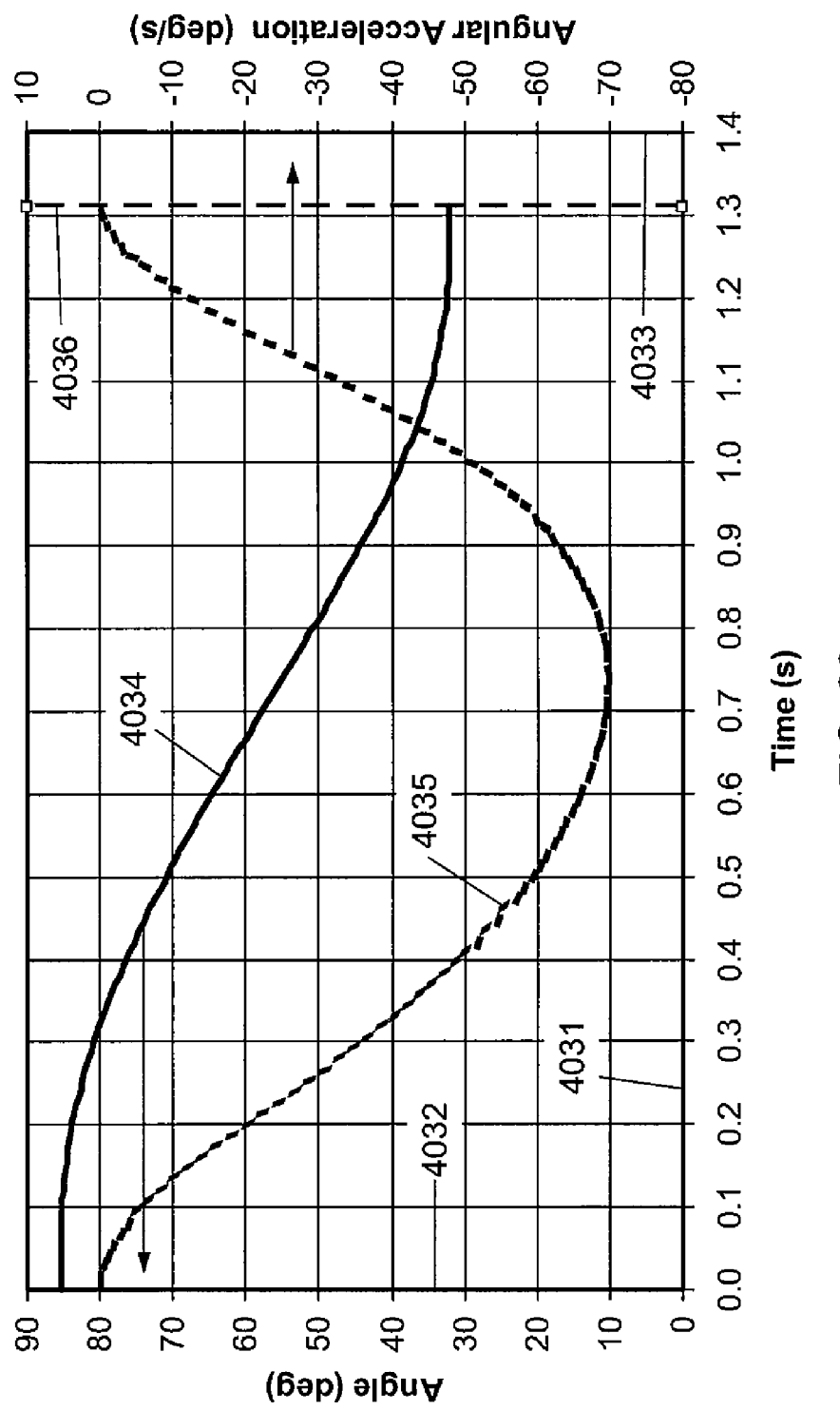
FIG. 28 is a chart plotting angle and angular acceleration of an inner actuator arm versus elapsed time during an end effector extension process.

FIGS. 26-28 describe the end effector motion during extension from a fully retracted position to a fully extended position. The graphs for end effector retraction would have the labeling reversed on time axes 4011, 4021, and 4031, with the beginning of retraction at positions 4016, 4026, and 4036, respectively, and the end of retraction at time=0 s on the axes 4011, 4021, and 4031. All three graphs are calculated with the assumption of a maximum allowable acceleration of 0.15 g (2940 mm/s$^2$). For minimization of the square of the jerk function during motion, the equation for the position of the wafer center during extension of the end effector is (see Hogan, Neville, "Adaptive control of mechanical impedance by coactivation of antagonist muscles", IEEE Trans. Automatic. Control AC-29 (1984), pp. 681-690, and Hogan, Neville, "An organizing principle for a class of voluntary movements", J. Neurosci. 4 (1984), pp. 2745-2754):

$$R(t)=R_i+(R_f-R_i)[10(t/\tau)^3-15(t/\tau)^4+6(t/\tau)^5] \quad \text{(eq. 1)}$$

where
R(t)=the position of the wafer center relative to the center of the robot,
$R_i$=the initial position of the robot at t=0,
$R_f$=the final position of the robot at t=d, and
$\tau$=the extension time of the robot from $R_i$ to $R_f$.

Taking the time derivative of eq. 1 gives the formula for the minimum jerk velocity of the end effector:

$$R'(t)=(R_f-R_i)[30(t/\tau)^2-60(t/\tau)^3+30(t/\tau)^4]/\tau \quad \text{(eq. 2)}$$

where R'(t)=dR(t)/dt. Taking another time derivative gives the minimum jerk acceleration of the end effector:

$$R''(t)=(R_f-R_i)[60(t/\tau)-180(t/\tau)^2+120(t/\tau)^3]/\tau^2 \quad \text{(eq. 3)}$$

and the minimum jerk function is then:

$$R'''(t)=(R_f-R_i)[60-360(t/\tau)+360(t/\tau)^2]/\tau^3 \quad \text{(eq. 4)}$$

Now we must consider how to determine the extension time, $\tau$, which is determined by the maximum allowable acceleration $a_{max}$. The maximum acceleration occurs at $t=t_{max\ accel}$ when $dR''(t)/dt\equiv R'''(t)=0$, so from equation 4:

$$R'''(t_{max\ accel})=(R_f-R_i)[60-360(t_{max\ accel}/\tau)+360(t_{max\ accel}/\tau)^2]/\tau^3=0 \quad \text{(eq. 5)}$$

Solving the quadratic equation gives:

$$t_{max\ accel}/\tau=(1-1/\sqrt{3})/2\approx 0.2113 \quad \text{(eq. 6)}$$

Now this value for t/τ can be substituted into equation 3 to give:

$$R''(t_{max\ accel})=(R_f-R_i)[60(0.2113)-180(0.2113)^2+120(0.2113)^3]/\tau^2=(R_f-R_i)(5.7735)/\tau^2=a_{max} \quad \text{(eq. 7)}$$

Solving this equation for τ gives:

$$\tau=\sqrt{[(R_f-R_i)(5.7735)/a_{max}]} \quad \text{(eq. 8)}$$

FIG. 26 is a chart of the end effector position (eq. 1) 4014 (plotted against axis 4012) and velocity (eq. 2) 4015 (plotted against axis 4013) versus the elapsed time 4011 from the beginning (0 s) to the end 4016 of the end effector extension. At time=0 s, the end effector is fully retracted in the position for rotation of the robot within the transfer chamber. At time 4016, the end effector is fully extended for insertion of the wafer into a process module or a pass-through module. The curves 4014 and 4015 result from the process of minimization of the integral of the square of the jerk function (curve 4025 in FIG. 27) over the time interval from time=0 s to time 4026.

FIG. 27 is a chart of the end effector acceleration (eq. 3) 4024 (plotted against axis 4022) and jerk (eq. 4) 4025 (plotted against axis 4023) versus the elapsed time 4021 from the beginning (0 s) to the end 4026 of the end effector extension process. The process of minimization of the square of the jerk function 4025 results in the parabolic curve shown, starting (t=0 in eq. 4) at $60(R_f-R_i)/\tau^3$, dipping down to $-30(R_f-R_i)/\tau^3$ at the middle (t=τ/2 in eq. 4) of the trajectory, then curving back up to $60(R_f-R_i)/\tau^3$ at the end (t=τ in eq. 4).

FIG. 28 is a chart of angle of arm #1 4034 (plotted against axis 4032) and angular acceleration of arm #1 4035 (plotted against axis 4033) versus the elapsed time 4031 from the beginning (0 s) to the end 4036 of the end effector extension process. The chart for end effector retraction would be the same, but with the time axis reversed and time=0 at position 4005. The curve 4003 is derived from the optimized (jerk minimization) curve 4014 in FIG. 26. The robot controller would implement this optimized curve through proper control of the robot rotor.

End Effector 90° Rotation Process Optimization

FIGS. 29-32 describe the end effector motion during rotation through an angle of 90°. All four graphs are calculated with the assumption of a maximum allowable acceleration of 0.15 g (2940 mm/s) The situation for rotational motion is somewhat more complex than for linear motion (such as robot extension and retraction in FIGS. 26-28). The reason for this is that rotational motion induces centrifugal (radial) acceleration in addition to the azimuthal acceleration of the wafer around the arc of the robot motion. Thus, the total wafer acceleration will be the vector sum of the radial and azimuthal accelerations, and the total jerk function will be the vector sum of the radial and azimuthal accelerations. The key difference between the azimuthal and radial accelerations is that the azimuthal acceleration is directly controlled by the motor actuator (as for linear motion), while the radial acceleration is purely a function of the wafer azimuthal velocity. Similarly, the azimuthal jerk is also directly controlled by the motor actuator, while the radial jerk is the derivative of the radial acceleration.

Equations 9-12 below relate to the wafer azimuthal position S(t), and are very similar to equations 1-4 for the robot extension/retraction motion:

$$S(t)=(\pi R_r/2)[10(t/\beta)^3-15(t/\beta)^4+6(t/\beta)^5] \quad \text{(eq. 9)}$$

$$S'(t)=(\pi R_r/2)[30(t/\beta)^2-60(t/\beta)^3+30(t/\beta)^4]/\beta \quad \text{(eq. 10)}$$

$$S''(t)=(\pi R_r/2)[60(t/\beta)-180(t/\beta)^2+120(t/\beta)^3]/\beta^2 \quad \text{(eq. 11)}$$

$$S'''(t)=(\pi R_r/2)[60-360(t/\beta)+360(t/\beta)^2]/\beta^3 \quad \text{(eq. 12)}$$

where
S(t)=the position of the wafer along a 90° arc (=π/2 radians), a distance=$\pi R_r/2$
$R_r$=the retracted position of the robot (constant during rotation), and
β=the rotation time of the robot through a 90° arc $$=\sqrt{[(\pi R_r/2)(5.7735)/a_{max}]} \text{ by analogy with equation 8 with the substitution of } (\pi R_r/2) \text{ in place of } (R_f-R_i). \quad \text{(eq. 13)}$$

From equation 10, the centrifugal (radial) acceleration is then:

$$R''(t)=S'(t)^2/R_r \quad \text{(eq. 14)}$$

Giving a radial jerk of $$R'''(t)=dR''(t)/dt=2S'(t)S''(t)/R_r \quad \text{(eq. 15)}$$

Note that since the rotational motion is on a constant radius $R_r$, then $$R(t)=R_r=\text{constant} \quad \text{(eq. 16)}$$

$$R'(t)=0. \quad \text{(eq. 17)}$$

The seeming inconsistency between R'(t)=0 and R''(t)>0 is explained by the fact that the wafer is in an accelerating (non-inertial) frame. The reason for jerk function minimization is to ensure that the wafer does not get jarred loose from the end effector during motion, thus it is proper to consider the wafer motion in the frame of the end effector even though it is non-inertial (i.e., it is accelerating rotationally). Combining the radial and azimuthal accelerations and jerks quadratically gives the total acceleration and jerk:

$$T''(t)=\sqrt{[R''(t)^2+S''(t)^2]} \quad \text{(eq. 18)}$$

$$T'''(t)=\sqrt{[R'''(t)^2+S'''(t)^2]} \quad \text{(eq. 19)}$$

Figure 29:
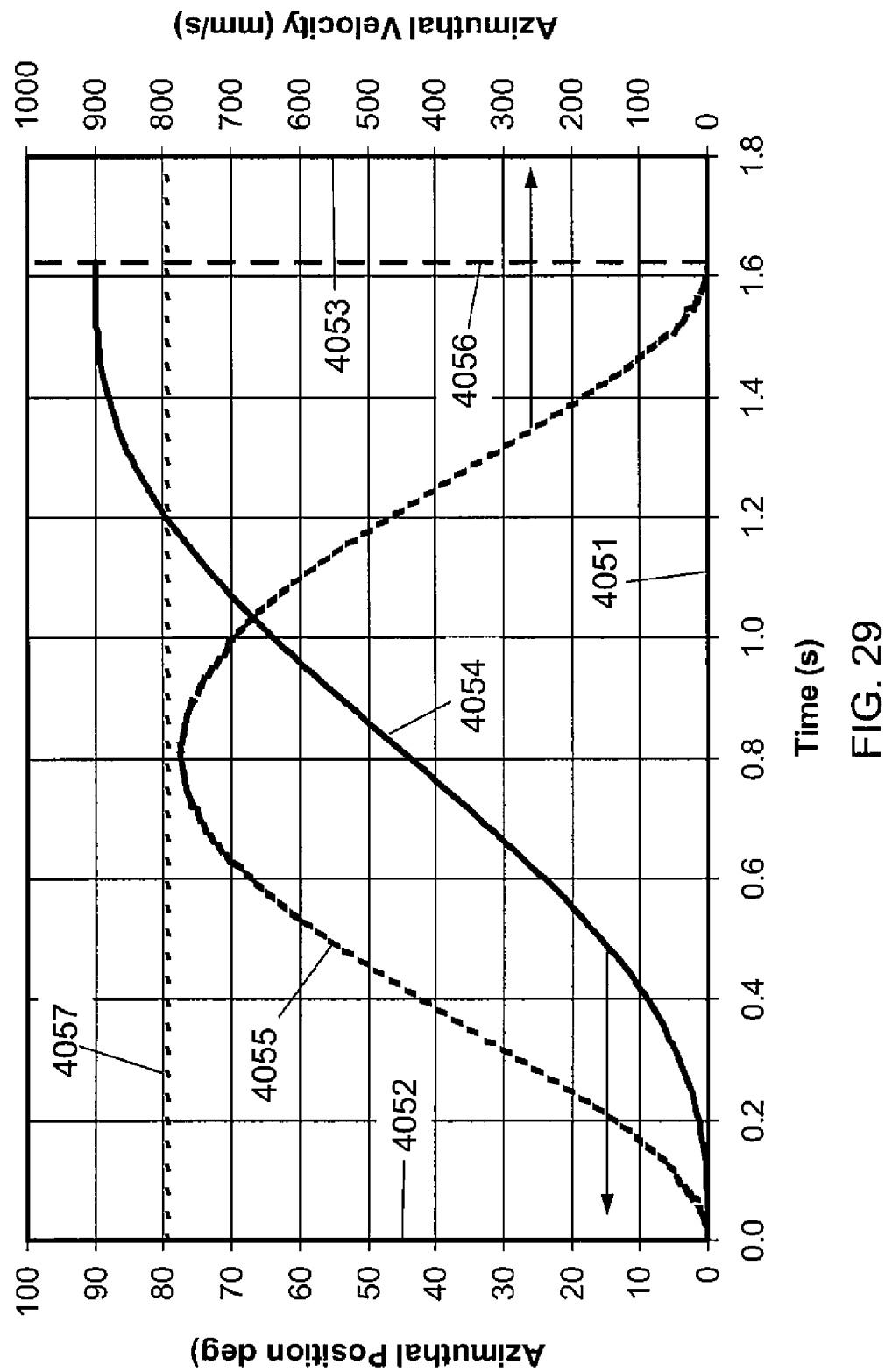
FIG. 29 is a chart plotting end effector azimuthal angular position and azimuthal velocity versus elapsed time during a 90° end effector rotation process.

FIG. 29 is a chart of the end effector azimuthal angular position (eq. 9) 4054 (plotted against axis 4052) and azimuthal velocity (eq. 10) 4055 (plotted against axis 4053) versus the elapsed time 4051 from the beginning (0 s) to the end 4056 of an end effector rotation process for the case of the end effector rotating from 0° to 90°. The maximum allowable velocity, $S'_{max\ allowed}$, 4057 is calculated by setting the radial (centrifugal) acceleration equal to the maximum allowable acceleration:

$$S'_{max\ allowed} = \sqrt{[a_{max} R_r]} \quad \text{(eq. 20)}$$

The actual maximum velocity achieved during the 90° rotation is determined by setting t=β/2:

$$S'_{max} = S'(\beta/2) = (\pi R_r/2)(1.875)/\beta < S'_{max\ allowed} \quad \text{(eq. 21)}$$

Figure 30:
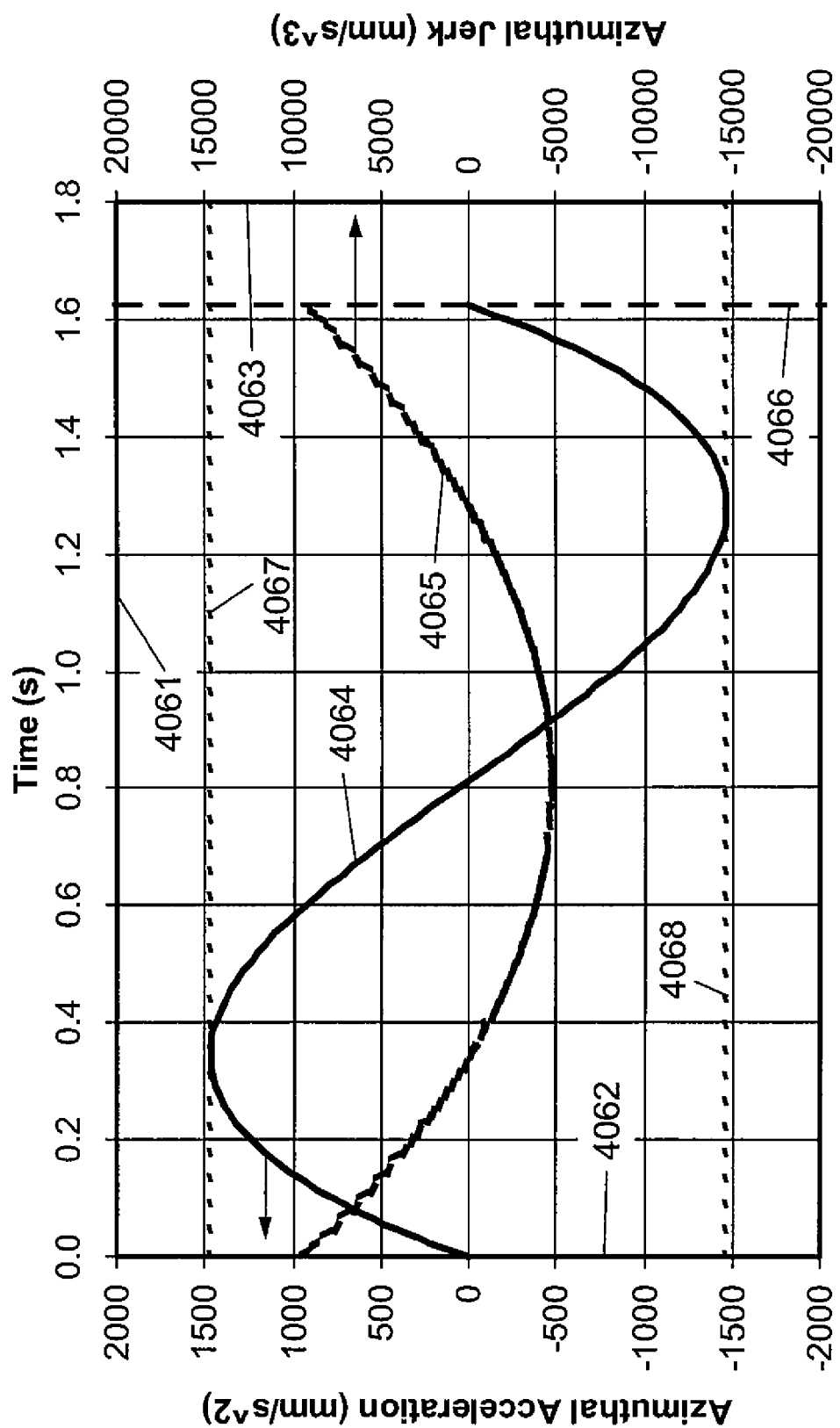
FIG. 30 is a chart plotting effector azimuthal acceleration and azimuthal jerk versus elapsed time during a 90° end effector rotation process.
Figure 31:
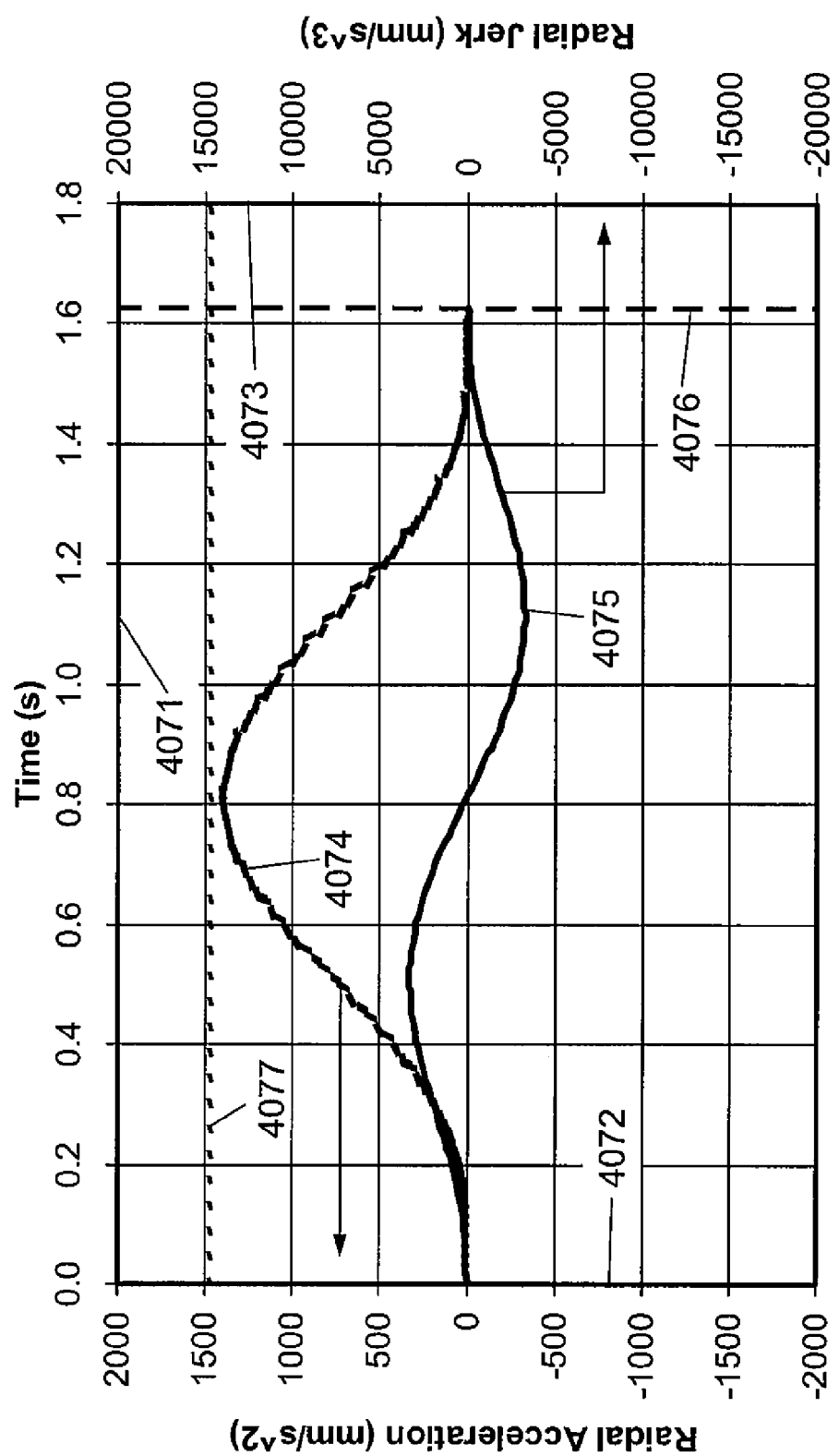
FIG. 31 is a chart plotting end effector radial (centrifugal) acceleration and radial jerk versus elapsed time during a 90° end effector rotation process.
Figure 32:
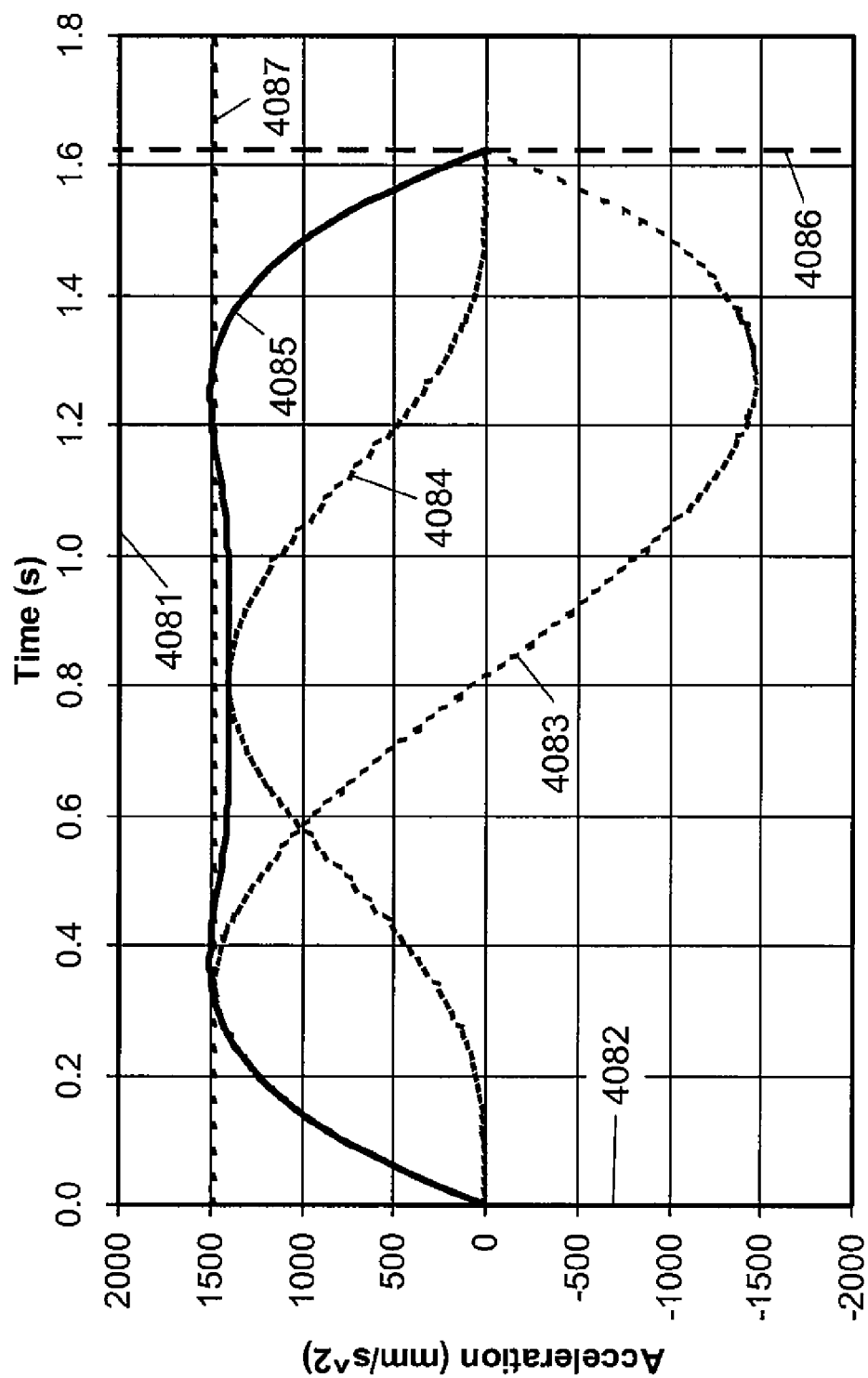
FIG. 32 is a chart plotting end effector azimuthal, radial, and total accelerations versus elapsed time during a 90° end effector rotation process.

The graph for end effector rotation in the opposite direction (i.e., from 90° to 0°) would have the time axis 4051 labeling reversed, with the beginning of rotation at position 4056, and the end of rotation at time=0 s on the axis 4051—this applies to the graphs in FIGS. 30-32, also. End effector rotation must occur with the end effector in the fully retracted position.

FIG. 30 is a chart of the end effector azimuthal acceleration (eq. 11) 4064 (plotted against axis 4062) and azimuthal jerk (eq. 12) 4065 (plotted against axis 4063) versus the elapsed time 4061 from the beginning (0 s) to the end 4066 of a 90° end effector rotation process. The maximum allowable accelerations, $\pm a_{max\ allowed}$, 4067 (in the same direction as velocity 4055 in FIG. 29) and 4068 (in the opposite direction as velocity 4055 in FIG. 29) are plotted showing that the azimuthal acceleration 4064 is always between the upper (4067) and lower (4068) limits.

FIG. 31 is a chart of the end effector radial acceleration (eq. 14) 4074 (plotted against axis 4072) and radial jerk (eq. 15) 4075 (plotted against axis 4073) versus the elapsed time 4071 from the beginning (0 s) to the end 4076 of a 90° end effector rotation process. Note that for 90° rotation, the radial acceleration 4074 is always below the maximum allowable acceleration, $a_{max\ allowed}$, 4077. The radial acceleration 4074 is the centrifugal acceleration induced by velocity 4055 (see FIG. 29)—the radial position is constant at a value corresponding to maximum retraction of the end effector, and the radial velocity is always 0 mm/s.

FIG. 32 is a chart of the end effector azimuthal acceleration (eq. 11) 4083 (=curve 4064 in FIG. 30), radial acceleration (eq. 14) 4084 (=curve 4074 in FIG. 31), and total acceleration (eq. 18) 4085 (=the vector combination of the orthogonal azimuthal 4083 and radial 4084 accelerations) versus the elapsed time 4081 from the beginning (0 s) to the end 4086 of a 90° end effector rotation process. Note that the total acceleration 4085 is always near or below the maximum allowable acceleration, $a_{max\ allowed}$, 4087.

End Effector 180° Rotation Process Optimization

FIGS. 33-36 describe the end effector motion during rotation through an angle of 180°. All four graphs are calculated with the assumption of a maximum allowable acceleration of 0.15 g (=2940 mm/s). The situation for rotational motion through angles >90° is somewhat more complex than for 90° rotations (such as in FIGS. 29-32) because it is necessary to rotate for part of the time with no azimuthal acceleration in order to avoid excessive radial accelerations. As for the 90° described above, the rotational motion induces centrifugal (radial) acceleration in addition to the azimuthal acceleration of the wafer around the arc of the robot motion. What is different for all rotations through angles θ>90°, is that the rotation is at constant speed over the interval from 45° to (θ−45°). The rotational motion can be described in three phases: Phase 1 (azimuthal acceleration). Phase 2 (constant azimuthal speed), and Phase 3 (azimuthal deceleration), where the subscripts denote the formula for each of Phases 1-3 for the case of θ=180°:

$$S_1(t)=(\pi R_r/2)[10(t/\beta)^3-15(t/\beta)^4+6(t/\beta)^5] \text{ for } 0 \leq t \leq \beta/2 \quad \text{(eq. 22)}$$

$$S_2(t)=S_1(\beta/2)+S'_{max}(t-\beta/2) \text{ for } \beta/2<t<(\tau-\beta/2) \quad \text{(eq. 23)}$$

$$S_3(t)=(\pi R_r)-S_1(\tau-t) \text{ for } (\tau-\beta/2) \leq t \leq \tau \quad \text{(eq. 24)}$$

$$S_1'(t)=(\pi R_r/2)[30(t/\beta)^2-60(t/\beta)^3+30(t/\beta)^4]/\beta \text{ for } 0 \leq t \leq \beta/2 \quad \text{(eq. 25)}$$

$$S_2'(t)=S_1'(\beta/2)=S'_{max} \text{ from eq. 21 for } \beta/2<t<(\tau-\beta/2) \quad \text{(eq. 26)}$$

$$S_3'(t)=S_1'(\tau-t) \text{ for } (\tau-\beta/2) \leq t \leq \tau \quad \text{(eq. 27)}$$

$$S_1''(t)=(\pi R_r/2)[60(t/\beta)-180(t/\beta)^2+120(t/\beta)^3]/\beta^2 \text{ for } 0 \leq t \leq \beta/2 \quad \text{(eq. 28)}$$

$$S_2''(t)=0 \text{ for } \beta/2<t<(\tau-\beta/2) \quad \text{(eq. 29)}$$

$$S_3''(t)=-S_1''(\tau-t) \text{ for } (\tau-\beta/2) \leq t \leq \tau \quad \text{(eq. 30)}$$

$$S_1'''(t)=(\pi R_r/2)[60-360(t/\beta)+360(t/\beta)^2]/\beta^3 \text{ for } 0<t<\beta/2 \quad \text{(eq. 31)}$$

$$S_2'''(t)=0 \text{ for } \beta/2<t<(\tau-\beta/2) \quad \text{(eq. 32)}$$

$$S_3'''(t)=S_1'''(\tau-t) \text{ for } (\tau-\beta/2) \leq t \leq \tau \quad \text{(eq. 33)}$$

where $S_i(t)$=the position of the wafer along a 180° arc (=π radians) for phase i, $R_r$=the retracted position of the robot (constant during rotation), β=the rotation time of the robot through a 90° arc from equation 13, $=\sqrt{[(\pi R_r/2)(5.7735)/a_{max}]}$, and τ=the rotation time of the robot through a 180° arc.

$$=(\pi R_r/2)/S'_{max}+\beta \quad \text{(eq. 35)}$$

The radial functions are calculated similarly to those in equations 14-17. From equations 25-27, the centrifugal (radial) acceleration is (for phases i=1 to 3):

$$R_i''(t)=S_i'(t)^2/R_r \quad \text{(eq. 36)}$$

Giving a radial jerk of $$R_i'''(t)=dR_i''(t)/dt=2S_i'(t)S_i''(t)/R_r \quad \text{(eq. 37)}$$

Note that since the rotational motion is on a constant radius $R_r$, then $$R_i(t)=R_r=\text{constant} \quad \text{(eq. 38)}$$

$$R_i'(t)=0. \quad \text{(eq. 39)}$$

The seeming inconsistency between R'(t)=0 and R"(t)>0 is explained by the fact that the wafer is in an accelerating (non-inertial) frame. The reason for jerk function minimization is to ensure that the wafer does not get jarred loose from the end effector during motion, thus it is proper to consider the wafer motion in the frame of the end effector even though it is non-inertial (i.e., it is accelerating rotationally). Combining the radial and azimuthal accelerations and jerks quadratically gives the total acceleration and jerk:

$$T_i''(t)=\sqrt{[R_i''(t)^2+S_i''(t)^2]} \quad \text{(eq. 40)}$$

$$T_i'''(t)=\sqrt{[R_i'''(t)^2+S_i'''(t)^2]} \quad \text{(eq. 41)}$$

Figure 33:
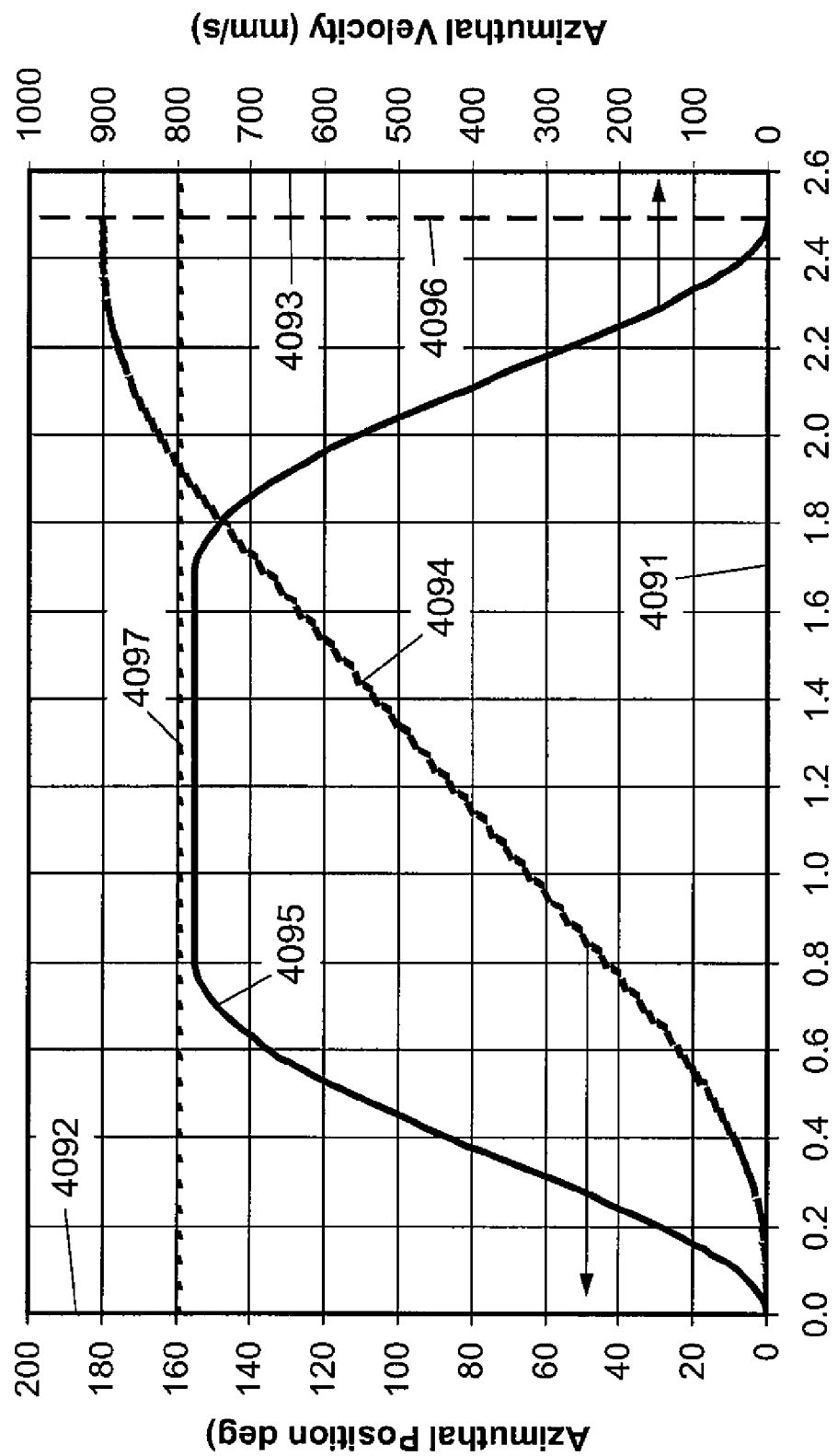
FIG. 33 is a chart plotting end effector azimuthal angular position and azimuthal velocity versus elapsed time during a 180° end effector rotation process.

FIG. 33 is a chart of the end effector azimuthal angular position (eqs. 22-24) 4094 (plotted against axis 4092) and azimuthal velocity (eqs. 25-27) 4095 (plotted against axis 4093) versus the elapsed time 4091 from the beginning (0 s) to the end 4096 of an end effector rotation process for the case of the end effector rotating from 0° to 180°. The maximum allowable velocity 4097 is calculated by setting the radial (centrifugal) acceleration equal to the maximum allowable acceleration. The graph for end effector rotation in the opposite direction (i.e., from 180° to 0°) would have the time axis 4091 labeling reversed, with the beginning of rotation at position 4096, and the end of rotation at time=0 s on the axis 4091—this applies to the graphs in FIGS. 34-36, also. Note that the middle portion of the rotation (phase 2) is at constant velocity, since the radial (centrifugal) acceleration roughly equals the maximum allowable acceleration and thus no azimuthal acceleration is possible. End effector rotation must occur with the end effector in the fully retracted position, $R_r$.

Figure 34:
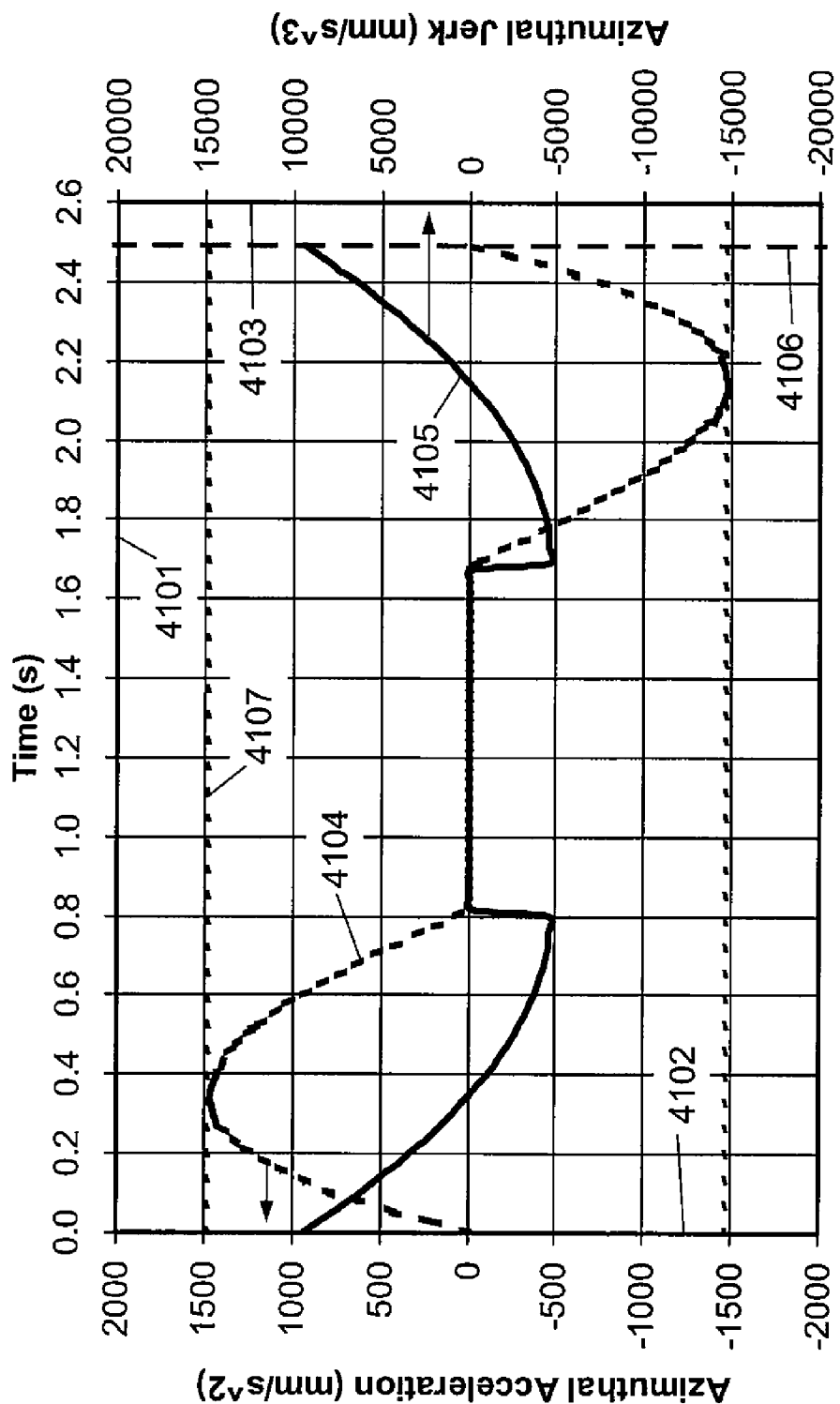
FIG. 34 is a chart plotting end effector azimuthal acceleration and azimuthal jerk versus elapsed time during a 180° end effector rotation process.

FIG. 34 is a chart of the end effector azimuthal acceleration (eqs. 28-30) 4104 (plotted against axis 4102) and azimuthal jerk (eqs. 31-33) 4105 (plotted against axis 4103) versus the elapsed time 4101 from the beginning (0 s) to the end 4106 of a 180° end effector rotation process. The maximum allowable accelerations 4107 (in the same direction as velocity 4095 in FIG. 33) and 4108 (in the opposite direction as velocity 4095 in FIG. 33) are plotted showing that the azimuthal acceleration 4104 is always between the upper (4107) and lower (4108) acceleration limits, $\pm a_{max\ allowed}$. Note that the central region (phase 2 from 45° to 135°) has no azimuthal acceleration and no azimuthal jerk. Thus, in phase 2, the end effector is rotating at constant velocity, $S'_{max}$, 4095 (see FIG. 33) and constant radial (centrifugal) acceleration, $S'^2_{max}/R_r$, 4114 (see FIG. 35).

Figure 35:
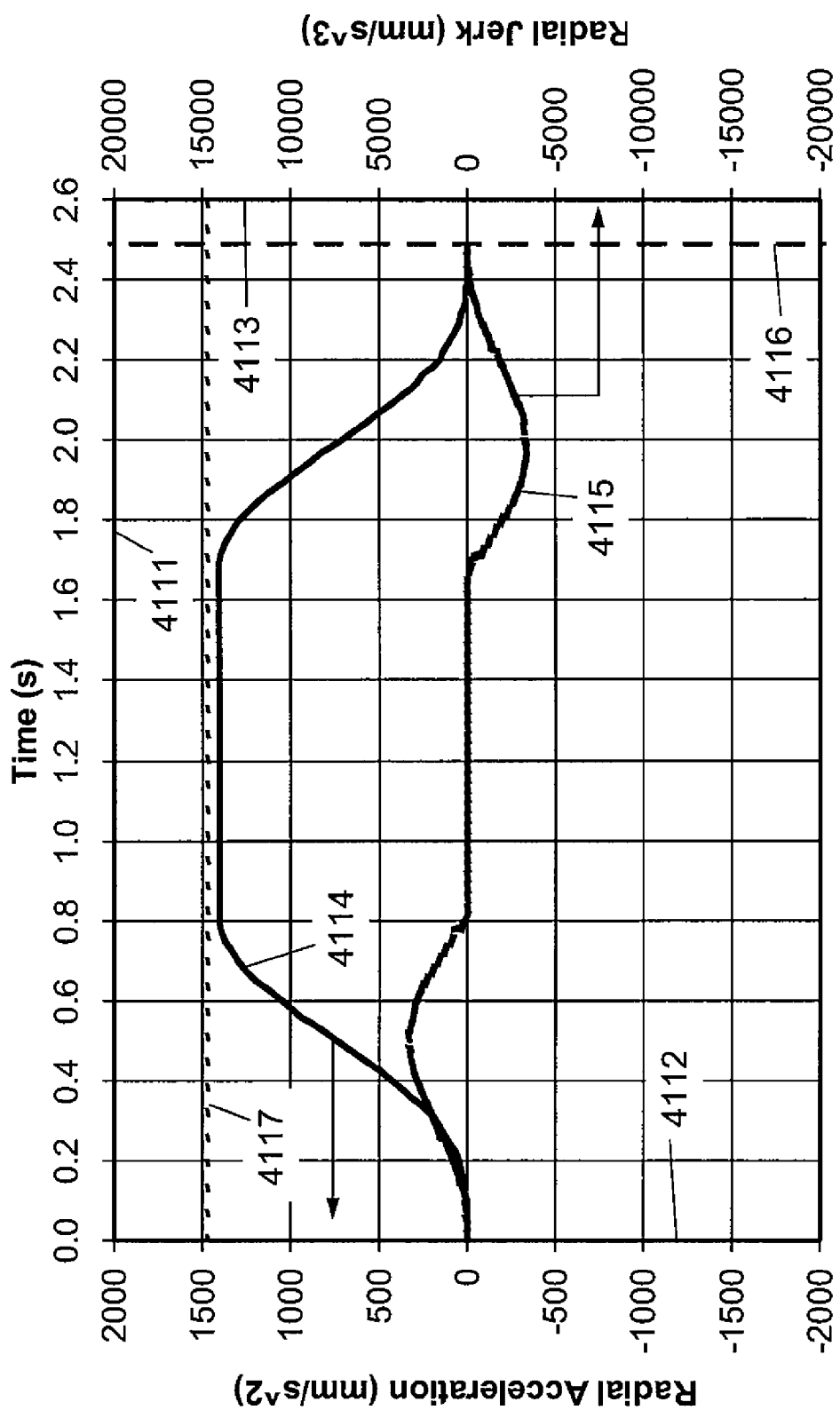
FIG. 35 is a chart plotting end effector radial (centrifugal) acceleration and radial jerk versus elapsed time during a 180° end effector rotation process.

FIG. 35 is a chart of the end effector radial acceleration (eq. 36) 4114 (plotted against axis 4112) and radial jerk (eq. 37) 4115 (plotted against axis 4113) versus the elapsed time 4111 from the beginning (0 s) to the end 4116 of a 180° end effector rotation process The maximum allowable acceleration, $a_{max\ allowed}$, 4117 is plotted showing that the radial acceleration 4114 is always below the limit. Note that this radial acceleration 4114 is the centrifugal acceleration induced by velocity 4095 (see FIG. 33)—the radial position is constant at a value corresponding to maximum retraction of the end effector, and the radial velocity is always 0 mm/s. In phase 2 (corresponding to rotation from 45° to 135°), the radial (centrifugal) acceleration is constant because the velocity 4095 (see FIG. 33) is constant. Because the radial acceleration 4114 is constant over the central region, the derivative of the radial acceleration 4114 (the jerk function 4115) is 0 mm/s³. Since in phase 2 both the azimuthal (eqs. 31-33) 4105 (see FIG. 34) and radial (eq. 37) 4115 jerk functions are 0 mm/s³, the total jerk function is also 0 mm/s³, and there is no contribution to the integral of the total jerk function squared over the central region.

Figure 36:
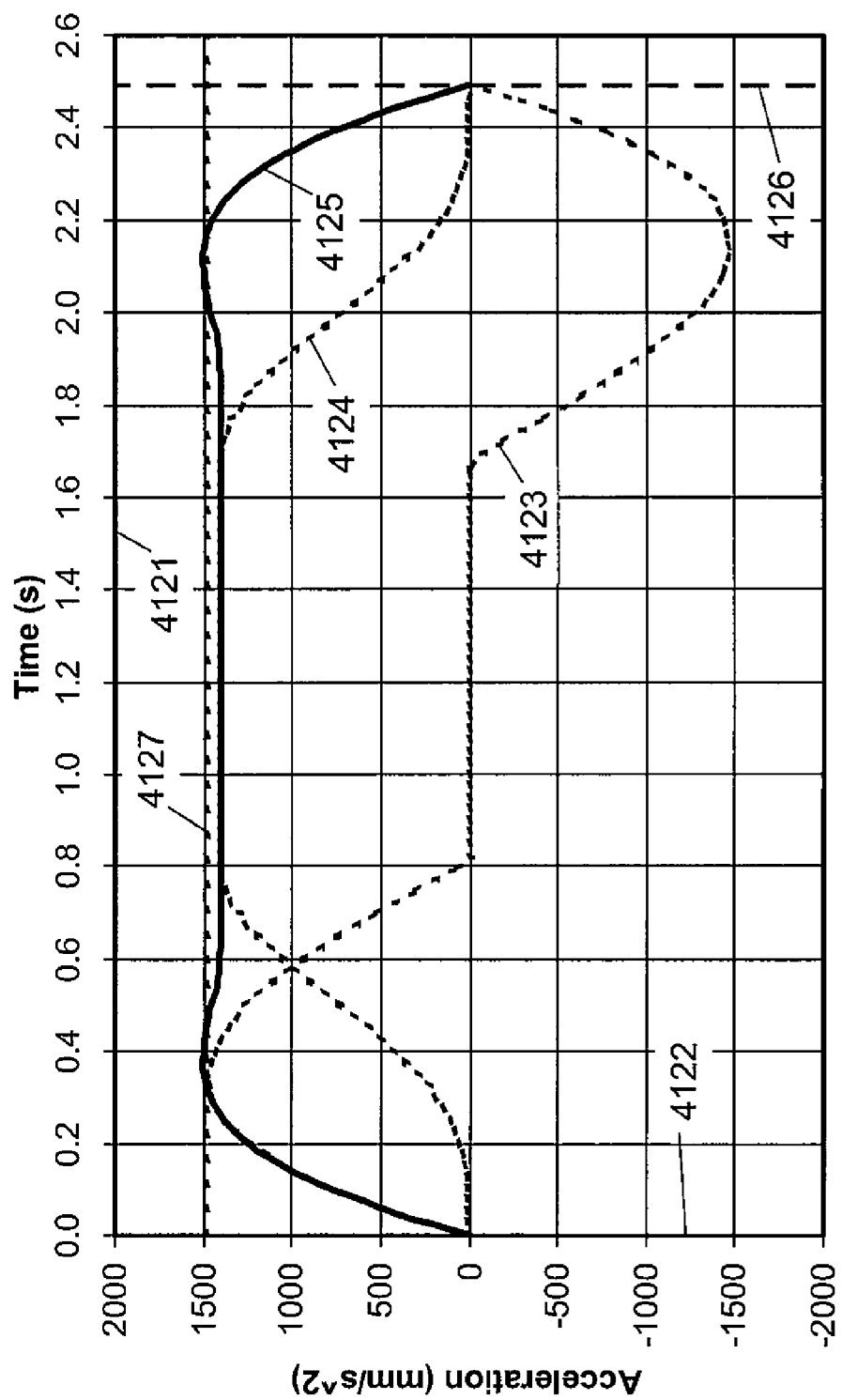
FIG. 36 is a chart plotting end effector azimuthal, radial, and total accelerations versus elapsed time during a 180° end effector rotation process.

FIG. 36 is a chart of the end effector azimuthal acceleration (eqs. 28-30) 4123 (=curve 4104 in FIG. 34), radial acceleration (eq. 36) 4124 (=curve 4114 in FIG. 35), and total acceleration (eq. 40) 4125 (=the vector combination of the orthogonal azimuthal 4123 and radial 4124 accelerations) versus the elapsed time 4121 from the beginning (0 s) to the end 4126 of a 180° end effector rotation process. The maximum allowable acceleration, $a_{max\ allowed}$, 4127 is plotted showing that the total acceleration 4125 is always near or below the limit.

Rotation and Wafer Transfer Times vs. Maximum Acceleration

Figure 37:
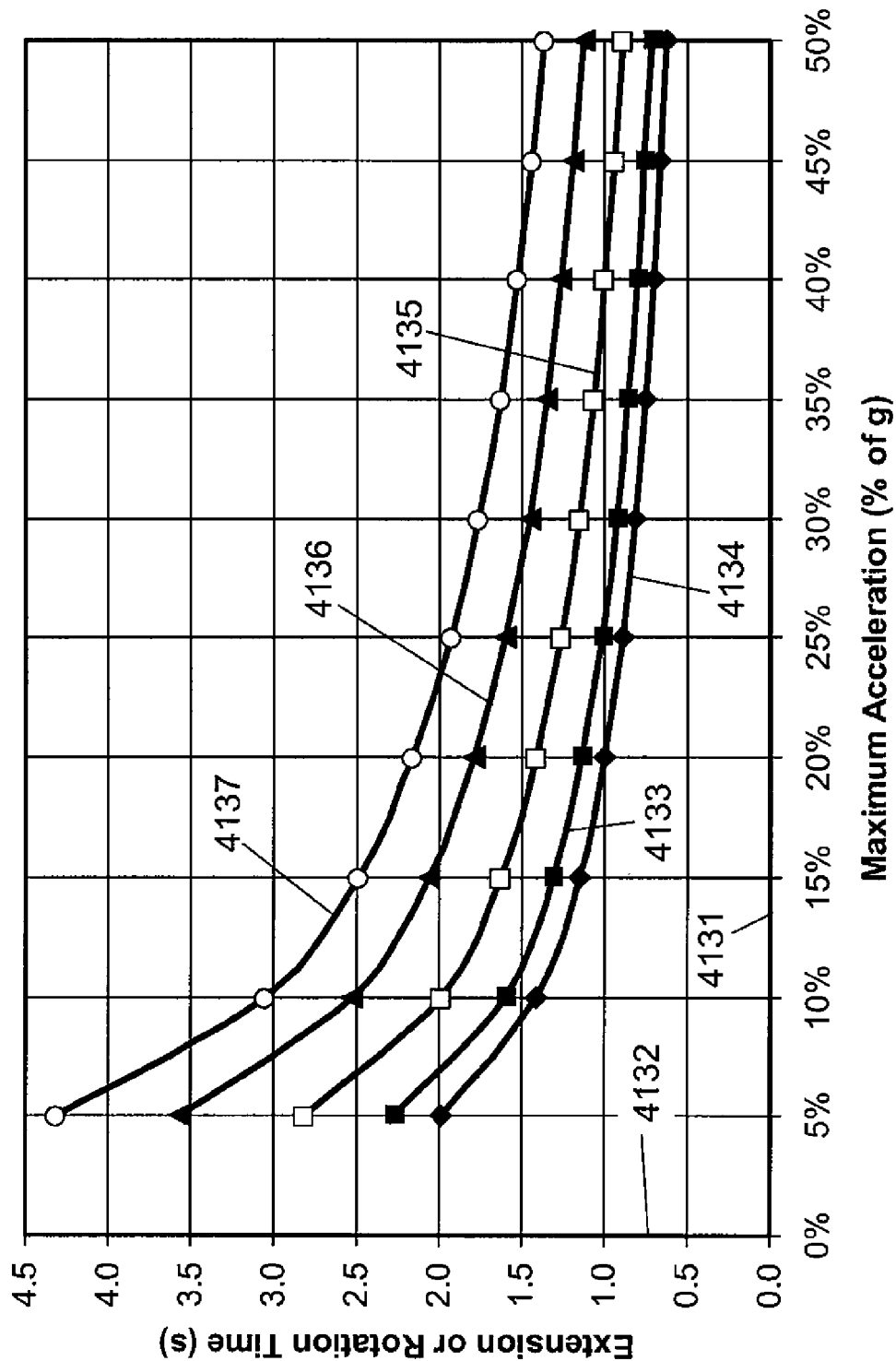
FIG. 37 is a chart plotting extension or rotation times of an end effector versus maximum acceleration.
Figure 38:
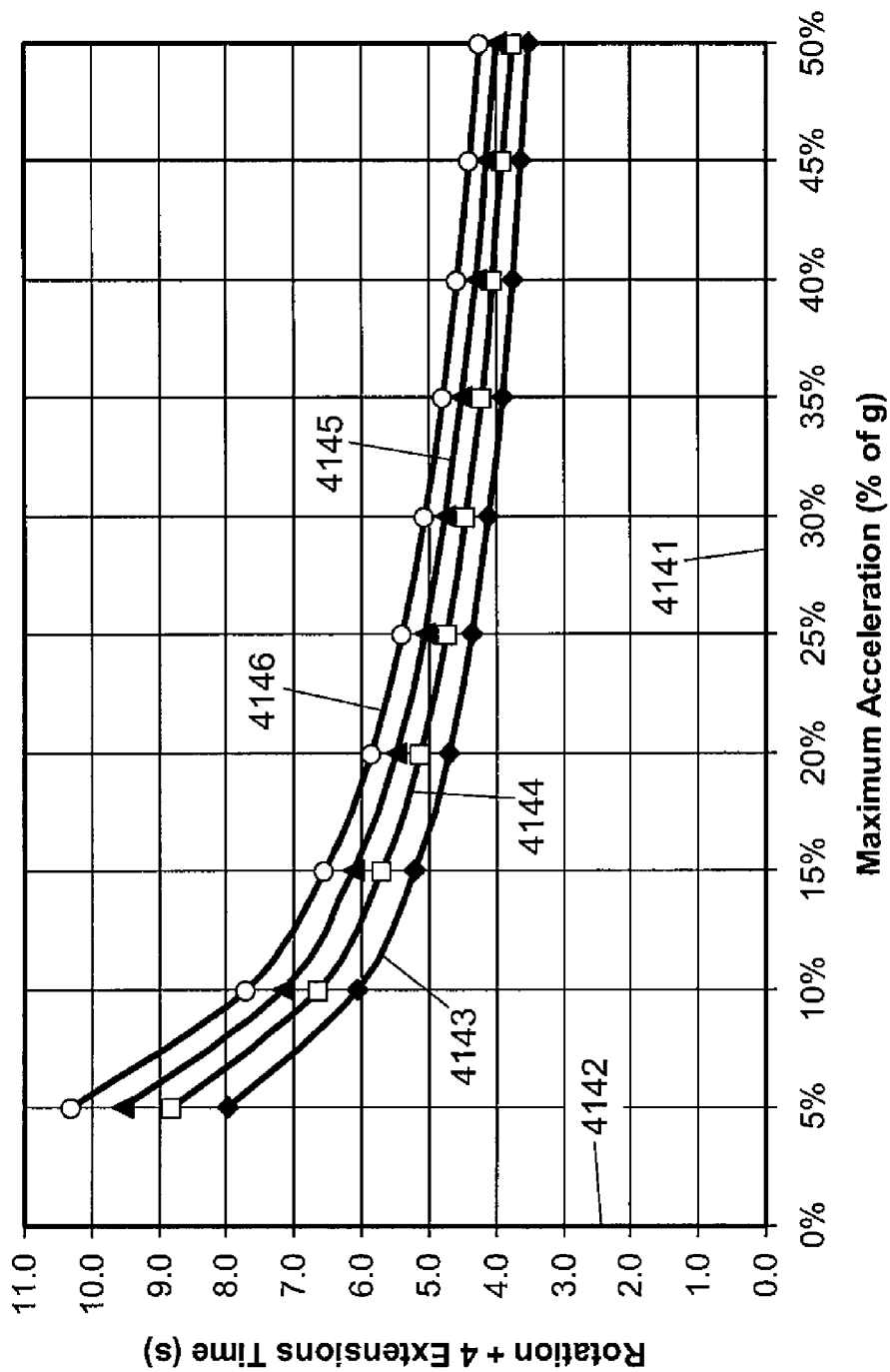
FIG. 38 is a chart plotting combined times for one rotation plus four extensions of an end effector versus maximum acceleration.
Figure 39:
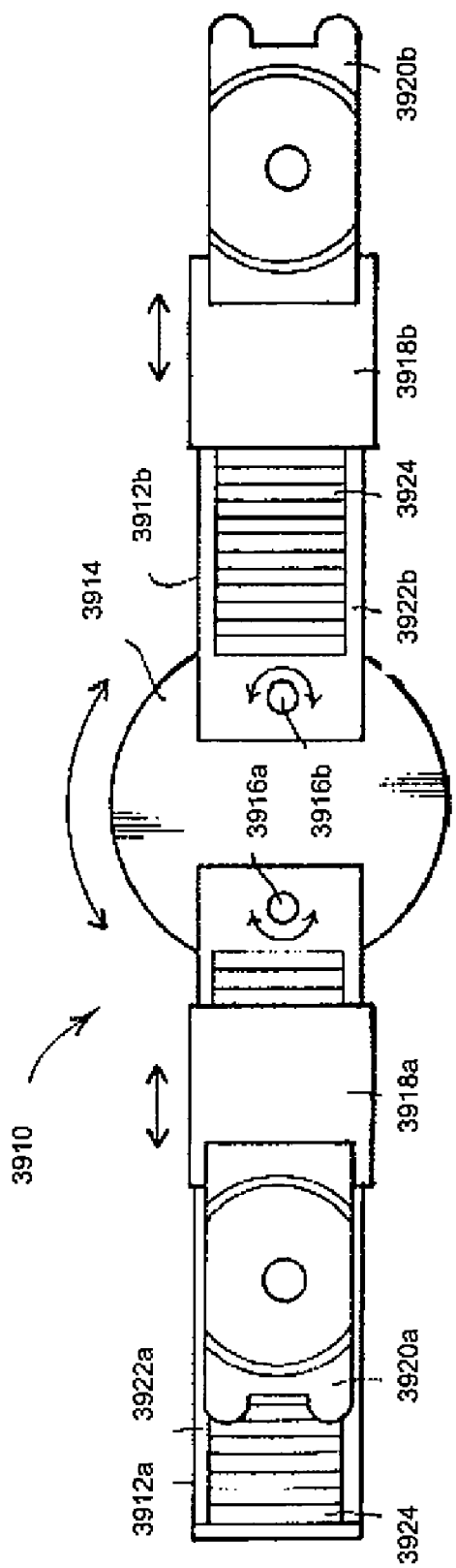
FIG. 39 illustrates an example of a conventional dual wafer robot that is limited to wafer handling within a single plane.
Figure 40:
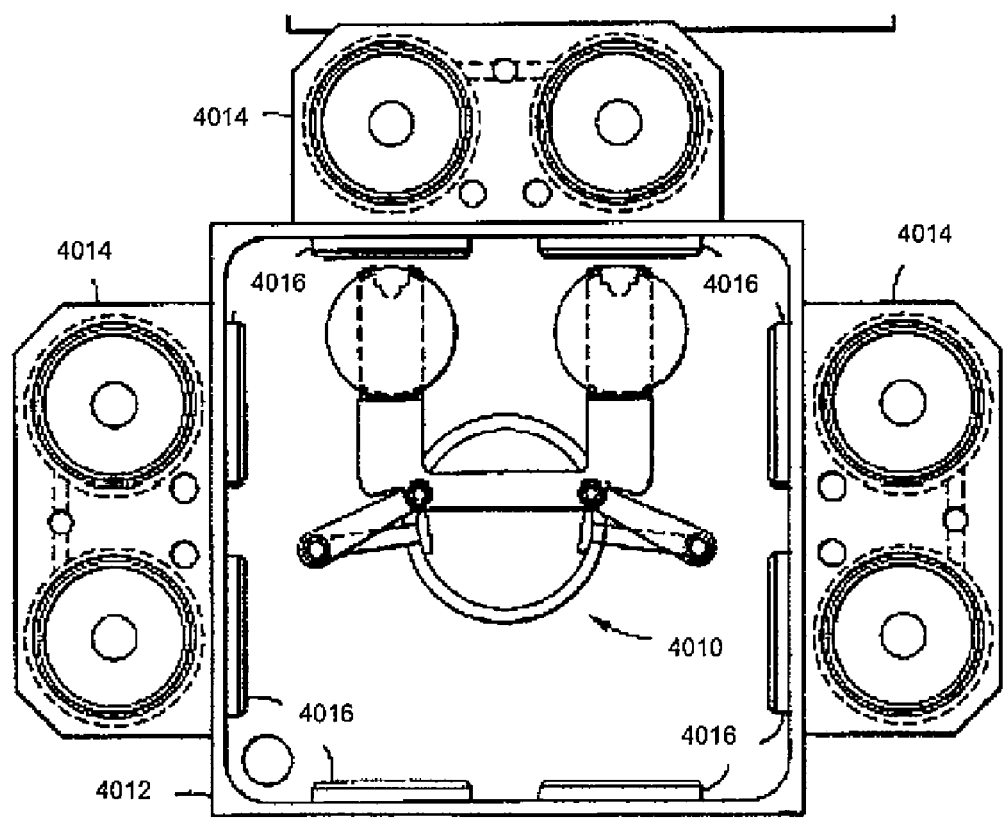
FIG. 40 illustrates an example of a conventional dual wafer robot that is limited to wafer handling in a tandem configuration with simultaneous motion of both wafers in a single plane.
Figure 41:
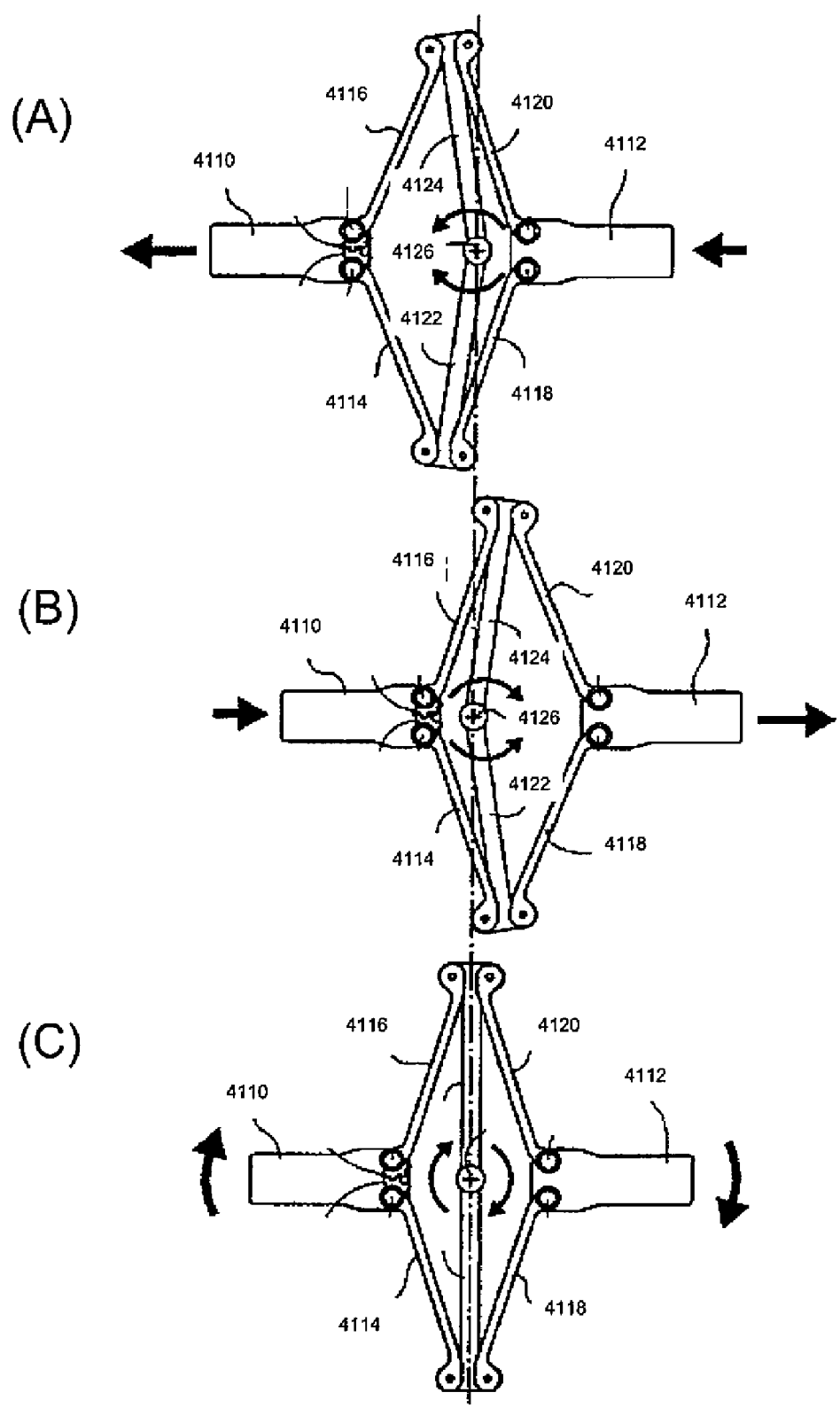
FIG. 41 illustrates an example of a conventional dual wafer robot that is limited to single wafer loading and unloading.
Figure 42:
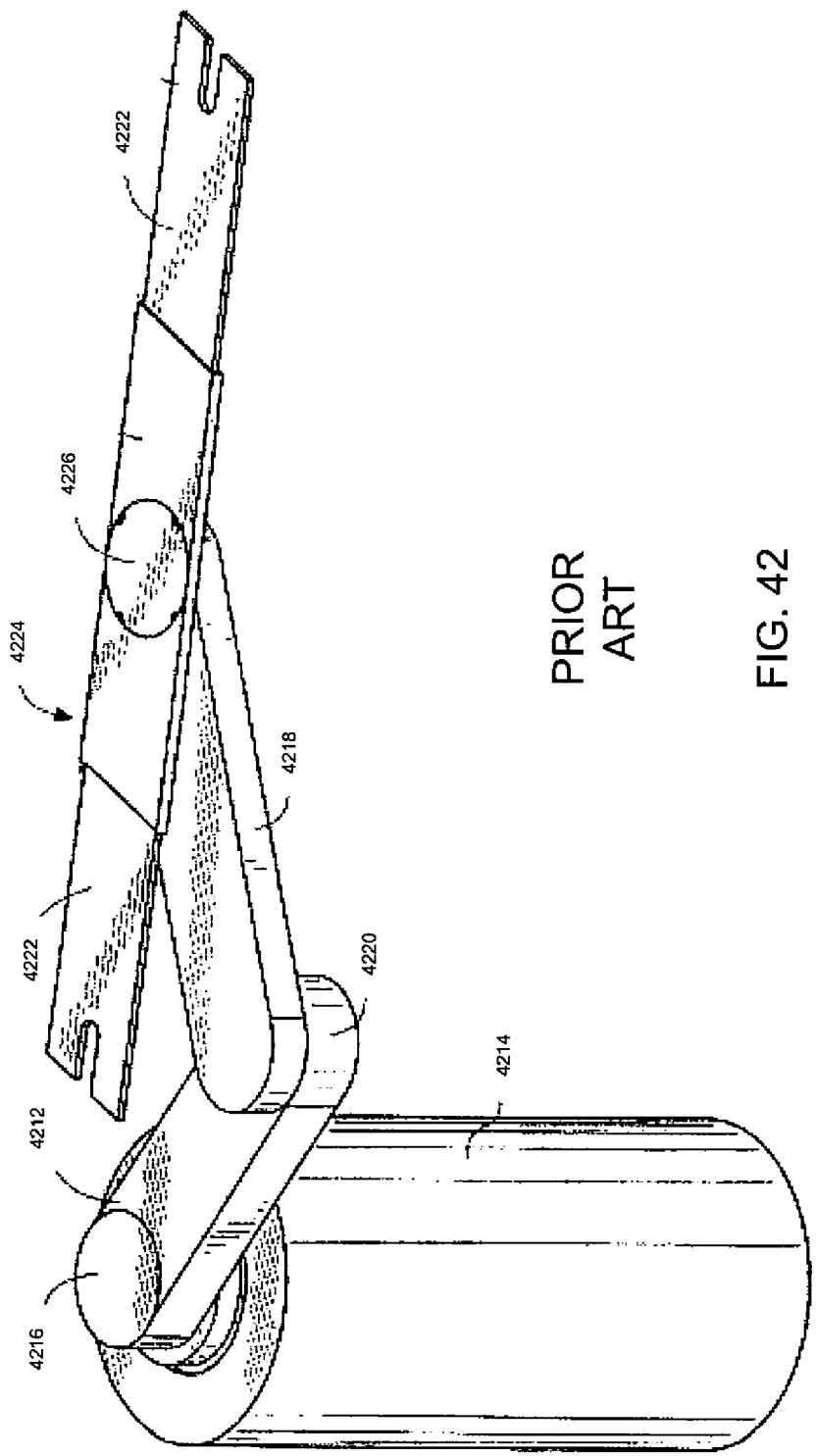
FIG. 42 illustrates an example of a conventional dual wafer robot that is limited to single wafer loading and unloading.
Figure 43:
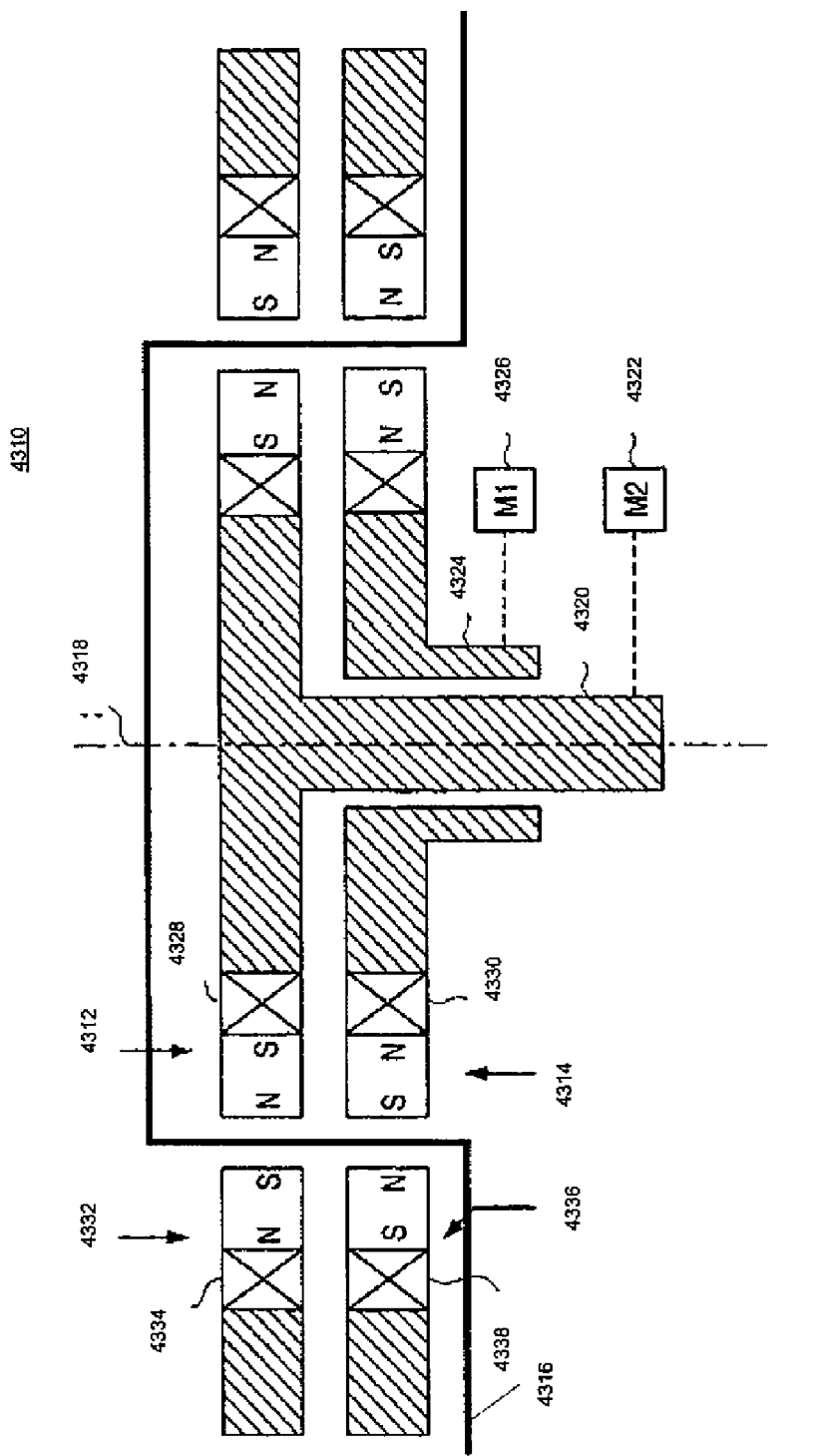
FIG. 43 illustrates an example of a conventional robot actuator having two motors, each of which requires a magnetic air-to-vacuum coupler separate from the robot motors.

FIG. 37 is a chart of the extension times 4133 or rotation times 4134-4137 (plotted against axis 4132) of the end effector versus the maximum allowable acceleration 4131. Rotation time curve 4134 corresponds to a 45° rotation, while rotation time curves 4135-4137 correspond to rotations 90°, 135°, and 180°, respectively, FIG. 38 is a chart of the combined times 4143-4146 (plotted against axis 4142) for one rotation+four extensions versus the maximum acceleration 4141. Combined time 4143 corresponds to four extensions+one 45° rotation. Times 4144-4146 correspond to four extensions+rotations of 90°, 135°, and 180°, respectively. FIG. 22 illustrates the wafer transfer process assumed in the generation of this graph—note that the wafer transfer process involves two extensions and two retractions—for FIG. 38, the two retractions are considered to be "extensions" since the timing considerations are identical, as discussed in FIG. 26. An extension or retraction of an empty end effector is assumed to be done with 50% of g acceleration (far right of FIG. 37), while extensions or retractions of end effectors carrying wafers are assumed to have the accelerations shown on axis 4141 (corresponding to axis 4131 in FIG. 37). In all cases, the rotations of the end effector are assumed to have a wafer, and thus to correspond to axis 4131 in FIG. 37. With proper cluster tool process sequencing, any rotations of the end effector without a wafer should occur while wafers are being processed and thus should have no effect on tool throughput.

Dual Wafer Robot at Pass-Through Module

Figure 44A:
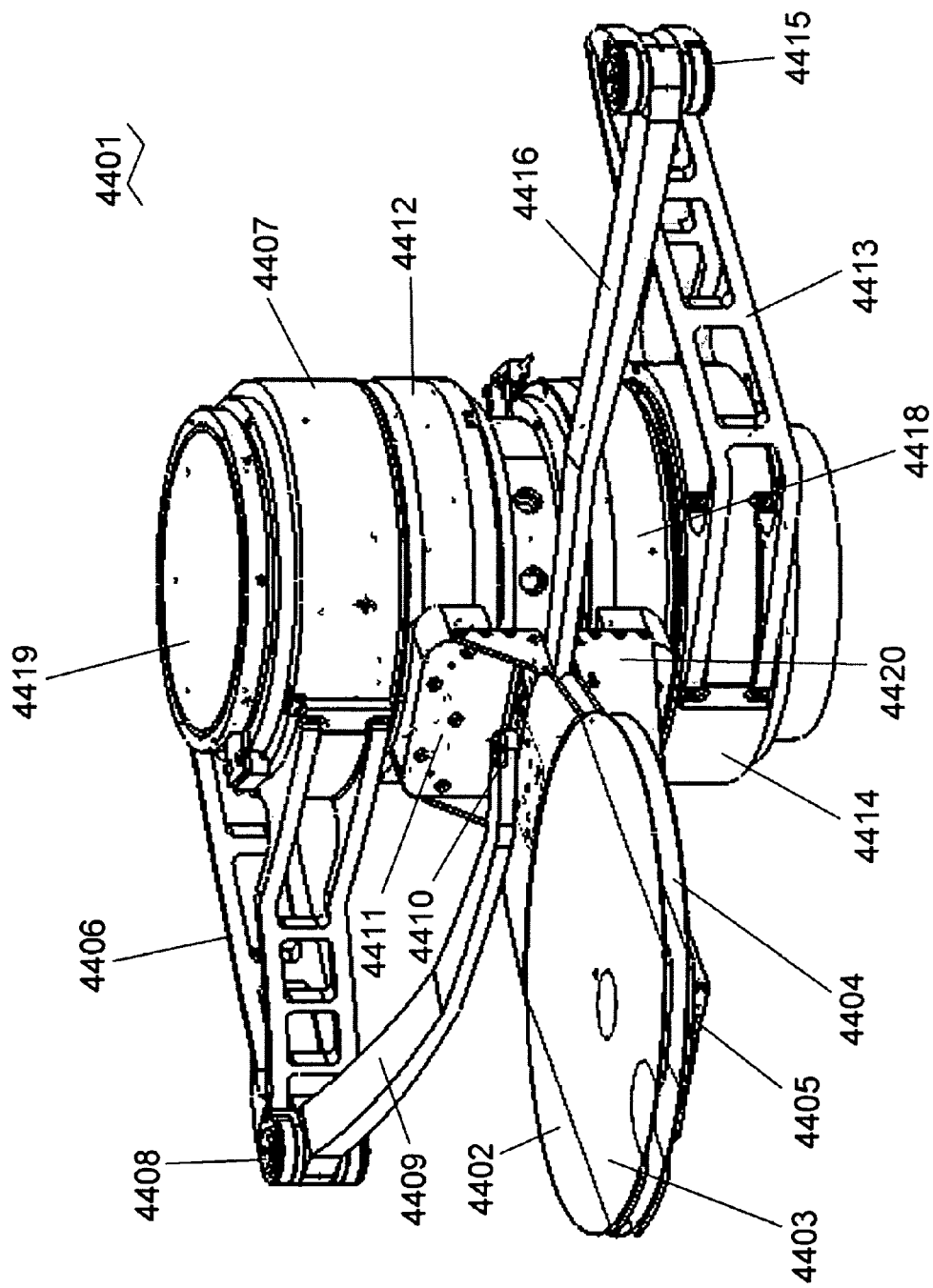
FIG. 44A is an isometric view of a dual wafer robot configured in accordance with a further embodiment of the present invention and showing two end effectors (each carrying a single wafer) in an above and below arrangement on one side of the robot's rotational axis, where both end effectors are fully retracted.

FIG. 44A is an isometric, view of a dual wafer robot 4401 configured in accordance with a further embodiment of the present invention, showing two wafers 4402 and 4404, supported by end effectors 4403 and 4405, respectively. The main difference between the dual wafer robot shown in FIGS. 4A-11 and the robot shown in FIGS. 44A-47 is the removal of the cam mechanism for independent asynchronous Z-motion of the end effectors (FIG. 20). For the present robot, the only Z-motion of the end effectors which is possible is the collective Z-motion that was described above with reference to FIG. 21.

In FIG. 44A, wafers 4402 and 4404 have been positioned by end effectors 4403 and 4405, respectively, in an above and below configuration, suitable for simultaneous (or near simultaneous) loading of wafers 4402 and 4404 into a pass-through module (not shown). Upper end effector 4403 is supported by support arm 4411 attached to rotor 4412 (see FIG. 45 for a view of slider 4440 which connects support arm 4411 to end effector 4403). Actuator arm 4406 is attached to rotor 4407, and is connected through pivot 4408 to outer arm 4409. Outer arm 4409 is connected to end effector 4403 through pivot 4410. Lower end effector 4405 is supported by support arm 4420 that is attached to rotor 4418. Actuator arm 4413 is attached to rotor 4414, and is connected through pivot 4415 to outer arm 4416. Outer arm 4416 is connected to end effector 4405 through a pivot (not shown) which is equivalent to pivot 4410. Details on the extension of the end effectors are provided in connection with the discussion of FIG. 12, above.

Figure 44B:
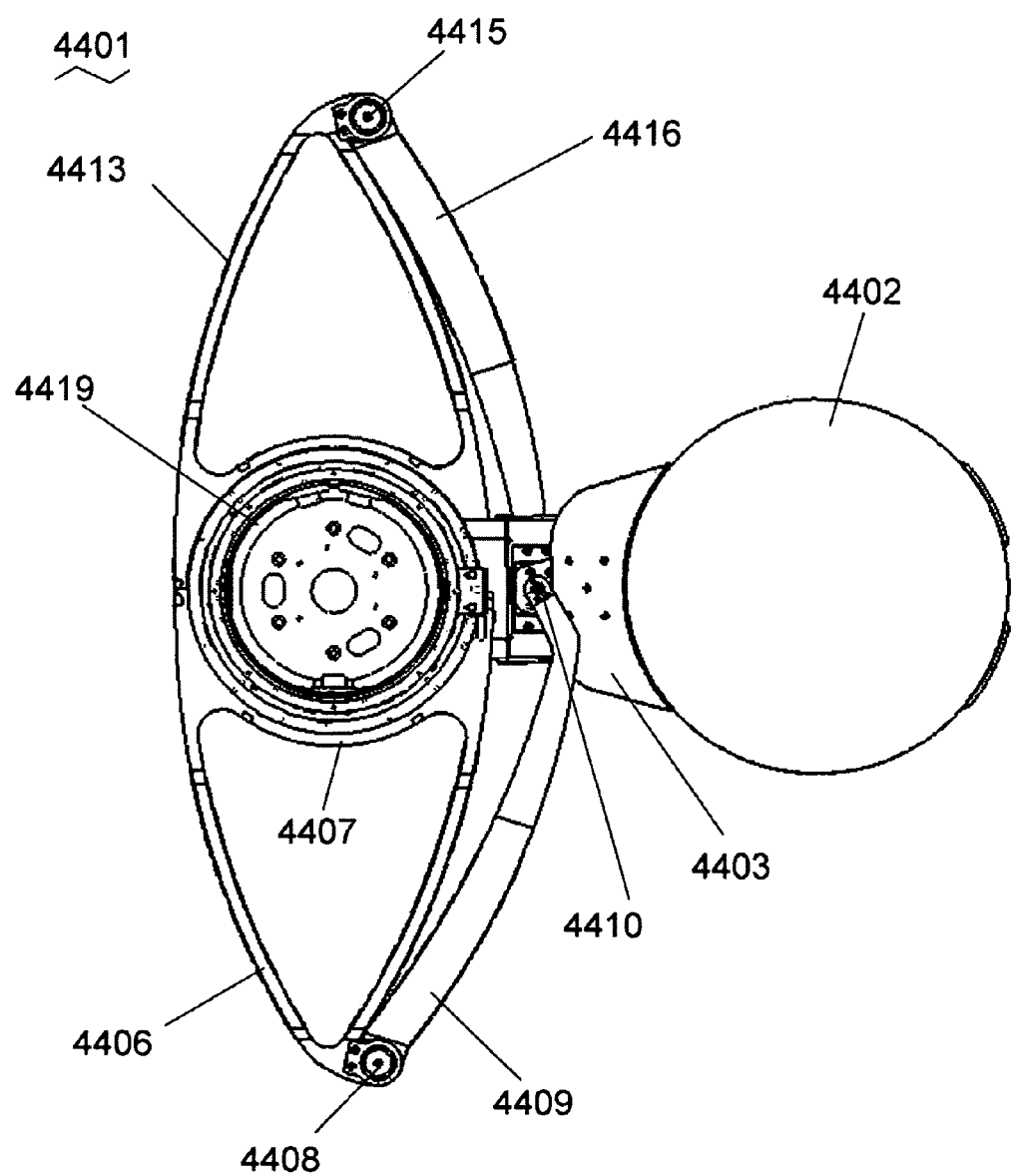
FIG. 44B is a top view of the dual wafer robot shown in FIG. 44A.
Figure 44C:
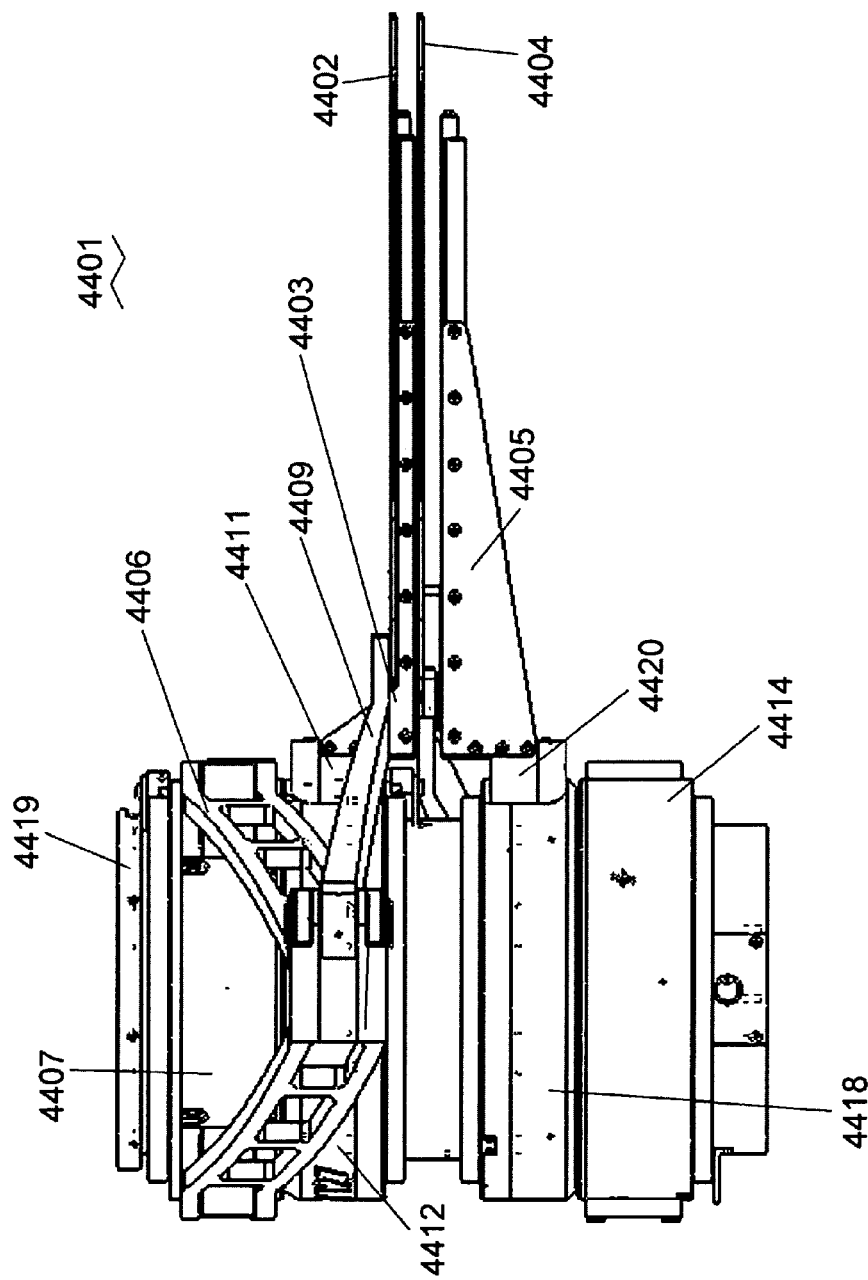
FIG. 44C is a side view of the dual wafer robot shown in FIGS. 44A-B.

FIG. 44A and FIG. 44B, which is a top view of the dual wafer robot 4401 shown in FIG. 44A, illustrate the dual wafer robot 4401 with both end effectors fully retracted—this is the configuration in which the end effectors 4403 and 4405 may rotate. The rotors 4407, 4412, 4414, and 4418 rotate around the central fixed tube 4419 which forms part of the transfer chamber (not shown—see, e.g., chambers 1105 and 1110 in FIGS. 2A-B), FIG. 44C is a side view of the dual wafer robot illustrated in FIGS. 44A-B. This view shows how support arms 4411 and 4420 extend downwards and upwards from rotors 4412 and 4418, respectively, to enable end effectors 4403 and 4405 to position wafers 4402 and 4404 for insertion/removal into/out of vertically-spaced slots in a pass-through module.

Figure 45:
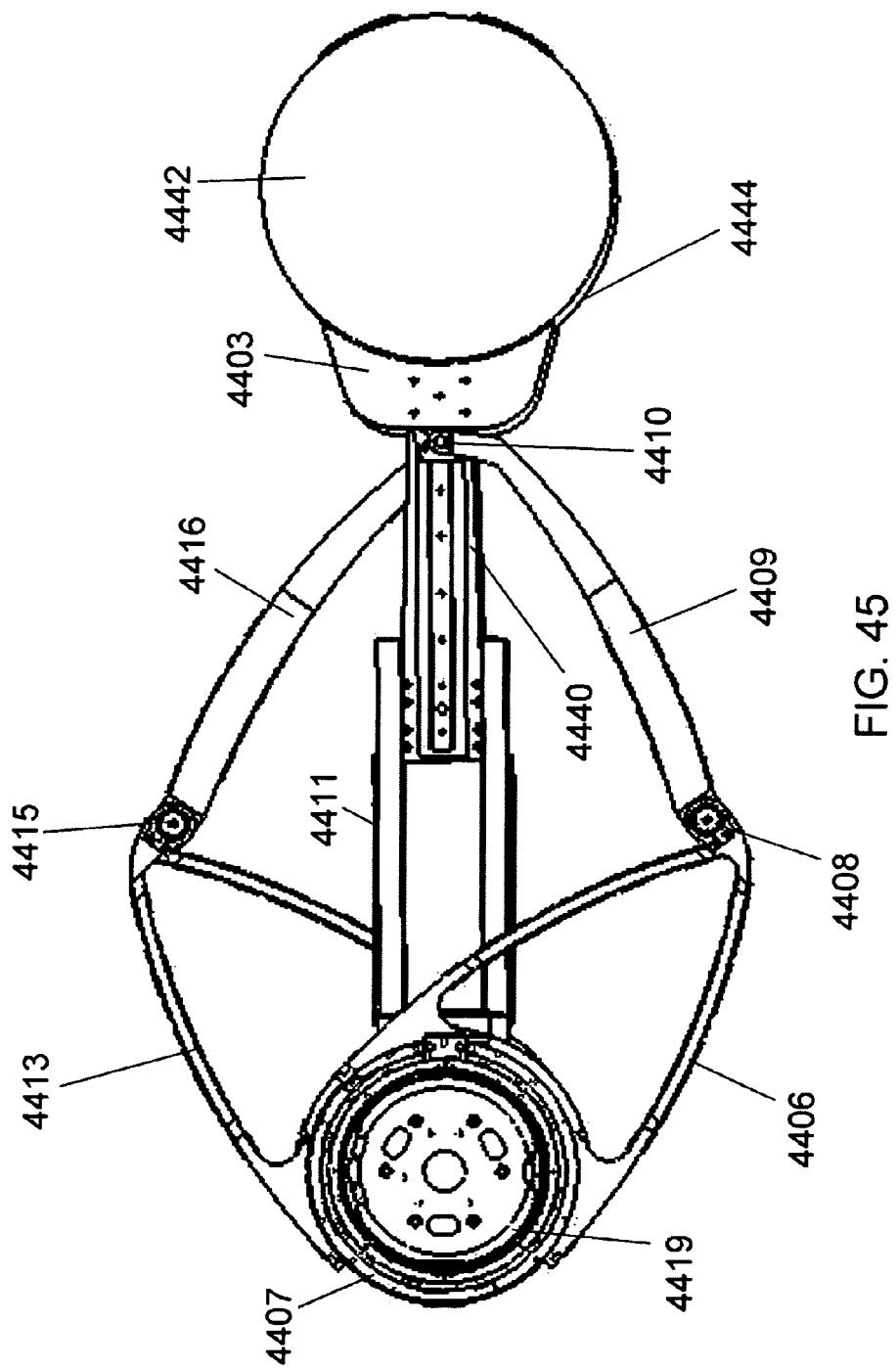
FIG. 45A is a top view of a dual wafer robot configured in accordance with an embodiment of the present invention and showing two end effectors (each carrying a single wafer) in an above and below arrangement, where both end effectors are fully extended for loading/unloading two wafers into/out of a pass-through chamber.
FIG. 45B is a side view of the dual wafer robot shown in FIG. 45A.

FIG. 45 is a top view of a dual wafer robot configured in accordance with an embodiment of the present invention, showing two wafers 4442 and 4444 in an above/below arrangement, where both robot end effectors are fully extended for loading two wafers 4442 and 4444 simultaneously (or nearly so) into a pass-through chamber (not shown). The slide mechanism comprising support arm 4411, slider 4440, and end effector 4403 can be seen in this view. In cases where there is a large difference between the wafer position for robot rotation and the wafer position in the center of a process module, the three-element telescoping arrangement shown here is preferred. In cases with a smaller extension distance, a two element (i.e., support arm and end effector, without the intervening slider) arrangement may be preferred.

The actuator arm mechanism, which includes components 4406-4410, is attached to the end effector in either the two- or three-element telescoping arrangements. In the example shown here, slider 4440 is not directly connected to an actuator—the motion of slider 4440 is due to physical stops (not shown) within the bearings connecting support arm 4411 to slider 4440 and the bearings connecting slider 4440 to end effector 4403. Physical stops within sliding bearings are familiar to those skilled in the art. FIGS. 51A-B, below, illustrate an alternative extension drive mechanism wherein both the end effector and the intervening slider are actively driven by the rotor mechanism.

Dual Wafer Robot at Process Modules

Figure 46:
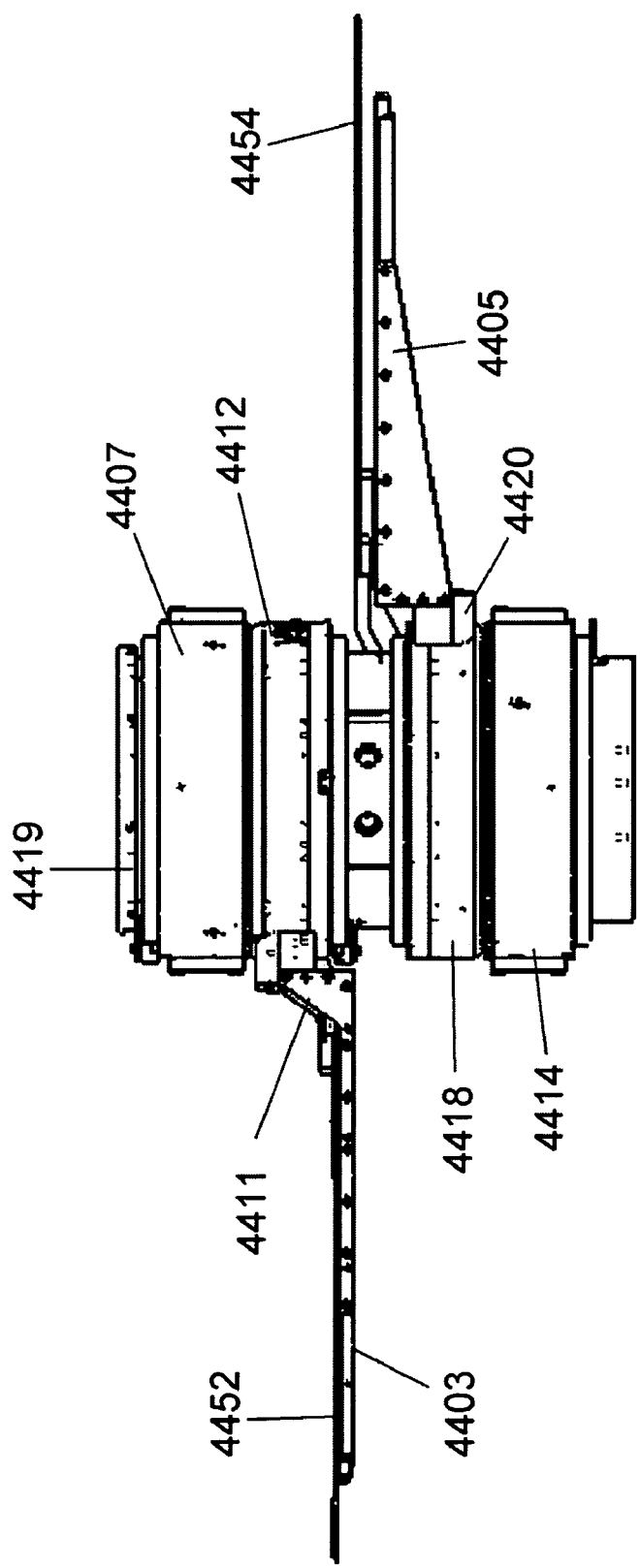
FIG. 46 is a side view of a dual wafer robot configured in accordance with an embodiment of the present invention and showing two end effectors (each carrying a single wafer) oriented 180° azimuthally with respect to one another around the robot's rotational axis, where both end effectors are fully retracted.

FIG. 46 is a side view of the dual wafer robot, shown in FIGS. 44A-45. Note that in this embodiment of the present invention, wafers 4452 and 4454 are not at the same height. If the individual process modules require wafer insertion at the same height, then wafer insertion may be asynchronous, with an intervening collective Z-motion (see FIG. 21) to reposition the second end effector to the same height that the first end effector previously had when inserting a wafer.

Rotors with Independent Ring Bearings

Figure 47:
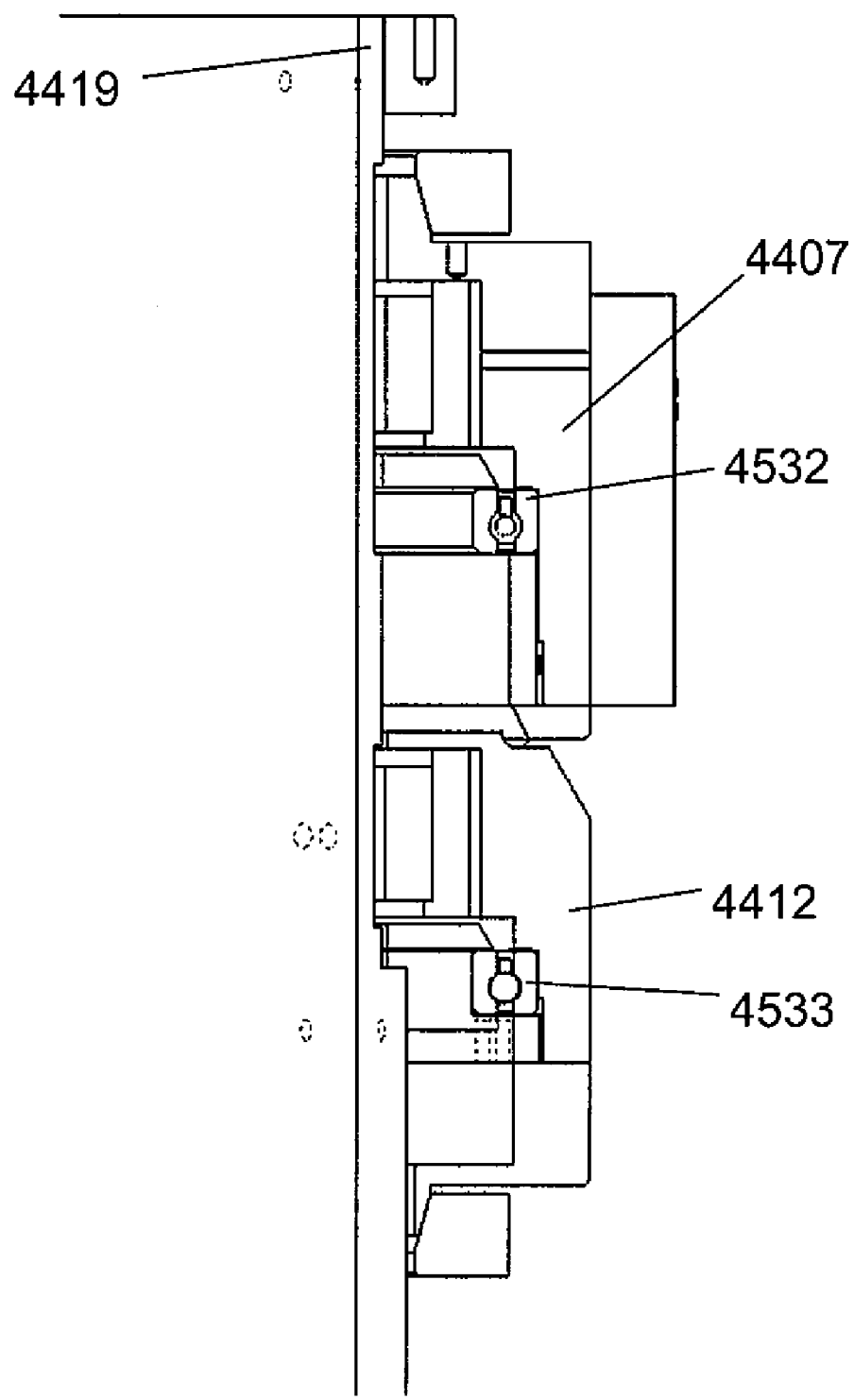
FIG. 47 is a schematic side cross-sectional view of a single robot actuator configured in accordance with another embodiment of the present invention.

FIG. 47 is a schematic side cross-sectional view of a single robot actuator configured in accordance with yet another embodiment of the present invention. In this example, as for the example described immediately above, there is no cam-driven mechanism for asynchronous and independent Z-motions (FIG. 20)—the only Z-motions are collective motions as discussed with reference to FIG. 21.

The difference between the present example and the example discussed immediately above is that in the example discussed above, the two rotors for a single robot actuator were tied together by a ring bearing (see bearing 2532 in FIG. 19), while in this example, each rotor is tied directly to the support tube 4419 and there is no bearing between the two rotors of a single robot actuator. Upper rotor 4407 is supported by ring bearing 4532. The inner race of ring bearing 4532 is rigidly clamped to the wall 4419 of the central tube. The outer race of ring bearing 4532 is clamped to rotor 4407. Lower rotor 4412 is supported by ring bearing 4533. The inner race of ring bearing 4533 is rigidly clamped to the wall 4419 of the central tube. The outer race of ring bearing 4533 is clamped to rotor 4412.

Figure 48:
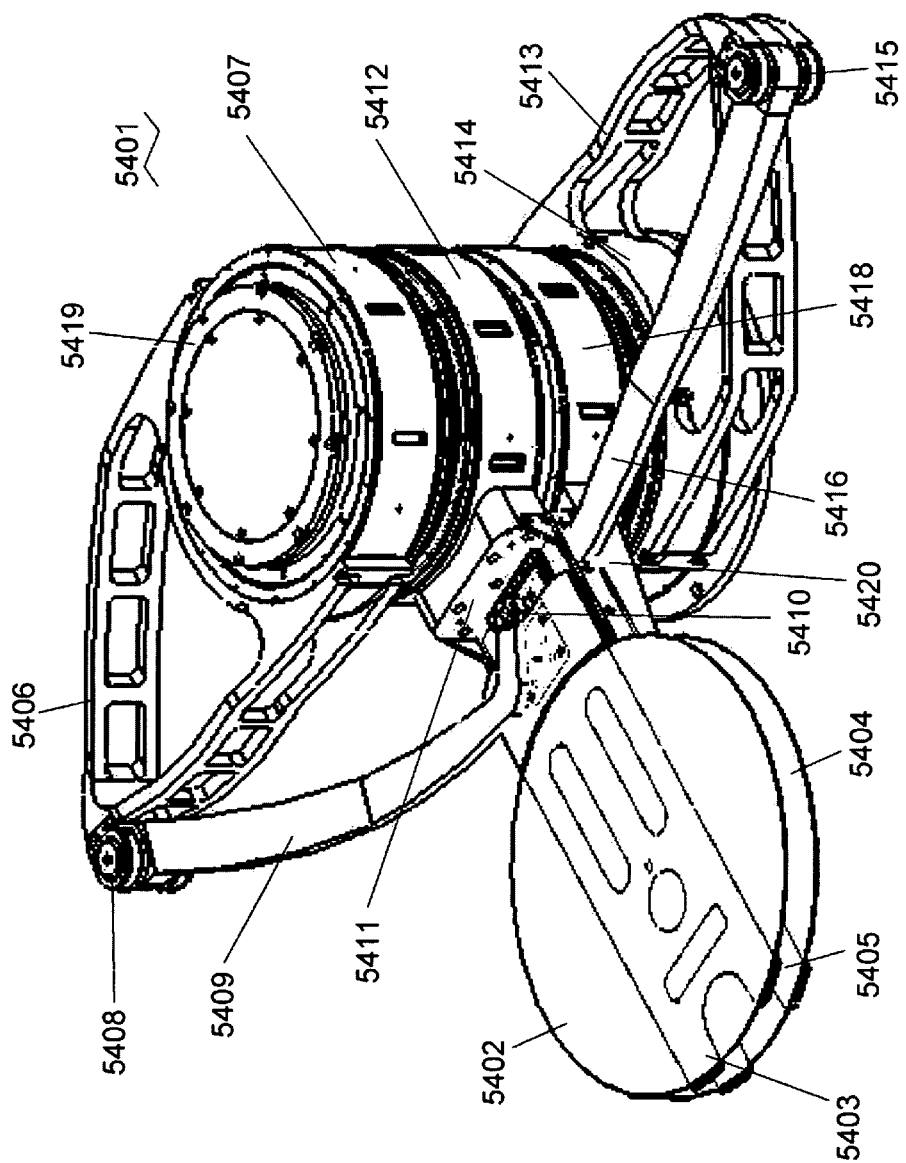
FIG. 48 is an isometric view of a dual wafer robot configured in accordance with an embodiment of the present invention and showing two end effectors (each carrying a single wafer) in an above and below arrangement on one side of the robot's rotational axis, where both end effectors are fully retracted.

FIG. 48 is an isometric view of a dual wafer robot 5401 configured with the features presently being discussed and showing two wafers 5402 and 5404, supported by end effectors 5403 and 5405, respectively. Wafers 5402 and 5404 have been positioned by end effectors 5403 and 5405, respectively, in an above and below configuration, suitable for simultaneous (or near simultaneous) loading of wafers 5402 and 5404 into a pass-through module (not shown). Upper end effector 5403 is supported by support arm 5411 attached to rotor 5412. Actuator arm 5406 is attached to rotor 5407, and is connected through pivot 5408 to outer arm 5409. Outer arm 5409 is connected to end effector 5403 through pivot 5410. Lower end effector 5405 is supported by support arm 5420 that is attached to rotor 5418. Actuator arm 5413 is attached to rotor 5414, and is connected through pivot 5415 to outer arm 5416. Outer arm 5416 is connected to end effector 5405 through a pivot (not shown) which is equivalent to pivot 5410. Details on the extension of the end effectors are provided in connection with the discussion of FIG. 12, above.

FIG. 48 illustrates the dual wafer robot 5401 with both end effectors fully retracted—this is the configuration in which the end effectors 5403 and 5405 may rotate. The rotors 5407, 5412, 5414, and 5418 rotate around the central fixed tube 5419 which forms part of the transfer chamber (not shown—see, e.g., chambers 1105 and 1110 in FIGS. 2A-B).

Rotors with Two Independent Ring Bearings

Figure 49:
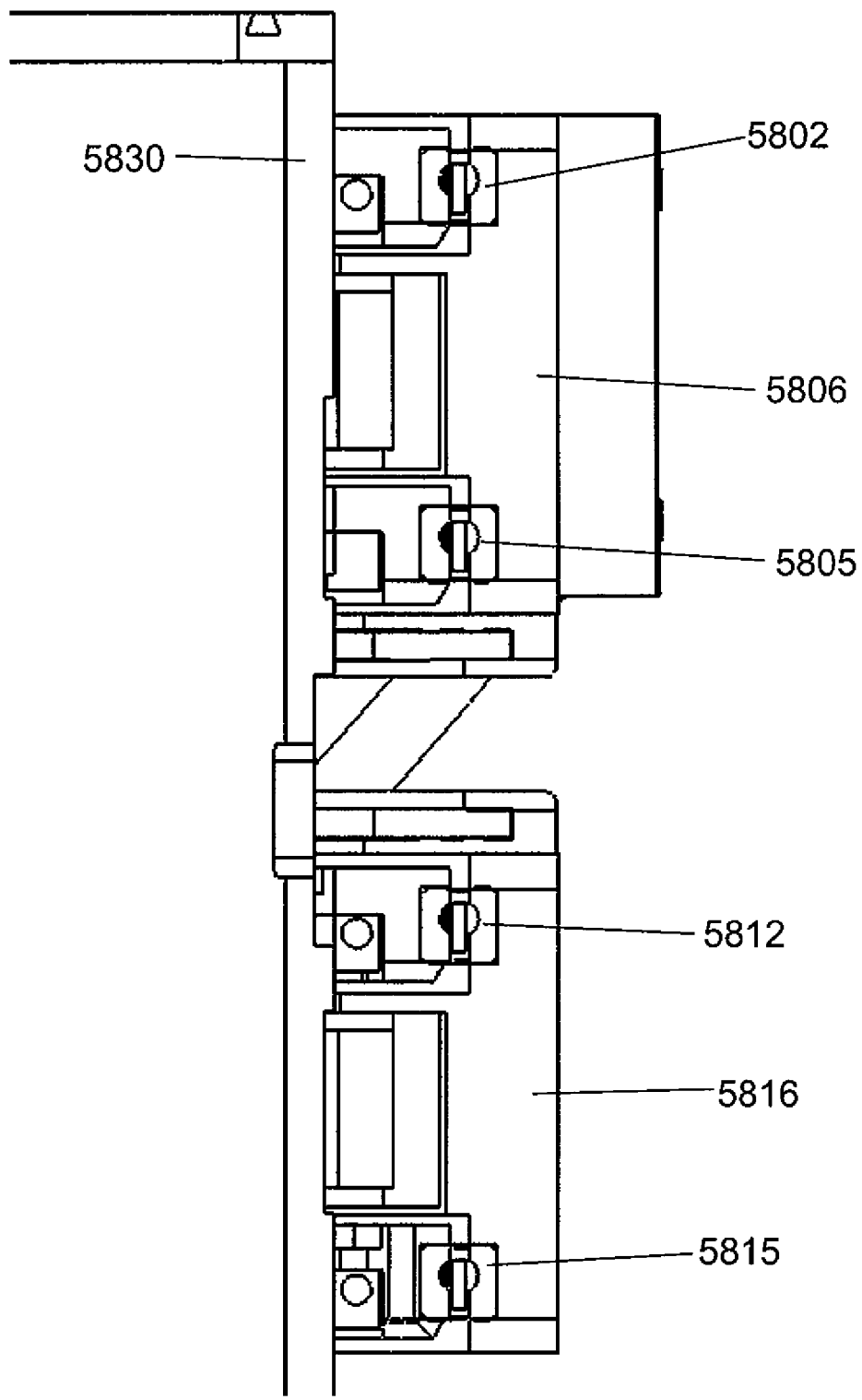
FIG. 49 is a schematic side cross-sectional view of a single robot actuator configured in accordance with still another embodiment of the present invention.

FIG. 49 is a schematic side cross-sectional view of a single robot actuator in accordance still another embodiment of the present invention. In this example, as for the two discussed immediately above, there is no cam-driven mechanism for asynchronous and independent Z-motions (FIG. 20)—the only Z-motions are collective motions as illustrated in FIG. 21. The difference between the immediately preceding example and the present example is that in the former, a single ring bearing guided the rotation of each rotor; in the present case, however, the rotation of each rotor is guided by a pair offing bearings. This arrangement has the advantage of improved rotational stability for each rotor, but at the added cost of a larger number of bearings per robot.

As shown in the diagram, upper rotor 5806 is supported by ring bearings 5802 and 5805. The inner races of ring bearings 5802 and 5805 are rigidly clamped to the wall 5830 of the central tube. The outer races of ring bearings 5802 and 5805 are clamped to rotor 5806. Lower rotor 5816 is supported by ring bearings 5812 and 5815. The inner races of ring bearings 5812 and 5815 are rigidly clamped to the wall 5830 of the central tube. The outer races of ring bearings 5812 and 5815 are clamped to rotor 5816.

Operation of the End Effector Actuator

Figure 50:
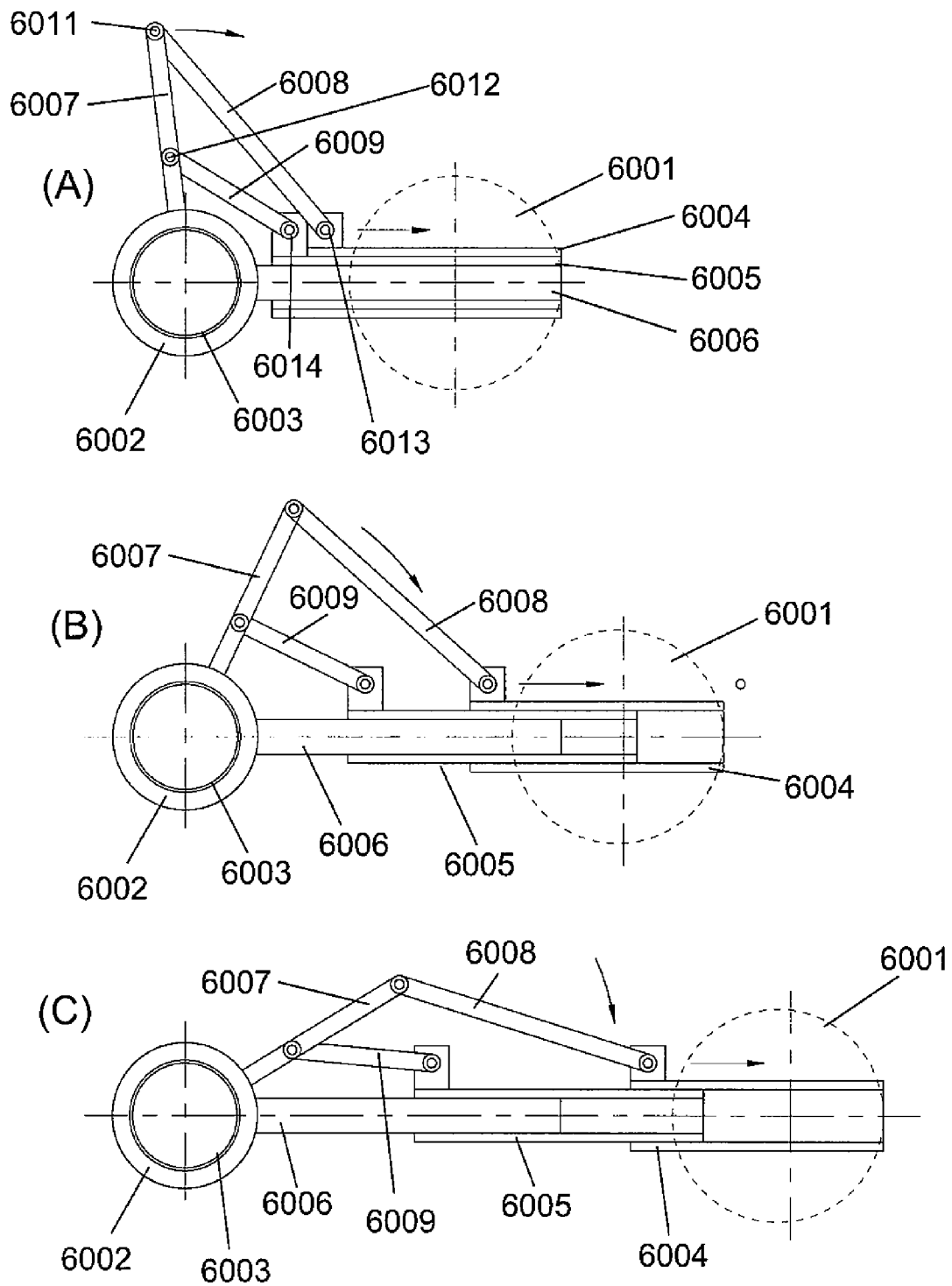
FIG. 50 is a schematic top view of a single robot end effector actuator assembly configured in accordance with yet a further embodiment of the present invention and showing the end effector in three positions: (A) fully retracted, (B) partially extended, and (C) fully extended.

FIG. 50 is a schematic top view of a single robot end effector actuator assembly configured in accordance with yet another embodiment of the present invention, showing the end effector in three positions: (A) fully retracted, (B) partially extended, and (C) fully extended. One difference between the end effector actuator described above in connection with FIG. 12 and the embodiment shown here is the added actuator arm connected to the slider. In the example described with reference to FIG. 12, the slider is moved only by contact with the end effector. This has the potential for particle generation during end effector extension and retraction. The example shown in FIG. 50 avoids this possibility by moving the slider actively (not passively as in the example shown in FIG. 12), thus greatly reducing the potential for vibration or particle generation since there is no impact between the slider and the end effector during the extension and retraction of the end effector.

In view (A), end effector 6004, carrying wafer 6001, is fully retracted into the position for rotation of the end effector 6004 and wafer 6001. End effector 6004 is attached to slider 6005 by a first linear bearing (not shown). Slider 6005 is attached to support arm 6006 by a second linear bearing (not shown). Linear bearings may be metal or ceramic ball bearings and/or magnetically-levitated bearings, as is familiar to those skilled in the art.

Actuator arm 6007 is attached to rotor 6002 and coupled to outer arm 6008 through pivot 6011. Outer arm 6008 is connected to end effector 6004 through pivot 6013. Actuator arm 6007 is also attached to middle arm 6009 through pivot 6012. Middle arm 6009 is connected to slider 6005 through pivot 6014. Rotor 6002 turns around central tube 6003. Actuator arm 6007 is starting to turn clockwise as shown by the arrow, causing end effector 6004 to begin extending as shown by the arrow on wafer 6001.

In view (B), end effector 6004, carrying wafer 6001, is shown partially extended. Actuator arm 6007 has rotated clockwise, driving outer arm 6008 to push end effector 6004 outwards. Simultaneously, middle arm 6009 has pushed slider 6005 roughly half as far out as end effector 6004 has moved. During the extension operation, the rotor 6109 (see FIG. 51) connected to support arm 6006 does not turn.

In view (C), end effector 6004 is fully extended, positioning wafer 6001 in either a process module or a pass-through module (not shown).

Figure 51:
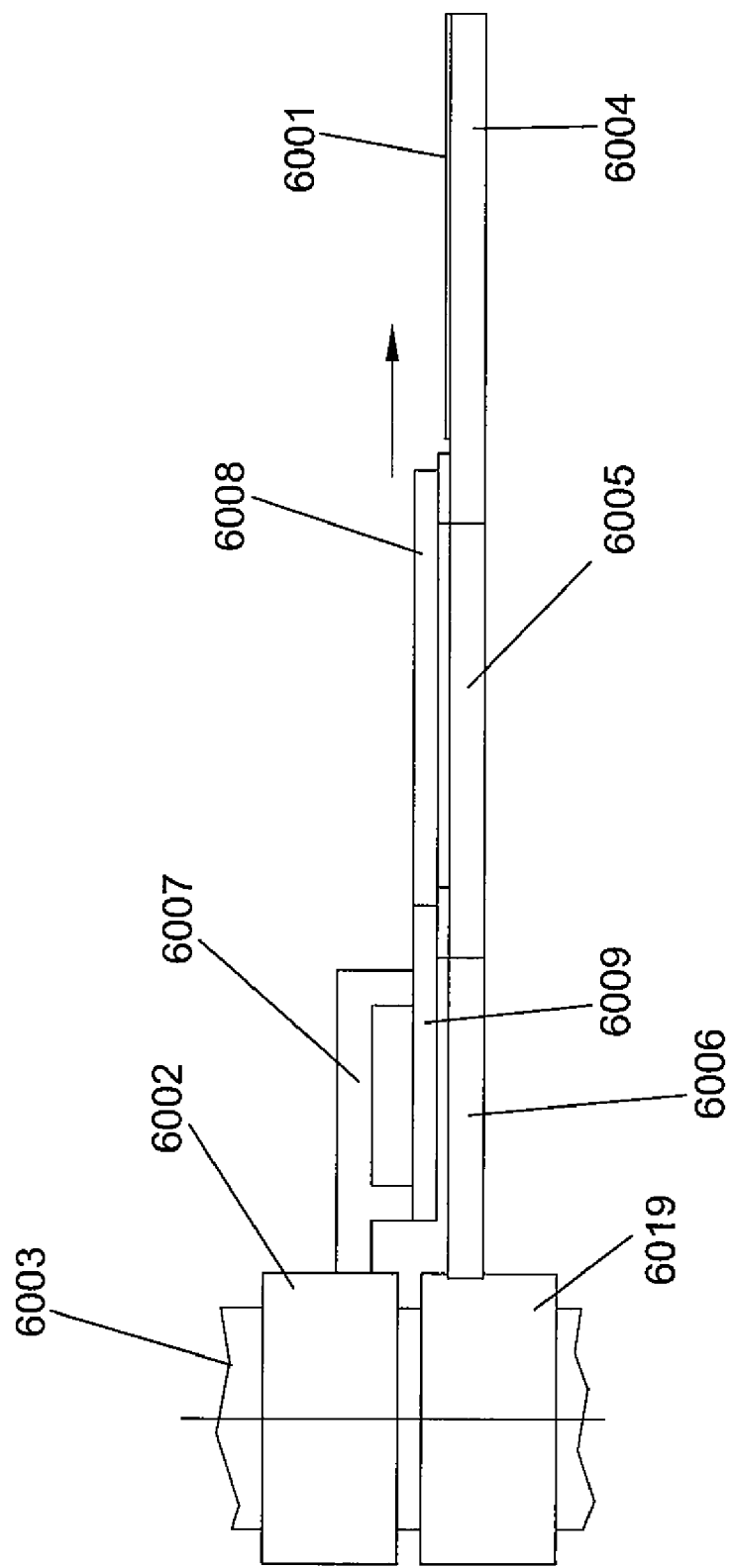
FIG. 51 is a side view of the single robot end effector actuator shown in FIG. 50, showing the end effector fully extended.

FIG. 51 is a side view of the single robot end effector actuator shown in FIG. 50 view (C), showing the end effector 6004 (carrying wafer 6001) fully extended. The rotor 6109 connected to support arm 6006 can be seen.

Operation of the Dual End Effector Actuator

Figure 52A:
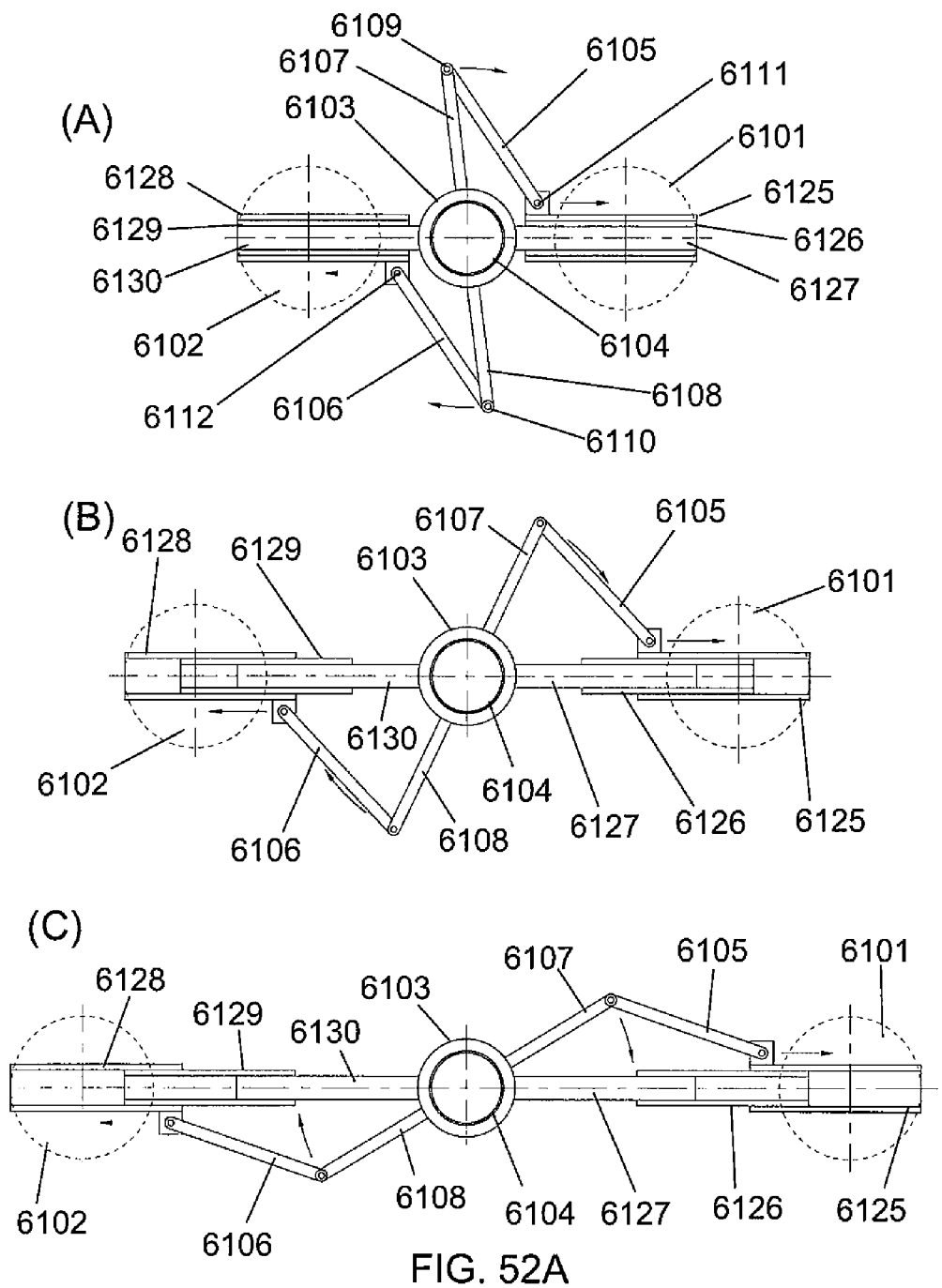
FIG. 52A is a schematic top view of a single robot dual end effector actuator assembly configured in accordance with still another embodiment of the present invention, wherein the wafer insertion directions are oriented 180° azimuthally with respect to one another, and showing the dual end effector in three positions: (A) fully retracted, (B) partially extended, and (C) fully extended.

FIG. 52A is a schematic top view of a single robot dual end effector actuator assembly configured in accordance with still another embodiment of the present invention, showing the dual end effector in three positions: (A) fully retracted, (B) partially extended, and (C) fully extended. One difference between this present example and previously discussed examples is the capability for simultaneous loading/unloading of two wafers with one robot actuator.

In view (A), end effector 6125 carrying wafer 6101, and end effector 6128 carrying wafer 6102, are both fully retracted into the positions for rotation of the end effectors 6125 and 6128. End effector 6125 is attached to slider 6126 by a first linear bearing (not shown). Slider 6126 is attached to support arm 6127 by a second linear bearing (not shown). End effector 6128 is attached to slider 6129 by a third linear bearing (not shown). Slider 6129 is attached to support arm 6130 by a fourth linear bearing (not shown). Linear bearings may be metal or ceramic ball bearings and/or magnetically-levitated bearings, as is familiar to those skilled in the art.

Actuator arm 6107 is attached to rotor 6103 and coupled to outer arm 6105 through pivot 6109. Outer arm 6105 is connected to end effector 6125 through pivot 6111. Actuator arm 6108 is also attached to rotor 6103 and is coupled to outer arm 6106 through pivot 6110. Outer arm 6106 is connected to end effector 6128 through pivot 6112. Rotor 6103 turns around central tube 6104. Actuator arms 6107 and 6108 are starting to turn clockwise as shown by the curved arrows, causing end effectors 6125 and 6128 to begin extending as shown by the arrows on wafers 6101 and 6102.

In view (B), end effectors 6125 and 6128, carrying wafers 6101 and 6102, respectively, are shown partially extended. Actuator arm 6107 has rotated clockwise, driving outer arm 6105 to push end effector 6125 radially outwards. Simultaneously, actuator arm 6108 has rotated clockwise, driving outer arm 6106 to push end effector 6128 radially outwards. During the extension operation, the rotor 6132 (see FIG. 52B) connected to support arms 6127 and 6130 does not turn.

In view (C), end effectors 6125 and 6128 are fully extended, positioning wafers 6101 and 6102 in either process modules or pass-through modules (not shown).

Figure 52B:
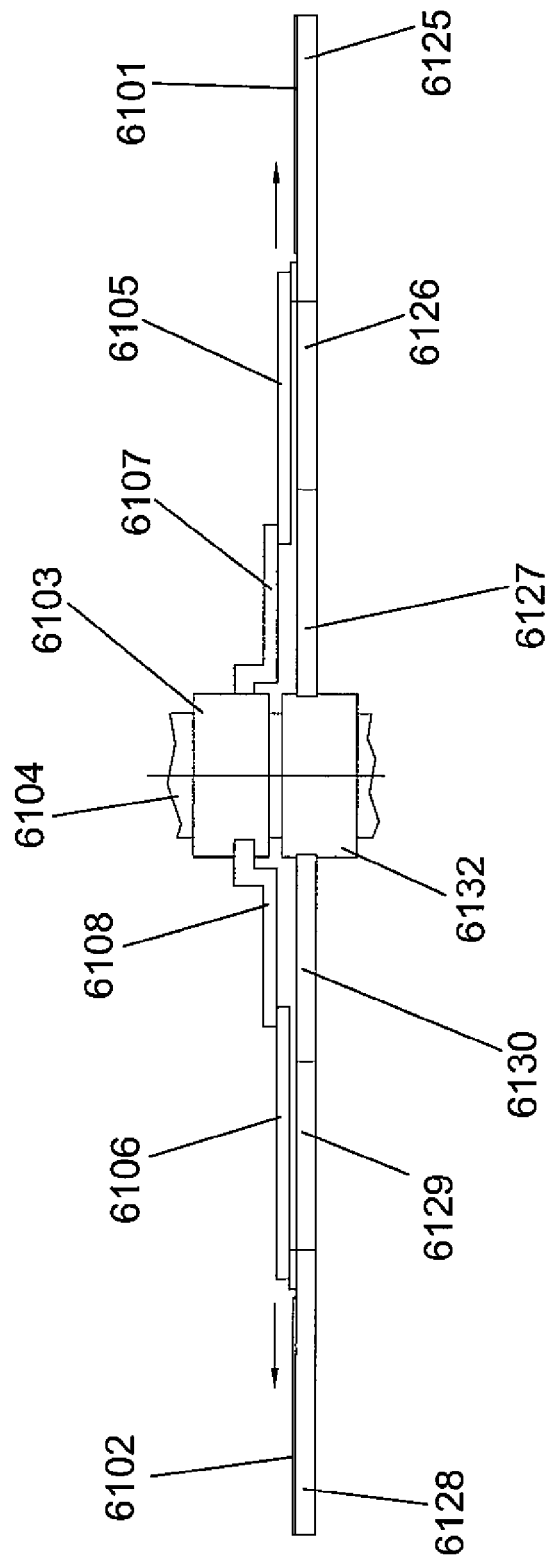
FIG. 52B is a side view of the single robot dual end effector actuator illustrated in FIG. 52A and showing the dual end effector fully extended, with a cutaway view of an actuator motor.

FIG. 52B is a side view of the single robot dual end effector actuator shown in FIG. 52A view (C), showing the end effector 6125 (carrying wafer 6101) and the end effector 6128 (carrying wafer 6102) both fully extended. Rotor 6132 connected to support arms 6127 and 6130 is shown.

Operation of the Dual End Effector Actuator

Figure 53:
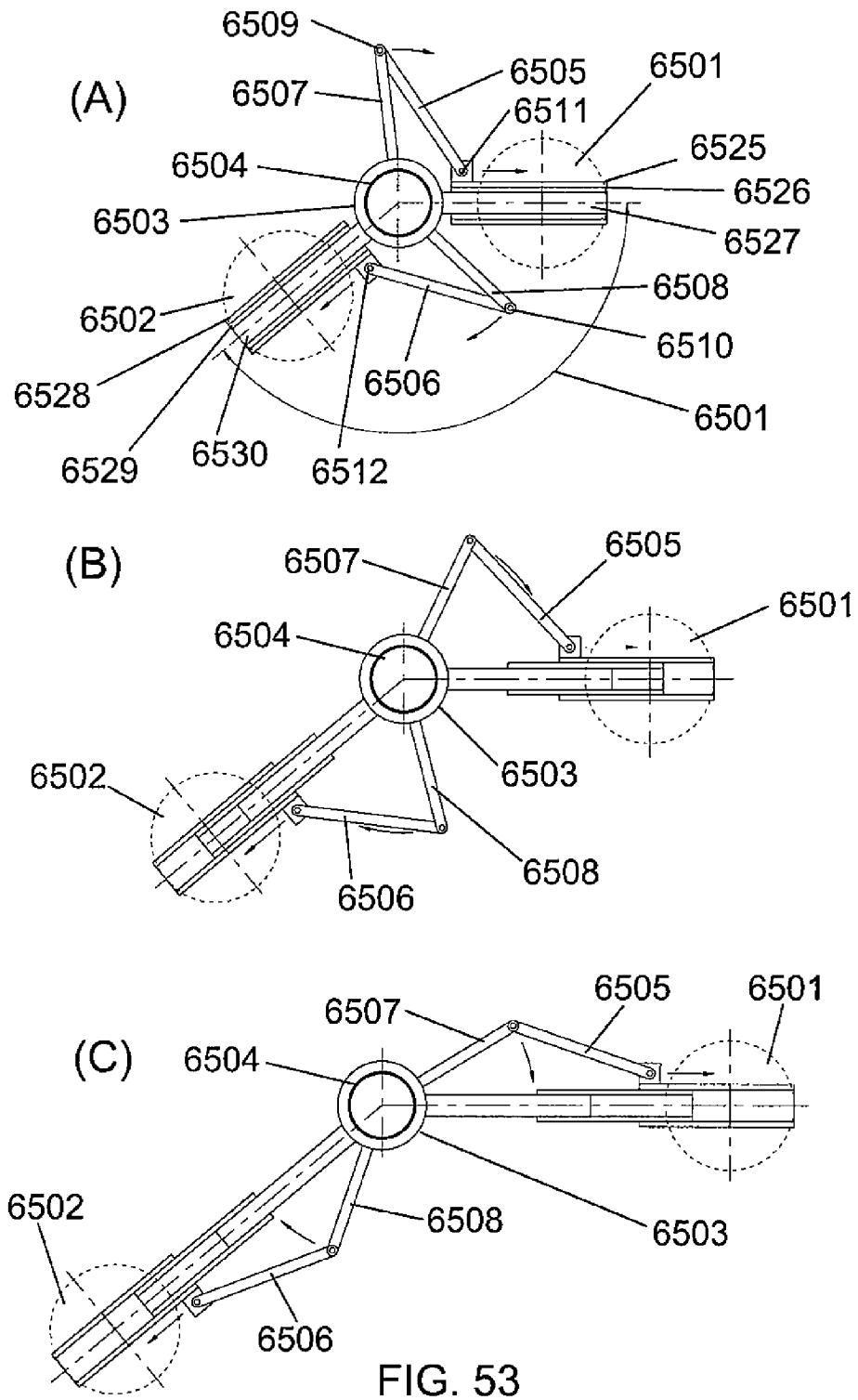
FIG. 53 is a schematic top view of a single robot dual end effector actuator assembly configured in accordance with a further embodiment of the present invention, wherein the wafer insertion directions are not oriented 180° azimuthally with respect to one another, and showing the dual end effector in three positions: (A) fully retracted. (B) partially extended, and (C) fully extended.

FIG. 53 is a schematic top view of a single robot end dual effector actuator assembly in accordance with yet a further embodiment of the present invention, showing the dual end effector in three positions: (A) fully retracted, (B) partially extended, and (C) fully extended. One difference between this present embodiment and the embodiment discussed immediately above is the orientation of the end effectors—in the present case, the angle between the end effectors is not 180°.

In view (A), end effector 6525 carrying wafer 6501, and end effector 6528 carrying wafer 6502, are both fully retracted into the positions for rotation of the end effectors 6525 and 6528—note that in this example, it is not necessary for the support arms 6527 and 6530 to be oriented on directly opposite sides of the central tube 6504. End effector 6525 is attached to slider 6526 by a first linear bearing (not shown). Slider 6526 is attached to support arm 6527 by a second linear bearing (not shown). End effector 6528 is attached to slider 6529 by a third linear bearing (not shown). Slider 6529 is attached to support arm 6530 by a fourth linear bearing (not shown). Linear bearings may be metal or ceramic ball bearings and/or magnetically-levitated bearings, as is familiar to those skilled in the art.

Actuator arm 6507 is attached to rotor 6503 and coupled to outer arm 6505 through pivot 6509. Outer arm 6505 is connected to end effector 6525 through pivot 6511. Actuator arm 6508 is also attached to rotor 6503 and is coupled to outer arm 6506 through pivot 6510. Outer arm 6506 is connected to end effector 6528 through pivot 6512. Rotor 6503 turns around central tube 6504. Actuator arms 6507 and 6508 are starting to turn clockwise as shown by the curved arrows, causing end effectors 6525 and 6528 to begin extending as shown by the arrows on wafers 6501 and 6502.

In view (B), end effectors 6525 and 6528, carrying wafers 6501 and 6502, respectively, are shown partially extended. Actuator arm 6507 has rotated clockwise, driving outer arm 6505 to push end effector 6525 radially outwards. Simultaneously, actuator arm 6508 has rotated clockwise, driving outer arm 6506 to push end effector 6528 radially outwards. During the extension operation, the rotor (not shown) connected to support arms 6527 and 6530 does not turn.

In view (C), end effectors 6525 and 6528 are fully extended, positioning wafers 6501 and 6502 in either process modules or pass-through modules (not shown).

Operation of the Dual End Effector Actuator

Figure 54A:
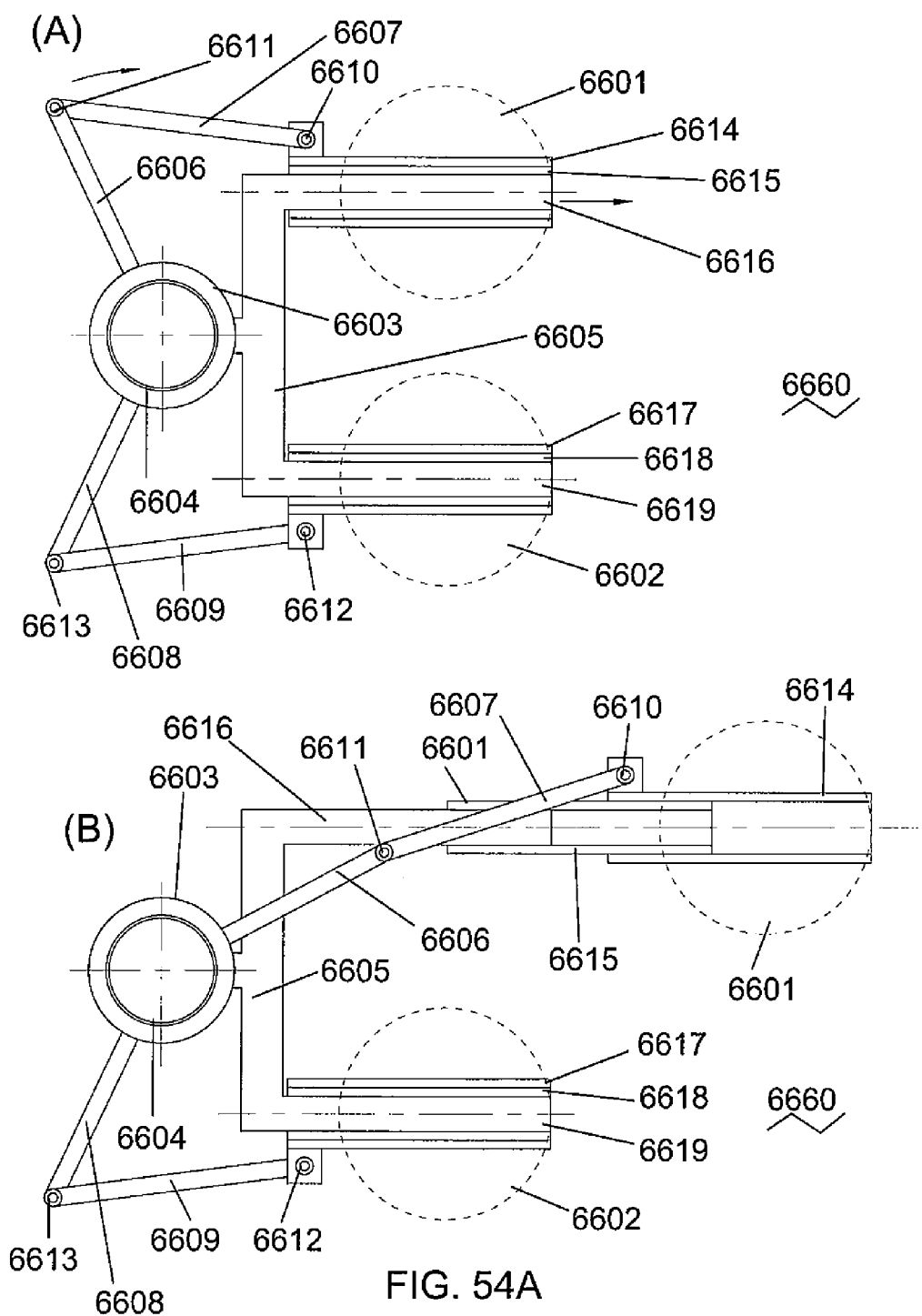
FIG. 54A is a schematic top view of a single robot dual end effector actuator assembly configured in accordance with yet a further embodiment of the present invention, wherein the wafer insertion directions are in tandem but where the insertion processes may be asynchronous, and showing the dual end effector in two positions: (A) both fully retracted, and (B) one fully extended while the other is fully retracted.

FIG. 54A is a schematic top view of a single robot dual end effector actuator assembly 6660 in accordance with still another embodiment of the present invention, wherein the wafer insertion directions are in tandem but where the insertion processes may be asynchronous, showing the dual end effector in two positions: (A) both wafers fully retracted, and (B) one wafer is fully extended while the other wafer is fully retracted.

In view (A), end effector 6614 carrying wafer 6601, and end effector 6617 carrying wafer 6602, are both fully retracted into the positions for rotation of the end effectors 6614 and 6617. End effector 6614 is attached to slider 6615 by a first linear bearing (not shown). Slider 6615 is attached to support arm 6616 by a second linear bearing (not shown). End effector 6617 is attached to slider 6618 by a third linear bearing (not shown). Slider 6618 is attached to support arm 6619 by a fourth linear bearing (not shown). Linear bearings may be metal, or ceramic ball bearings and/or magnetically-levitated bearings, as is familiar to those skilled in the art.

Actuator arm 6606 is attached to rotor 6603 and coupled to outer arm 6607 through pivot 6611. Outer arm 6607 is connected to end effector 6614 through pivot 6610. Actuator arm 6608 is attached to rotor 6654 (see FIG. 54B) and is coupled to outer arm 6609 through pivot 6613. Outer arm 6609 is connected to end effector 6617 through pivot 6612. Rotors 6603 and 6654 turn around central tube 6604. Actuator arm 6606 is starting to turn clockwise as shown by the curved arrow, causing end effector 6614 to begin extending as shown by the arrow on wafer 6601. Actuator arm 6608 is not rotating, thus end effector 6617 is remaining at the fully retracted position—this demonstrates the fully independent and asynchronous operation of the two end effectors 6614 and 6617.

In view (B), end effector 6614, carrying wafer 6601, is shown fully extended. Actuator arm 6606 has rotated clockwise, driving outer arm 6607 to push end effector 6614 outwards. Actuator arm 6608 has not moved, thus end effector 6617, carrying wafer 6602, remains fully retracted. During the extension operation, the rotor 6653 (see FIG. 54B) connected to support arms 6616 and 6619 through cross-member 6605 does not turn.

Figure 54B:
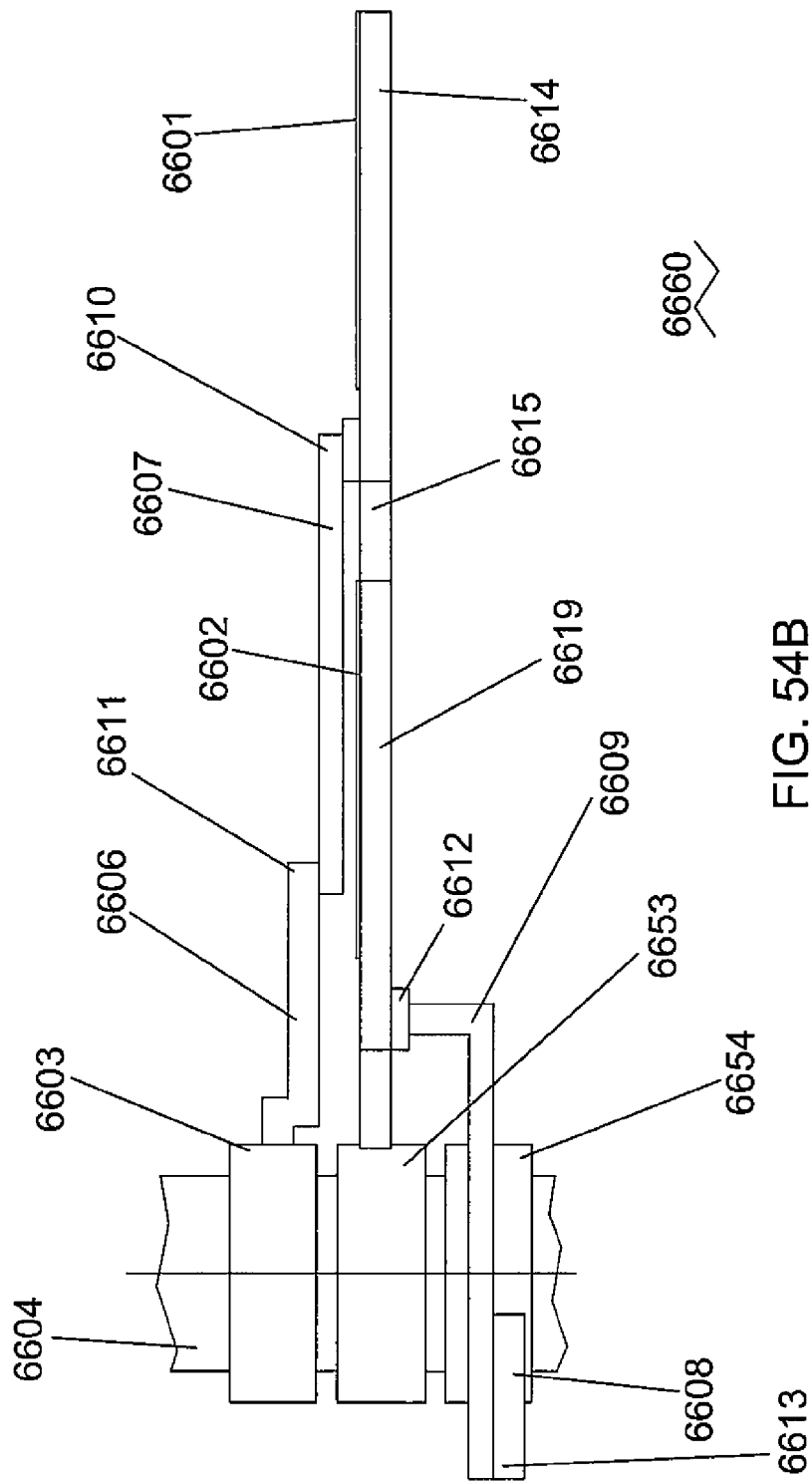
FIG. 54B is a side view of the single robot dual end effector actuator illustrated in FIG. 54A, showing the wafer positions in view (B) of FIG. 54A.

FIG. 54B is a side view of the single robot dual end effector actuator shown in FIG. 54A view (B), showing the end effector 6614 (carrying wafer 6601) fully extended, and end effector 6617 (carrying wafer 6602) fully retracted. Rotor 6653 connected to support arms 6616 and 6619 through cross-member 6605 is shown. Rotor 6654 connected to actuator arm 6608 is at the bottom.

Figure 55:
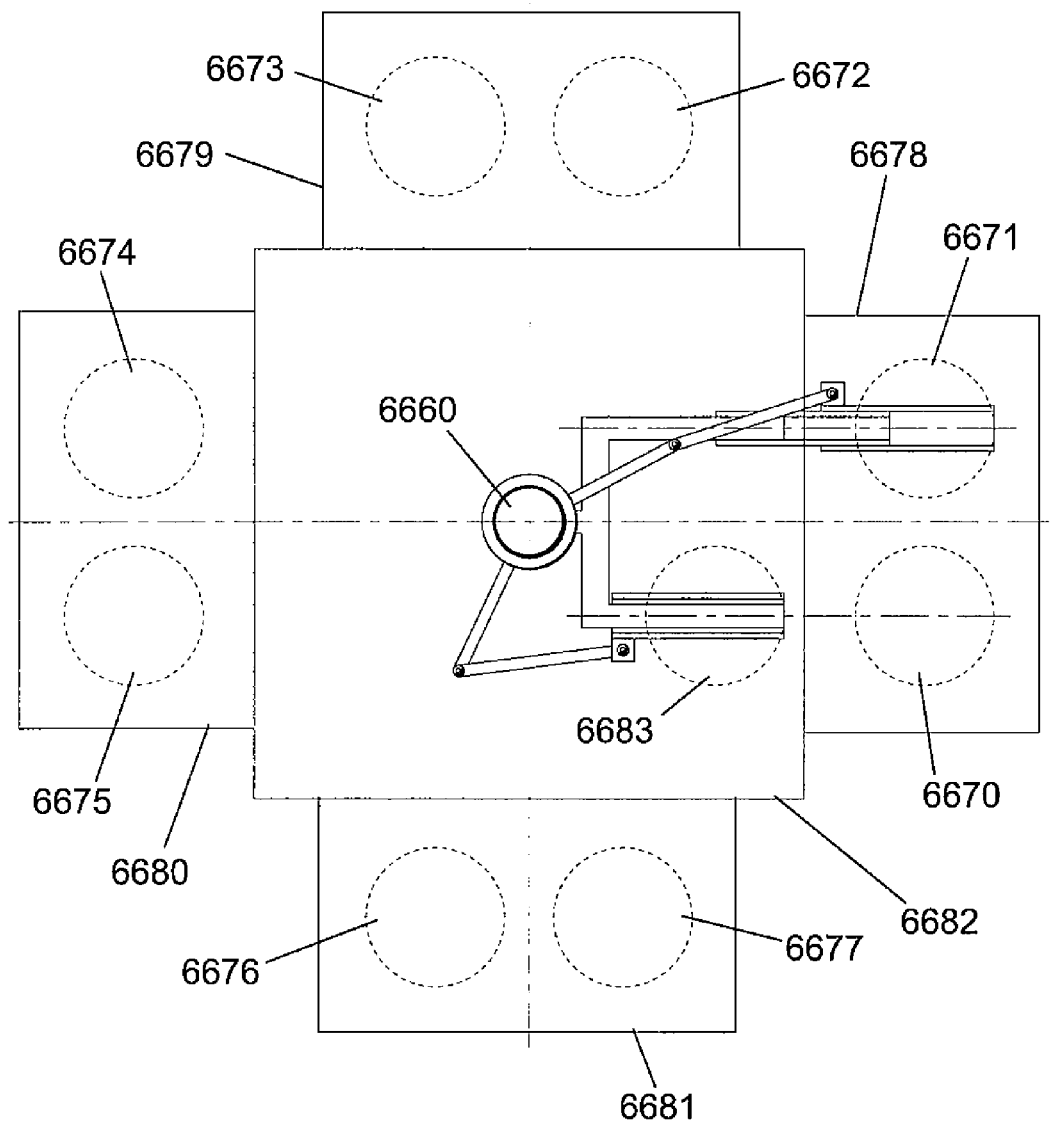
FIG. 55 is a top schematic view of the single robot dual end effector illustrated in FIGS. 54A-B, showing the robot operation illustrated in view (B) of FIG. 54A in a four process chamber system.

FIG. 55 is a top schematic view of the single robot dual end effector actuator assembly 6660 shown in FIGS. 54A-B, showing the robot operation illustrated in view (B) of FIG. 54A in a four process chamber system. Central chamber 6682 contains the robot assembly 6660. Around chamber 6682, four process modules or loadlocks 6678-6681 are connected. There are two wafer positions for processing within each of chambers 6678-6681: positions 6670-6671 in chamber 6678, positions 6672-6673 in chamber 6679, positions 6674-6675 in chamber 6680, and positions 6676-6677 in chamber 6681. The independent and asynchronous operation of the dual end effector robot can be seen in this figure: a wafer has been loaded into position 6671 in chamber 6678, while the wafer in position 6670 remains unchanged.

Thus, systems and methods for wafer or other substrate processing, handling and/or transport have been described. Although discussed with reference to certain illustrated embodiments, the present invention should not be limited thereby. For example, in connection with various ones of the examples discussed above the illustrative figures have shown the actuation mechanism with a single outer arm and no middle arm. This need not necessarily be so. In some cases, although shown without such a middle arm, embodiments of the invention may be configured with such a middle arm. The use of such a middle arm provides the advantage of potential reductions in particle generation and lower vibration. The disadvantage of this slightly more complex actuator mechanism is increased cost and complexity. Further, various of the embodiments of the present invention may utilize any of the rotor configurations described above. The potential advantages of the different rotor configurations may, in some cases, simplify the assembly of the robot, actuator mechanism, especially in cases where each rotor is mechanically independent (except for the coupling through the various actuator arms). Hence, the present invention should only be measured in terms of the claims, which follow.

What is claimed is:

1. A robot assembly for transferring substrates, comprising:
   a central tube assembly oriented along a central axis and having an inner surface that forms part of a first enclosure at a first pressure, and an outer surface that forms part of a second enclosure at a second pressure, said second pressure being generally different from said first pressure, said central tube assembly supporting stator assemblies of first and second brushless motor assemblies within the first enclosure;
   a substrate transfer plane, perpendicular to the central axis of said central tube assembly; and
   a first transfer robot including:
      a first rotor assembly, configured to rotate parallel to said transfer plane concentrically with said outer surface of said central tube assembly, said first rotor assembly including a rotor portion of the first brushless motor assembly located within the second enclosure;
      a second rotor assembly, configured to rotate parallel to said transfer plane concentrically with said outer surface of said central tube assembly and positioned above said first rotor assembly, said second rotor assembly including a rotor portion of the second brushless motor assembly located within the second enclosure;
      a first support arm, rigidly attached to said first rotor assembly and extending radially outwards from said first rotor assembly;
      a first slider, supported by said first support arm and configured to move in a generally radial direction along a length of said first support arm;
      a first end effector, supported by said first slider and configured to move in a generally radial direction along a length of said first slider;
      a first inner actuator arm, having an inner end and an outer end, said inner end being rigidly attached to said second rotor assembly; and
      a first outer actuator arm, having a first end and a second end, wherein said first end is coupled to said outer end of said first inner actuator arm by a first bearing, said first bearing enabling said first outer actuator arm to rotate around an axis of said first bearing parallel to said transfer plane; and said second end is coupled to said first end effector by a second bearing, said second bearing enabling said first outer actuator arm to rotate around an axis of said second bearing parallel to said transfer plane;
   wherein a motor control system is configured for rotating the first rotor assembly and the second rotor assembly in the same direction and speed to produce a first axis motion for both the first and second rotor assemblies, and wherein the motor control system is configured for rotating the first rotor assembly and the second rotor assembly at different speeds and directions to produce a second axis motion for both the first and second rotor assemblies.

2. The robot assembly of claim 1, wherein said first rotor assembly is mounted on said central tube assembly by first bearing means, and said second rotor assembly is mounted on said first rotor assembly by second bearing means.

3. The robot assembly of claim 1, wherein said first rotor assembly is mounted on said central tube assembly by first bearing means, and said second rotor assembly is mounted on said central tube assembly by second bearing means.

4. The robot assembly of claim 1, wherein said first rotor assembly is mounted on said central tube assembly by a first multiplicity of bearing means, and said second rotor is mounted on said central tube assembly by a second multiplicity of bearing means.

5. The robot assembly of claim 4, wherein said first multiplicity of bearing means is two, and said second multiplicity of bearing means is two.

6. The robot assembly of claim 1, wherein said first rotor assembly further comprises a first motor rotor assembly, said first motor rotor assembly including a first multiplicity of permanent magnets attached to a first flux return ring, wherein said first multiplicity of permanent magnets are arranged in alternating North pole and South pole orientations radially inwards; and said second rotor assembly further comprises a second motor rotor assembly, said second motor rotor assembly including a second multiplicity of permanent magnets attached to a second flux return ring, wherein said second multiplicity of permanent magnets are arranged in alternating North pole and South pole orientations radially.

7. The robot assembly of claim 6, wherein said central tube assembly further comprises:
- a first stator positioned generally in a first common plane with said first motor rotor assembly and inside said first enclosure, said first stator including a first multiplicity of pole faces oriented radially outwards towards said first multiplicity of permanent magnets; and
- a second stator positioned generally in a second common plane with said second motor rotor assembly and inside said first enclosure, said second stator including a second multiplicity of pole faces oriented radially outwards towards said second multiplicity of permanent magnets.

8. The robot assembly of claim 7 wherein said first stator and said second stator are electrically connected to the motor control system configured to vary magnetic field excitations of (i) said first multiplicity of pole faces in said first stator, wherein said varying magnetic field excitations of said first multiplicity of pole faces induce rotation of said first rotor assembly; and (ii) said second multiplicity of pole faces in said second stator, wherein said varying magnetic field excitations of said second multiplicity of pole faces induce rotation of said second rotor assembly.

9. The robot assembly of claim 1 further comprising a first middle actuator arm, having a first end and a second end, wherein
- said first end of said first middle actuator arm is coupled to said first inner actuator arm at a location on said first inner actuator arm approximately halfway between said inner and outer ends of said first inner actuator arm by a third bearing, said third bearing enabling said first middle actuator arm to rotate around an axis of said third bearing parallel to said transfer plane; and
- said second end of said first middle actuator arm is coupled to said first slider by a fourth bearing, said fourth bearing enabling said first middle actuator arm to rotate around an axis of said fourth bearing parallel to said transfer plane.

10. The robot assembly of claim 1, further comprising a second transfer robot comprising:
- a third rotor assembly, configured to rotate parallel to said transfer plane concentrically with said outer surface of said central tube assembly;
- a fourth rotor assembly, configured to rotate parallel to said transfer plane concentrically with said outer surface of said central tube assembly and positioned below said third rotor assembly;
- a second support arm, rigidly attached to said third rotor assembly and extending radially outwards from said third rotor assembly;
- a second slider, supported by said second support arm and configured to move in a generally radial direction along a length of said second support arm;
- a second end effector, supported by said second slider and configured to move in a generally radial direction along a length of said second slider;
- a second inner actuator arm, having an inner end and an outer end, said inner end of said second inner actuator arm being rigidly attached to said fourth rotor assembly;
- a second outer actuator arm, having a first end and a second end, wherein said first end of said second outer arm is coupled to said outer end of said second inner actuator arm by a third bearing, said third bearing enabling said second outer actuator arm to rotate around an axis of said third bearing parallel to said transfer plane; and said second end of said second outer arm is coupled to said second end effector by a fourth bearing, said fourth bearing enabling said second outer actuator arm to rotate around an axis of said fourth bearing parallel to said transfer plane.

11. The robot assembly of claim 10, wherein said third rotor is mounted on said central tube assembly by first bearing means; and said fourth rotor is mounted on said third rotor assembly by second bearing means.

12. The robot assembly of claim 10, wherein said third rotor is mounted on said central tube assembly by first bearing means; and said fourth rotor is mounted on said central tube assembly by second bearing means.

13. The robot assembly of claim 10, wherein said third rotor is mounted on said central tube assembly by a third multiplicity of bearing means; and said fourth rotor is mounted on said central tube assembly by a fourth multiplicity of bearing means.

14. The robot assembly of claim 13, wherein said third multiplicity of bearing means is two and said fourth multiplicity of bearing means is two.

15. The robot assembly of claim 10, wherein said third rotor assembly further comprises a third motor rotor assembly, said third motor rotor assembly including a third multiplicity of permanent magnets attached to a third flux return ring, wherein said third multiplicity of permanent magnets are arranged in alternating North pole and South pole orientations radially inwards; and said fourth rotor assembly further comprises a fourth motor rotor assembly, said fourth motor rotor assembly including a fourth multiplicity of permanent magnets attached to a fourth flux return ring, and wherein said fourth multiplicity of permanent magnets are in arranged in alternating North pole and South pole orientations radially.

16. The robot assembly of claim 15, wherein said central tube assembly further comprises:
- a third stator positioned generally in a third common plane as said third motor rotor assembly and inside said first enclosure, wherein said third stator includes a third multiplicity of pole faces oriented radially outwards towards said third multiplicity of permanent magnets; and
- a fourth stator positioned generally in a fourth common plane as said fourth motor rotor assembly and inside said first enclosure, wherein said fourth stator comprises a fourth multiplicity of pole faces oriented radially outwards towards said fourth multiplicity of permanent magnets.

17. The robot assembly of claim 16 wherein said third stator and said fourth stator are electrically connected to the motor control system configured to vary magnetic field excitations of (i) said third multiplicity of pole faces in said third stator, wherein said varying magnetic field excitations of said third multiplicity of pole faces induces rotation of said third rotor assembly; and (ii) said fourth multiplicity of pole faces in said fourth stator, wherein said varying magnetic field excitations of said fourth multiplicity of pole faces induces rotation of said fourth rotor assembly.

18. The robot assembly of claim 10, further comprising:
a first middle actuator arm having a first end and a second end, wherein said first end of said first middle actuator arm is coupled to said first inner actuator arm at a location on said first inner actuator arm approximately halfway between said inner and outer ends of said first inner actuator arm by a fifth bearing, said fifth bearing enabling said first middle actuator arm to rotate around an axis of said fifth bearing parallel to said transfer plane, and said second end of said first middle actuator arm is coupled to said first slider by a sixth bearing, said sixth bearing enabling said first middle actuator arm to rotate around an axis of said sixth bearing parallel to said transfer plane; and
a second middle actuator arm, having a first end and a second end, wherein said first end of said second middle actuator arm is coupled to said second inner actuator arm at a location on said second inner actuator arm approximately halfway between said inner and outer ends of said second inner actuator arm by a seventh bearing, said seventh bearing enabling said second middle actuator arm to rotate around an axis of said seventh bearing parallel to said transfer plane, and said second end of said second middle actuator arm is coupled to said second slider by an eighth bearing, said eighth bearing enabling said second middle actuator arm to rotate around an axis of said eighth bearing parallel to said transfer plane.

19. The robot assembly of claim 18, further comprising:
a bellows, having an upper and a lower end, oriented generally along the central axis of said central tube assembly, wherein said upper end of said bellows is attached with a vacuum seal to the lower end of said central tube assembly, and said lower end of said bellows is attached with a vacuum seal to said second enclosure; and
a vertical actuator assembly attached to said central tube assembly within said first enclosure, said vertical actuator assembly enabling vertical motion of said central tube assembly relative to said second enclosure, said vertical motion enabling simultaneous vertical motion of said first and second end effectors.

20. The robot assembly of claim 18 further comprising:
a first roller, attached to said outer surface of said central tube assembly;
a second roller, attached to said outer surface of said central tube assembly;
a first cam, attached to said first rotor assembly, and positioned to be in contact with said first roller, wherein a profile of said first cam is shaped to vary a vertical position of said first rotor during rotation of said first rotor, thereby enabling vertical motion of said first end effector; and
a second cam, attached to said third rotor assembly, and positioned to be in contact with said second roller, wherein a profile of said second cam is shaped to vary a vertical position of said third rotor during rotation of said third rotor, thereby enabling vertical motion of said second end effector.

21. The robot assembly of claim 18 further comprising:
a first roller, attached to said first rotor assembly;
a second roller, attached to said third rotor assembly;
a first cam, attached to said outer surface of said central tube assembly, and positioned to be in contact with said first roller, wherein a profile of said first cam is shaped to vary a vertical position of said first rotor during rotation of said first rotor, thereby enabling vertical motion of said first end effector; and
a second cam, attached to said outer surface of said central tube assembly, and positioned to be in contact with said second roller, wherein a profile of said second cam is shaped to vary a vertical position of said third rotor during rotation of said third rotor, thereby enabling vertical motion of said second end effector.

22. The robot assembly of claim 1, wherein the first axis motion comprises an azimuthal-axis motion.

23. The robot assembly of claim 1, wherein the second axis motion comprises an radial-axis motion.

24. The robot assembly of claim 1, wherein the first rotor assembly and the second rotor assembly rotate at different speeds and directions comprise rotating the first rotor assembly and keeping the second rotor assembly stationary.

* * * * *